(12) United States Patent
Ogawa

(10) Patent No.: US 6,995,506 B2
(45) Date of Patent: Feb. 7, 2006

(54) DISPLAY DEVICE WITH ORGANIC CONDUCTIVE THIN FILM HAVING CONDUCTIVE NETWORK

(75) Inventor: Kazufumi Ogawa, Nara (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 847 days.

(21) Appl. No.: 09/925,747

(22) Filed: Aug. 10, 2001

(65) Prior Publication Data
US 2002/0057398 A1 May 16, 2002

(30) Foreign Application Priority Data
Aug. 10, 2000 (JP) .............................. 2000-243056
Oct. 6, 2000 (JP) .............................. 2000-308400

(51) Int. Cl.
*H05B 33/00* (2006.01)
(52) U.S. Cl. ...................................... 313/504; 313/506
(58) Field of Classification Search ........ 313/500–506; 428/690; 445/24, 25, 50, 51
See application file for complete search history.

(56) References Cited

FOREIGN PATENT DOCUMENTS

| EP | 0 469 243 A1 | 2/1992 |
|---|---|---|
| JP | 2507153 | 4/1996 |

*Primary Examiner*—Joseph Williams
(74) *Attorney, Agent, or Firm*—Steptoe & Johnson LLP

(57) ABSTRACT

An organic electronic device is provided that utilizes a conductive organic thin film having a conductive network in the channel region. The conductive network comprises an organic molecular group made up of organic molecules each having a light-responsive group or a polar group bonded together by conjugated bonds. Thus, high integration and high-speed response is made possible. In addition, a method of producing a functional organic thin film fixed to a specified portion of a substrate surface by covalent bonds is provided. This method comprises preliminarily treating the substrate by performing an active hydrogen exposure treatment on the specified portion (or an active hydrogen removing treatment on the portion other than the specified portion) and reacting the active hydrogens of the specified portion with organic molecules. Thus, a high precision functional organic thin film, even one formed to the micron pattern level, can be provided.

16 Claims, 18 Drawing Sheets

(a)

(b) (Switching Utilizing First and Second Lights Having Differing Wavelength)

(a)

(b)

$C_4H_4N-(CH_2)_8-OCO-(CH_2)_6-Si(-O-)_3$ is represented by (a)

(b)

$C_4H_4N-(CH_2)_8-OCO-(CH_2)_6-Si(-O-)_3$ is represented by (a)

(b)

(a)

(b)

DISPLAY DEVICE WITH ORGANIC CONDUCTIVE THIN FILM HAVING CONDUCTIVE NETWORK

BACKGROUND OF THE INVENTION (1) Field of the Invention

The present invention relates to a two-terminal organic electronic device and a three-terminal organic electronic device (hereinafter referred to together as organic electronic devices), methods of producing the devices, and methods of operating the devices, both organic electronic devices being such that an organic material is used in the channel region. The present invention also relates to a liquid crystal display device and an electroluminescent display device hereinafter referred to as EL display device) and to methods of producing the display devices, both display devices utilizing the organic electronic devices.

Furthermore, the present invention relates to a method of producing a functional organic thin film fixed to a substrate by covalent bonds, another method of producing an organic electronic device, and methods of producing a liquid crystal display device and an EL display device, both devices using this organic electronic device.

(2) Description of the Prior Art

Conventionally, inorganic semiconductor materials typified by silicon crystal have been used in electronic devices.

As for organic electronic devices, a device using organic molecules having electrolytically polymerizable groups (see Japanese Patent Publication No. 2507153), for example, has been proposed. In this organic electronic device, a conjugated system formed by polymerizing electrolytically polymerizable groups is used to achieve the switching of current flowing between terminals by the application of an electric field.

However, with reduction in the size of silicon crystals (to 0.1 μm or less), defects in the silicon have emerged, a shortcoming as the performance of a device is controlled by the crystallinity of the silicon. In addition, because it is necessary to use a glass substrate that is excellent in terms of heat resistance, flexibility is another shortcoming.

Regarding the organic electronic device described above, while it may accomplish the desired end by providing a current switching device, application of the device to electronic apparatuses that require high-speed response has not been realized.

SUMMARY OF THE INVENTION

Accordingly, it is an object of the present invention to provide an organic electronic device that enables high integration and high-speed response, a method of producing this organic electronic device, and a method of operating this organic electronic device. It is another object of the present invention to provide a device having high-speed response that can be used as an electric field effect switching device in electronic apparatuses that require high-speed response, for example, in display devices.

In view of progress in the reduction of the size of various electronic devices, it is a further object of the present invention to provide a method of producing a functional organic thin film that can be formed with high precision and a method of producing an organic electronic device. It is yet a further object of the present invention to provide a method of producing a display device utilizing this organic electronic device.

The present inventors thoroughly researched means of increasing the response speed of an electronic device that uses organic material. As a result, the present inventors discovered that by including light-responsive groups or polar groups in organic molecules that make up a conductive organic thin film, sensitivity to light or to an electric field increases and a higher response speed results. Thus, the present invention was accomplished.

According to one aspect of the invention, there is provided a two-terminal organic electronic device formed on a substrate, the device comprising a first electrode, a second electrode spaced from the first electrode, and a conductive organic thin film electrically connecting the first electrode and the second electrode, wherein the conductive organic thin film comprises an organic molecular group comprising organic molecules each having a light-responsive group and has a conductive network in which the organic molecules making up the organic molecular group are bonded to one another by conjugated bonds.

This construction makes it possible to provide an organic electronic device wherein a channel region electrically connecting the first electrode and the second electrode is formed using the conductive organic thin film and the conductivity of the conductive organic thin film is changed by light irradiation. By including light-responsive groups in the organic molecules that make up the conductive organic thin film, sensitivity to light increases and a higher response speed results. Thus, it is possible to change the conductivity of the conductive organic thin film at a high speed.

It is thought that the change in the conductivity of the conductive organic thin film occurs because the effect of the response of the light-responsive groups to light irradiation is spread by the structure of the conductive network.

The light responsiveness is characterized by reversible changes in the state of the organic molecules with light irradiation. The light response takes the form of cis-trans isomerization, photoisomerization, or the like wherein the order (sequence) of the bonds of atoms making up each of the molecules remains the same, but the spatial configuration changes. Thus, changes in the conductivity of the conductive organic thin film are reversible in that the molecules can be changed back to a specified state by irradiation with light having various combinations of differing wavelengths and the like.

In addition, the conductive network is a conductive pathway contributing to electric conduction between the first electrode and the second electrode. By incorporating a dopant in the conductive network, the conductivity is improved.

The conductive organic thin film may be a single layer, multilayer, or partially multilayer structure.

The conductive organic thin film may be a monomolecular film or a monomolecular built-up film, the monomolecular film and the monomolecular built-up film being fixed to the substrate.

Because the aggregates of organic molecules are oriented to some degree and each polymerizable group is approximately in the same plane, this construction makes it possible to easily induce conjugated bonding and form a conductive network having a high conductivity in which numerous organic molecules are linked by conjugated bonds. In addition, the conductive network is spread so that it lies in a plane, and thus even if organic molecules forming one-dimensional chains of conjugated polymers make up the organic thin film, two-dimensional electric conduction is made possible. Therefore, even a thin film has good conductivity. Moreover, because the organic thin film can be made very thin, response speed can be improved. Furthermore, because the organic thin film is fixed to the substrate by covalent bonds, it is excellent in terms of durability, including peel resistance and the like, and can be stably operated for extended periods. Thus, a two-terminal organic electronic device that has a thin film, good and uniform conductivity, and high-speed, stable response is provided. When doping is employed, it is possible to effectively incorporate the dopant into the conductive network. By forming an organic thin film having an arbitrary thickness or employing doping or the like, the conductivity of the conductive organic thin film is easily adjusted.

The conductivity of the conductive network may change according to the amount of light with which the conductive organic thin film is irradiated.

This construction makes it possible to change the conductivity of the conductive network by adjusting the light energy absorbed by the conductive organic thin film This is accomplished by varying the intensity and the length of light irradiation. Because changes in conductivity are possible, organic electronic devices such as variable transistors can be provided. Generally, absorption characteristics in terms of absorption spectrum vary according to the type of light-responsive group. However, by using light of a wavelength that is excellent in terms of absorption ratio, conductivity is changed efficiently and at a high speed.

The conductivity of the conductive network may be shifted to a first conductivity or a second conductivity by irradiation of the conductive organic thin film with a first light or a second light, respectively, and may be maintained at the first conductivity or the second conductivity, respectively, after irradiation is terminated, the first light and the second light having different wavelengths.

This construction makes it possible to switch the conductivity of the conductive network by applying a first or a second light while a voltage is applied between the first and the second electrodes to shift the conductivity to a stabilized state having a first or second conductivity. Because the stabilized state is maintained even after a light is no longer being applied, the device has a memory function. Therefore, organic electronic devices such as variable resistors, switching devices, memory devices, light sensors, and the like can be provided. In addition, because the first conductivity or the second conductivity is dependent on the state of the conductive network before light is applied and on the amount of the first or the second light that is applied, it is possible to variably control the conductivity of the respective stabilized states by adjusting the intensity and the length of light irradiation.

The light-responsive group may be a photoisomerizable group.

This construction makes it possible for the conductive network to achieve the stabilized states having the first and second conductivities by isomerization. Very high-speed control of the conductivity of the conductive network is also made possible.

A stabilized state may be considered such so long the conductive network has a stable, specified conductivity when in this state. For example, the conductivity of the conductive network when a first isomer and a second isomer exist at a certain ratio is taken to be the first conductivity, and this state is taken to be the stabilized state having the first conductivity.

The photoisomerizable group may be an azo group.

This construction makes it possible to change the conductivity of the conductive network by isomerization of the azo group into a first isomer having the trans configuration with irradiation of visible rays and into a second isomer having the cis-configuration with irradiation of ultraviolet rays.

The conductive network comprises at least one conjugated system selected from the group consisting of a polyacetylene-based, a polydiacetylene-based, a polypyrrole-based, a polythiophene-based, and a polyacene-based conjugated system.

This construction makes it possible to provide a two-terminal organic electronic device having a conductive network with a high conductivity. Examples of the structure of the conjugated system are described with reference to general formulas (i) to (v). In the present specification, "polyacetylene-based conjugated system" denotes the bond structure of the polymer main chain of polyacetylene as shown in general formula (i). Similarly, "polydiacetylene-based conjugated system," "polypyrrole-based conjugated system," "polythiophene-based conjugated system," and "polyacene-based conjugated system" denote the bond structure of the polymer main chain of polydiacetylene (general formula (ii)), the bond structure of the polymer main chain of polypyrrole (general formula (iii)), the bond structure of the polymer main chain of polythiophene (general formula (iv)), and the bond structure of the polymer main chain of polyacene (general formula (v)), respectively.

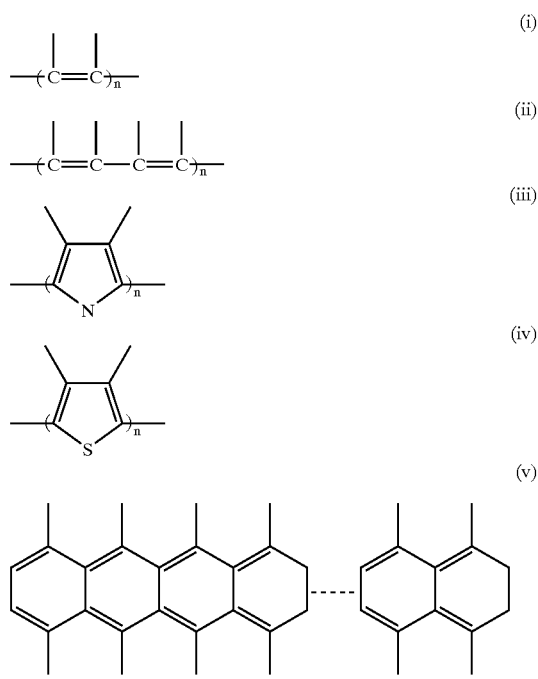

According to another aspect of the invention, there is provided a three-terminal organic electronic device formed on a substrate, the device comprising a first electrode, a second electrode spaced from the first electrode, a conductive organic thin film electrically connecting the first electrode and the second electrode, and a third electrode sandwiched between the substrate and the conductive organic thin film and insulated therefrom, wherein the third electrode controls an electric field across the conductive organic thin film by application of a voltage between itself and the first electrode or itself and the second electrode and the conductive organic thin film comprises an organic molecular group comprising organic molecules each having a polar group and has a conductive network in which the organic molecules making up the organic molecular group are bonded to one another by conjugated bonds.

This construction makes it possible to change the conductivity of the conductive organic thin film by applying a voltage to the third electrode. In addition, by including polar groups in the organic molecules that make up the conductive organic thin film, sensitivity to an electric field increases and a higher response speed results. Thus, it is possible to change the conductivity of the conductive organic thin film at a high speed.

It is thought that the change in the conductivity of the conductive organic thin film with application of an electric field occurs because the effect caused by the response of the polar groups to the electric field is spread by the structure of the conductive network.

The conductive organic thin film may be a single layer, multilayer, or partially multilayer structure.

The conductive organic thin film may be a monomolecular film or a monomolecular built-up film, the monomolecular film and the monomolecular built-up film being fixed to the substrate.

Because the aggregates of organic molecules are oriented to some degree and each polymerizable group is approximately in the same plane, this construction makes it possible to easily induce conjugated bonding and form a conductive network having a high conductivity in which numerous molecules are linked by conjugated bonds. In addition, the conductive network is spread so that it lies in a plane, and thus even if molecules forming one-dimensional chains of conjugated polymers make up the organic thin film, two-dimensional electric conduction is made possible. Therefore, even a thin film has good conductivity. Moreover, because the organic thin film can be made very thin, response speed can be improved. Furthermore, because the organic thin film is fixed to the substrate by covalent bonds, it is excellent in terms of durability, including peel resistance and the like, and can be stably operated for extended periods. Thus, a three-terminal organic electronic device that has a thin film, good and uniform conductivity, and high speed, stable response is provided. When doping is employed, it is possible to effectively incorporate the dopant into the conductive network. By forming an organic thin film having an arbitrary thickness or employing doping or the like, the conductivity of the conductive organic thin film is easily adjusted.

The change in the conductivity of the conductive network may be effected by the electric field applied across the conductive organic thin film.

This construction makes it possible to control the conductivity of the conductive network by applying a voltage to the third electrode as voltages applied to the third electrode control the electric field across the conductive organic thin film.

The polar group may be a polarizable group that is polarized when an electric field is applied.

With this construction, the sensitivity of the conductive organic thin film to an applied electric field increases, resulting in very high-speed response as long as the polar groups are functional groups that become more polarized with the application of an electric field (polarizable groups).

The polarizable group may be a carbonyl group or an oxycarbonyl group. Carbonyl groups and oxycarbonyl groups are suitable as functional groups for improving response speed.

The conductive network may comprise at least one conjugated system selected from the group consisting of a polyacetylene-based, a polydiacetylene-based, a polythiophene-based, a polypyrrole-based, and a polyacene-based conjugated system.

This construction makes it possible to provide a three-terminal organic electronic device having a conductive network with a high conductivity.

According to another aspect of the invention, there is provided a method of producing a two-terminal organic electronic device formed on an insulating substrate or an insulating film-covered substrate that is a substrate having an insulating film formed thereon, the method comprising the steps of forming an organic thin film comprising an organic molecular group comprising organic molecules each having a light-responsive group and a polymerizable group that bonds by conjugated bonds, forming a conductive network by bonding the organic molecules making up the organic thin film to one another by conjugated bonds, and forming a first electrode and a second electrode spaced from each other so that the first electrode and the second electrode contact the conductive network.

This construction makes it possible to produce a two-terminal organic electronic device wherein a channel region connecting the first electrode and the second electrode is formed with conductive organic material and the conductivity between the first and second electrodes is changed by light irradiation.

When the substrate is an insulating substrate such as a glass substrate or a plastic substrate, the organic thin film can be formed directly on the substrate without using the first insulating film.

The organic thin film may be a monomolecular film or a monomolecular built-up film, the monomolecular film and the monomolecular built-up film being fixed to the substrate.

This construction makes it possible to form a conductive network having a high conductivity.

Chemisorption or the Langmuir-Blodgett technique may be utilized in the step of forming an organic thin film.

This construction makes it possible to easily form an organic thin film having an arbitrary thickness.

It is suitable to use a silane-based chemisorbable substance in a step of forming an organic thin film in which chemisorption is utilized.

This construction makes it possible to efficiently form an organic thin film.

In the step of forming a conductive network, the bonding of the organic molecules making up the organic thin film to one another by conjugated bonds to form a conductive network may be achieved by polymerization or polymerization followed by crosslinking.

This construction makes it possible to form a conductive network in which the polymerizable group of each of the organic molecules is linked by conjugated bonds to enable electric conduction. The polymerizable groups may be catalytically polymerizable groups, electrolytically polymerizable groups, or polymerizable groups that polymerize through energy beam irradiation. In cases in which there is a plurality of polymerizable groups in each of the organic molecules making up the organic thin film, a conductive network having a structure different from a structure formed only by polymerization can be formed by subjecting the polymer formed by polymerization of one of the polymerizable groups of each organic molecule to a crosslinking reaction, whereby it forms conjugated bonds with the other polymerizable group of each of the organic molecules. In this case, the other polymerizable group, on a side chain of the polymer formed by polymerization, is a group bonded by crosslinking. For example, a conductive network comprising a polyacene-based conjugated system and having a very high conductivity is formed by forming a monomolecular film comprising aggregates of molecules having diacetylene groups and bringing about crosslinking through catalytic polymerization and energy beam irradiation.

The crosslinking may be brought about by at least one of catalytic action, electrolytic action, or energy beam irradiation.

Supposing the polymer formed by polymerization has a plurality of bonding groups with different crosslinking characteristics, this construction makes it possible to bring about crosslinking a plurality of times in the forming of a conductive network. Crosslinking reactions may be brought about by catalytic action, electrolytic action, or energy beam irradiation. Possibilities include, not only a combination of crosslinking brought about by differing means, but a combination of crosslinkings brought about by the same means but under differing reaction conditions. For example, crosslinking by catalytic action is followed by crosslinking by a first type of energy beam irradiation, and this is in turn followed by crosslinking by a second type of energy beam irradiation and the like to form a conductive network.

The light-responsive group may be a photoisomerizable group.

This construction makes it possible to produce a two-terminal organic electronic device such that the conductivity of the conductive network is shifted to a first conductivity or a second conductivity by irradiation of the conductive organic thin film with a first light or a second light, respectively, and is maintained at the first conductivity or the second conductivity, respectively, after irradiation is terminated, the first light and the second light having different wavelengths. This organic electronic device may be used as a variable resistor, a switching device, a light sensor, a memory device, or the like. An azo group is suitable for the photoisomerizable group.

The polymerizable group may be selected from the group consisting of a catalytically polymerizable group, an electrolytically polymerizable group, and a polymerizable group that is polymerized through energy beam irradiation. The catalytically polymerizable group may be selected from the group consisting of a pyrrolyl group, a thienyl group, an acetylene group, and a diacetylene group. The electrolytically polymerizable group may be a pyrrolyl group or a thienyl group The polymerizable group that is polymerized through energy beam irradiation may be an acetylene group or a diacetylene group. The energy beam may be a light beam such as infrared rays, visible rays, and ultraviolet rays, radiation such as X-rays, or a particle beam such as electron rays. Because a polymerizable group that is polymerized through energy beam irradiation has its own individual absorption characteristics, response efficiency is improved through selection of an energy beam of a certain type and energy that is efficiently absorbed.

The method may be such that the polymerizable group is an electrolytically polymerizable group, the step of forming a first electrode and a second electrode is carried out before the step of forming a conductive network, and the step of forming a conductive network comprises applying a voltage between the first electrode and the second electrode so that the electrolytically polymerizable group of each organic molecule of the organic molecular group undergoes an electrolytic-polymerization reaction to form a conductive network.

This construction makes it possible to use the first and second electrodes in the step of forming a conductive network such that the conductive network between the electrodes arises automatically. Thus, the conductivity between the electrodes is easily ensured, and a conductive network having a uniform conductivity is formed.

The method may be such that the polymerizable group is an electrolytically polymerizable group that is a pyrrolyl group or a thienyl group, and the method further comprises, after the step of forming the first electrode and the second electrode, a step of forming a coating film on the organic thin film and an additional conductive network in the coating film by immersing the substrate having the organic thin film formed thereon in an organic solvent in which organic molecules each having a light-responsive group and a functional group that is a pyrrolyl group or a thienyl group are dissolved and applying voltages between the first electrode and the second electrode and between the first electrode or the second electrode and an external electrode, respectively, the external electrode being contacted with the organic solvent and disposed above the organic thin film This construction makes it possible to form a coating film on the organic thin film having the conductive network and to form an additional conductive network in this coating film. Thus, the conductive organic thin film making up the two-terminal organic electronic device has a plurality of conductive networks (multilevel construction). Because the thickness of the coating film is dependent on the length of time a voltage is applied, the coating film is formed to a specified thickness by adjusting the length of time the voltage is applied. The conductivity of the conductive organic thin film also is dependant on the length of time a voltage is applied and thus, by adjusting the length of time the voltage is applied, a two-terminal organic electronic device having a specified conductivity is produced. In cases in which the same type of organic molecules are used for the coating film as were used for the organic thin film already having a conductive network formed therein, gaps that may exist in this organic thin film (which has a conductive network) are filled by organic molecules when the coating film is formed, resulting in a denser organic thin film. Thus, good conductivity is ensured with even greater certainty.

The method may be such that the polymerizable group is an electrolytically polymerizable group that is a pyrrolyl group or a thienyl group, the step of forming a first electrode and a second electrode is carried out before the step of forming a conductive network, and the step of forming a conductive network includes forming a coating film on the organic thin film while forming the conductive network of the organic thin film and an additional conductive network in the coating film by immersing the substrate having the organic thin film formed thereon in an organic solvent in which organic molecules each having a light-responsive group and a functional group that is a pyrrolyl group or a thienyl group are dissolved and applying voltages between the first electrode and the second electrode and between the first electrode or the second electrode and an external electrode, respectively, the external electrode being contacted with the organic solvent and disposed above the organic thin film.

This construction makes it possible to form conductive networks in the already formed organic thin film and in the coating film at the same time Thus, the conductive organic thin film making up the two-terminal organic electronic device has a plurality of conductive networks (multilevel construction). By adjusting the thickness of the coating film, a two-terminal organic electronic device having a specified conductivity is produced. In cases in which the same type of organic molecules are used to form the coating film as were used to form the organic thin film, a conductive organic thin film having a more reliable and better conductivity is formed.

According to another aspect of the invention, there is provided a method of producing a three-terminal organic electronic device formed on an insulating substrate or an insulating film-covered substrate that is a substrate having a first insulating film formed thereon, the method comprising the steps of forming a third electrode, forming an organic thin film comprising an organic molecular group comprising organic molecules each having a polar group and a polymerizable group that bonds by conjugated bonds so that the third electrode is covered either directly or with a second insulating film disposed therebetween, forming a conductive network by bonding the organic molecules making up the organic thin film to one another by conjugated bonds, and forming a first electrode and a second electrode spaced from each other and from the third electrode so that the first electrode and the second electrode contact the conductive network.

This construction makes it possible to produce a three-terminal organic electronic device wherein a channel region connecting the first electrode and the second electrode is formed with conductive organic material and the conductivity between the first and the second electrodes is changed by applying a voltage between the first or the second electrode and the third electrode. By including polar groups, response to the electric field is high speed.

When the substrate is an insulating substrate such as a glass substrate or a plastic substrate, the third electrode can be formed directly on the substrate without using the first insulating film. When the third electrode is an insulating electrode such as a silicon electrode, the third electrode can cover the organic thin film directly without using the second insulating film.

The organic thin film may be a monomolecular film or a monomolecular built-up film, the monomolecular film and the monomolecular built-up film being fixed to the substrate.

This construction makes it possible to form a conductive network having a high conductivity.

Chemisorption or the Langmuir-Blodgett technique may be utilized in the step of forming an organic thin film.

This construction makes it possible to easily form an organic thin film having an arbitrary thickness.

It is suitable to use an silane-based chemisorbable substance in a step of forming an organic thin film in which chemisorption is utilized.

This construction makes it possible to efficiently form an organic thin film.

In the step of forming a conductive network, the bonding of the organic molecules making up the organic thin film to one another by conjugated bonds to form a conductive network may be achieved by polymerization or polymerization followed by crossing.

This construction makes it possible to form a conductive network in which the polymerizable group of each of the organic molecules is linked by conjugated bonds to enable electric conduction. The polymerizable groups may be catalytically polymerizable groups, electrolytically polymerizable groups, or polymerizable groups that polymerize through energy beam irradiation. In cases in which there is a plurality of polymerizable groups in each of the organic molecules making up the organic thin film, a conductive network having a structure different from a structure formed only by polymerization can be formed by subjecting the polymer formed by polymerization of one of the polymerizable groups of each organic molecule to a crosslinking reaction, whereby it forms conjugated bonds with the other polymerizable group of each of the organic molecules. In this case, the other polymerizable group, on a side chain of the polymer formed by polymerization, is a group bonded by crosslinking. For example, a conductive network comprising a polyacene-based conjugated system and having a very high conductivity is formed by forming a monomolecular film comprising aggregates of molecules having diacetylene groups and bringing about crosslinking through catalytic polymerization and energy beam irradiation.

In the method described above, the crosslinking may be brought about by at least one of catalytic action, electrolytic action, or energy beam action.

Supposing the polymer formed by polymerization has a plurality of bonding groups with different crosslinking characteristics, this construction makes it possible to bring about crosslinking a plurality of times in the forming of a conductive network. Crosslinking reactions may be brought about by catalytic action, electrolytic action, or energy beam irradiation. Possibilities include, not only a combination of crosslinkings brought about by differing means, but a combination of crosslinkings brought about by the same means but under differing reaction conditions. For example, crosslinking by catalytic action is followed by crosslinking by a first type of energy beam irradiation, and this is in turn followed by crosslinking by a second type of energy beam irradiation and the like to form a conductive network.

The polar group may be a polarizable group that is polarized when an electric field is applied.

This construction makes it possible to produce a three-terminal organic electronic device that has very high-speed response because the polarizable group is highly sensitive to an electric field. A carbonyl group or an oxycarbonyl group is suitable for the polarizable group.

The polymerizable group may be selected from the group consisting of a catalytically polymerizable group, an electrolytically polymerizable group, and a polymerizable group that is polymerized through energy beam irradiation. The catalytically polymerizable group may be selected from the group consisting of a pyrrolyl group, a thienyl group, an acetylene group, and a diacetylene group. The electrolytically polymerizable group may be a pyrrolyl group or a thienyl group. The polymerizable group that is polymerized through energy beam irradiation may be an acetylene group or a diacetylene group. The energy beam may be a light beam such as infrared rays, visible rays, and ultraviolet rays, radiation such as X-rays, or a particle beam such as electron rays. Because a polymerizable group that is polymerized through energy beam irradiation has its own individual absorption characteristics, response efficiency is improved through selection of an energy beam of a certain type and energy that is efficiently absorbed.

The method may be such that the polymerizable group is an electrolytically polymerizable group, the step of forming a first electrode and a second electrode is carried out before the step of forming a conductive network, and the step of forming a conductive network comprises applying a voltage between the first electrode and the second electrode so that the electrolytically polymerizable group of each organic molecule of the organic molecular group undergoes an electrolytic-polymerization reaction to form a conductive network.

This construction makes it possible to use the first and second electrodes in the step of forming a conductive network such that the conductive network between the electrodes arises automatically. Thus, the conductivity between the electrodes is easily ensured, and a conductive network having a uniform conductivity is formed.

The method may be such that the polymerizable group is an electrolytically polymerizable group that is a pyrrolyl group or a thienyl group, and the method further comprises, after the step of forming the first electrode and the second electrode, a step of forming a coating film on the organic thin film and an additional conductive network in the coating film by immersing the substrate having the organic thin film formed thereon in an organic solvent in which organic molecules each having a light-responsive group and a functional group that is a pyrrolyl group or a thienyl group are dissolved and applying voltages between the first electrode and the second electrode and between the first electrode or the second electrode and an external electrode, respectively, the external electrode being contacted with the organic solvent and disposed above the organic thin film.

This construction makes it possible to form a coating film on the organic thin film having the conductive network and to form an additional conductive network in this coating film. Thus, the conductive organic thin film making up the three-terminal organic electronic device has a plurality of conductive networks (multilevel construction). Because the thickness of the coating film is dependent on the length of time a voltage is applied, the coating film is formed to a specified thickness by adjusting the length of time the voltage is applied. The conductivity of the conductive organic thin film also is dependant on the length of time a voltage is applied and thus, by adjusting the length of time the voltage is applied, a three-terminal organic electronic device having a specified conductivity is produced. In cases in which the same type of organic molecules are used for the coating film as were used for the organic thin film already having a conductive network formed therein, gaps that may exist in this organic thin film (which has a conductive network) are filled by organic molecules when the coating film is formed, resulting in a denser organic thin film. Thus, good conductivity is ensured with even greater certainty.

The method may be such that the polymerizable group is an electrolytically polymerizable group that is a pyrrolyl group or a thienyl group, the step of forming a first electrode and a second electrode is carried out before the step of forming a conductive network, and the step of forming a conductive network includes forming a coating film on the organic thin film while forming the conductive network of the organic thin film and an additional conductive network in the coating film by immersing the substrate having the organic thin film formed thereon in an organic solvent in which organic molecules each having a light-responsive group and a functional group that is a pyrrolyl group or a thienyl group are dissolved and applying voltages between the first electrode and the second electrode and between the first electrode or the second electrode and an external electrode, respectively, the external electrode being contacted with the organic solvent and disposed above the organic thin film.

This construction makes it possible to form conductive networks in the already formed organic thin film and in the coating film at the same time. Thus, the conductive organic thin film making up the three-terminal organic electronic device has a plurality of conductive networks (multilevel construction). By adjusting the thickness of the coating film, a three-terminal organic electronic device having a specified conductivity is produced. In cases in which the same type of organic molecules are used to form the coating film as were used to form the organic thin film, a conductive organic thin film having a more reliable and good conductivity is formed.

According to another aspect of the invention, there is provided a method of operating a two-terminal organic electronic device comprising a first electrode, a second electrode spaced from the first electrode, and a conductive organic thin film electrically connecting the first electrode and the second electrode, the conductive organic thin film comprising an organic molecular group comprising organic molecules each having a light-responsive group and the conductive organic thin film having a conductive network in which the organic molecules making up the organic molecular group are bonded to one another by conjugated bonds, the method comprising switching current flowing between the first electrode and the second electrode by irradiating the conductive organic thin film with a light while a voltage is applied between the first electrode and the second electrode to change the conductivity of the conductive network.

With this construction, the conductivity of the conductive network is changed by the effect of the response to the applied light being absorbed by the light-responsive group. Therefore, by applying light to the conductive organic thin film while a voltage is applied between the first and second electrodes, switching of the current flowing between the first and second electrodes is achieved. Generally, absorption characteristics in terms of absorption spectrum vary according to the type of light-responsive group. By using light of a wavelength that is excellent in terms of absorption ratio, conductivity is changed efficiently and at a high speed.

The light-responsive group may be a photoisomerizable group, and the light a first light or a second light, respectively, the first light and the second light having differing wavelengths.

This construction makes it possible to switch current flowing between the first and second electrodes by irradiating the conductive organic thin film with the first or the second light while a voltage is applied between the first and second electrodes. This is possible because the isomerization of molecules making up the conductive organic thin film with irradiation by the first light or the second light causes the conductivity of the conductive network to shift to a first or second conductivity, and the conductivity is maintained at the first or second conductivity, respectively, after irradiation is terminated. Because the light-responsive group is a photoisomerizable group, the conductivity of the conductive network is changes at a very high speed. Because the progress of the isomerization depends on the amount of light with which the conductive organic thin film is irradiated, the first or the second conductivity can be controlled by adjusting the intensity of the light, the irradiation time, and the like. Therefore, the range of change in conductivity for switching operation also can be adjusted by the intensity of the light, the irradiation time, and the like. However, because the device has a memory function wherein a stabilized state is maintained when one of the first light or the second light is applied and then irradiation is terminated, it is necessary to irradiate the conductive organic thin film with the other of the first light or the second light to bring about a switching operation. An azo group is suitable as the photoisomerizable group.

The first light or the second light may be ultraviolet rays or visible rays, respectively.

With this construction, it is suitable to apply ultraviolet rays and visible rays to various photoisomerizable groups because most photoisomerizable groups isomerize between a first isomer and a second isomer, respectively, when irradiated with ultraviolet or visible rays. Generally, absorption characteristics in terms of absorption spectrum vary according to the type of light-responsive group. By using light of a wavelength that is excellent in terms of absorption ratio, conductivity is changed efficiently and at a high speed.

The conductive organic thin film is a monomolecular film or a monomolecular built-up film, the monomolecular film and the monomolecular built-up film being fixed to the substrate.

This construction makes it possible to form a thin film having good and uniform conduction because the organic molecules making up the conductive organic thin film are at large oriented and the conductive network exists in a plane. In addition, an extremely thin film enables extremely high-speed switching. Furthermore, because the organic thin film is fixed to the substrate by covalent bonds, it is excellent in terms of durability, including peel resistance and the like. Thus, extremely high-speed and stable switching operations are made possible.

According to another aspect of the invention, there is provided a method of operating at three-terminal organic electronic device formed on a substrate, the device comprising a first electrode, a second electrode spaced from the first electrode, a conductive organic thin film electrically connecting the first electrode and the second electrode, and a third electrode sandwiched between the substrate and the conductive organic thin film and insulated therefrom, wherein the third electrode controls an electric field across the conductive organic thin film by application of a voltage between itself and the first electrode or itself and the second electrode and the conductive organic thin film comprises an organic molecular group comprising organic molecules each having a polar group and has a conductive network in which the organic molecules making up the organic molecular group are bonded to one another by conjugated bonds, the method comprising switching current flowing between the first electrode and the second electrode by applying a voltage between the first electrode or the second electrode and the third electrode while a voltage is applied between the first electrode and the second electrode to change the conductivity of the conductive network.

This construction makes it possible to bring about switching operations at a high-speed because the conductive organic thin film has polar groups that are sensitive to an applied electric field.

The polar group may be a polarizable group that is polarized when an electric field is applied.

This construction makes it possible to bring about switching operations at an extremely high speed because of the extremely high sensitivity to an applied electric field. For the polarizable group, a carbonyl group or an oxycarbonyl group is suitable.

The conductive organic thin film may be a monomolecular film or a monomolecular built-up film, the monomolecular film and the monomolecular built-up film being fixed to the substrate.

This construction makes it possible to form a thin film having good and uniform conduction because the organic molecules making up the conductive organic thin film are at large oriented and the conductive network exists in a plane. In addition, an extremely thin film enables extremely high-speed switching. Furthermore, because the organic thin film is fixed to the substrate by covalent bonds, it is excellent in terms of durability, including peel resistance and the like. Thus, extremely high-speed and stable switching operations are made possible.

According to another aspect of the invention, there is provided a liquid crystal display device comprising an array substrate having a plurality of switching devices aligned and disposed in a matrix on a first substrate and a first orientation film formed thereon, a color filter substrate having a plurality of color elements aligned and disposed in a matrix on a second substrate and a second orientation film formed thereon, and a liquid crystal sealed between the array substrate and the color filter substrate, the array substrate and the color filter substrate arranged opposing each other with the first orientation film and the second orientation film on the inside, the liquid crystal display device wherein each of the switching devices is a three-terminal organic electronic device comprising a first electrode, a second electrode spaced from the first electrode, a conductive organic thin film electrically connecting the first electrode and the second electrode, and a third electrode sandwiched between the first substrate and the conductive organic thin film and insulated therefrom, wherein the third electrode controls an electric field across the conductive organic thin film by application of a voltage between itself and the first electrode or itself and the second electrode, the conductive organic thin film comprising an organic molecular group comprising organic molecules each having a polar group and the conductive organic thin film having a conductive network in which the organic molecules making up the organic molecular group are bonded to one another by conjugated bonds.

This construction makes it possible to provide a liquid crystal display device that uses an organic TFT rather than the existing inorganic thin film transistor (hereinafter referred to as TFT). In using an organic TFT, because a step of treating the substrate at a high temperature is not necessary, the range of choice of substrates increases. In particular, substrates such as plastic substrates that could not be used in the past can be used. Thus, reduction in size and weight is made possible by the appropriate choice of substrate.

There also is provided an EL display device comprising an array substrate having a plurality of switching devices aligned and disposed in a matrix on a substrate, a common electrode opposed to the array substrate, and a light-emitting layer comprising a fluorescent material which emits light when an electric field is applied, the light-emitting layer formed between the array substrate and the common electrode, the electroluminescent display device wherein each of the switching devices is a three-terminal organic electronic device comprising a first electrode, a second electrode spaced from the first electrode, a conductive organic thin film electrically connecting the first electrode and the second electrode, and a third electrode sandwiched between the substrate and the conductive organic thin film and insulated therefrom, wherein the third electrode controls an electric field across the conductive organic thin film by application of a voltage between itself and the first electrode or itself and the second electrode, the conductive organic thin film comprising an organic molecular group comprising organic molecules each having a polar group and the conductive organic thin film having a conductive network in which the organic molecules making up the organic molecular group are bonded to one another by conjugated bonds.

This construction makes it possible to provide an EL display device that uses an organic TFT rather than the existing inorganic thin film transistor (hereinafter referred to as TFT). In using an organic TFT, because a step of treating the substrate at a high temperature is not necessary, the range of choice of substrates increases. In particular, substrates such as plastic substrates that could not be used in the past can be used. Thus, reduction in size and weight is made possible by the appropriate choice of substrate.

In the EL display device described above, the fluorescent material may comprise three types of fluorescent materials, those which emit red, blue and green light, respectively, and are aligned and disposed to achieve color display. Thus, an EL color display device using an organic TFT is provided.

In the display devices described above, the monomolecular film or the monomolecular built-up film may be such that organic molecules are fixed to the substrate. Thus, an EL display device, an EL color display device, and a liquid crystal display device are provided, the devices having extremely high-speed displays and good operation stabilities.

According to another aspect of the invention, there is provided a method of producing a liquid crystal display device comprising the steps of forming an array substrate by forming a plurality of switching devices on a first substrate such that they are arranged in a matrix, and forming a first orientation film thereon, forming a color filter substrate by forming color elements on a second substrate such that they are arranged in a matrix formation and forming a second orientation film thereon, and arranging the array substrate and the color filter substrate such that they face each other at a specified gap, the first orientation film and the second orientation film being on the inside, filling the space between the array substrate and the color filter substrate with a liquid crystal, and sealing the liquid crystal, the method wherein each of the switching devices is a three-terminal organic electronic device comprising a first electrode, a second electrode spaced from the first electrode, a conductive organic thin film electrically connecting the first electrode and the second electrode, and a third electrode sandwiched between the first substrate and the conductive organic thin film and insulated therefrom, wherein the third electrode controls an electric field across the conductive organic thin film by application of a voltage between itself and the first electrode or itself and the second electrode, the conductive organic thin film comprising an organic molecular group comprising organic molecules each having a polar group and the conductive organic thin film having a conductive network in which the organic molecules making up the organic molecular group are bonded to one another by conjugated bonds.

This construction makes is possible to provide a method of producing a liquid crystal display device that uses an organic TFT rather than the existing inorganic thin film transistor (hereinafter referred to as TFT). In using an organic TFT, a step of treating the substrate at a high temperature is not necessary. Thus it is possible to use plastic substrates and the like that were not used in the past.

There also is provided a method of producing an EL display device comprising the steps of forming an array substrate by forming a plurality of switching devices on a substrate such that they are arranged in a matrix, forming a light-emitting layer on the array substrate, the light-emitting layer comprising a fluorescent material which emits light when a voltage is applied, and forming a common electrode by forming a common electrode film on the light-emitting layer, the method wherein each of the switching devices is a three-terminal organic electronic device comprising a first electrode, a second electrode spaced from the first electrode, a conductive organic thin film electrically connecting the first electrode and the second electrode, and a third electrode sandwiched between the substrate and the conductive organic thin film and insulated therefrom, wherein the third electrode controls an electric field across the conductive organic thin film by application of a voltage between itself and the first electrode or itself and the second electrode, the conductive organic thin film comprising an organic molecular group comprising organic molecules each having a polar group and the conductive organic thin film having a conductive network in which the organic molecules making up the organic molecular group are bonded to one another by conjugated bonds.

This construction makes is possible to provide a method of producing an EL display device that uses an organic TFT rather than the existing inorganic thin film transistor (hereinafter referred to as TFT). In using an organic TFT, a step of treating the substrate at a high temperature is not necessary. Thus it is possible to use plastic substrates and the like that were not used in the past.

In the method of producing an EL display device described above the fluorescent material may comprise three types of fluorescent materials, those which emit red, blue and green light, respectively, and are formed at specified positions to achieve color display in the step of forming a light-emitting layer. Thus, an EL color display device using an organic TFT is provided.

In addition, in the production methods of the display devices described above, the monomolecular film or the monomolecular built-up film may be such that organic molecules are fixed to the substrate. Thus, an EL display device, an EL color display device, and a liquid crystal display device are provided, the devices having extremely high-speed displays and good operation stabilities.

The constructions described above make it possible to provide an organic device capable of high-speed response, but in order to provide a method of producing these kinds of organic electronic devices with high precision, the present inventors continued intense research. They focused on providing a film that is a functional organic thin film fixed by covalent bonds. Before the formation of the film, the inventors thought of dividing a surface of a substrate by making a film-formation region intended for the formation of the film into a region with a higher density of exposed active hydrogens and making a region not intended for the formation of the film into a region with a lower density of exposed active hydrogens. In other words, they thought that by providing clear boundaries on the substrate itself in the formation of a film fixed to the substrate by covalent bonds, a functional organic thin film could be formed with higher precision than if a mask such as a resist only were used. Thus, the present inventors discovered that by carrying out a step of preliminarily treating a substrate by performing an active hydrogen exposure treatment on a specified portion of the surface of the substrate or an active hydrogen removing treatment on a portion other than the specified portion to make the specified portion (region intended for film formation) into a region having a high density of exposed active hydrogens, a high precision functional organic thin film could be formed even to the micron pattern level. Thus, the present invention was achieved. In addition, it was discovered that the provision of an organic electronic device that answers recent demands for high integration and high-performance display devices is made possible by applying this film-forming technique to a method of producing an organic electronic device.

According to another aspect of the invention, there is provided a first method of producing a functional organic thin film fixed to a specified portion of a surface of a substrate by covalent bonds, the method comprising the steps of preliminarily treating the substrate by performing an active hydrogen exposure treatment on the specified portion of the surface of the substrate to make the specified portion into a region having a higher density of exposed active hydrogens than a portion other than the specified portion, and forming the functional organic thin film fixed to the specified portion of the surface of the substrate by covalent bonds by contacting the region having a higher density of exposed active hydrogens with organic molecules each having a functional group that reacts with active hydrogens and a functional bonding chain to react the organic molecules and active hydrogens in the region.

By dividing a surface of a substrate into two types of regions that serve as guidelines for the density of exposed active hydrogens on a surface of a substrate before film formation, this construction makes it possible to form a functional organic thin film that, with the reaction of active hydrogens and functional groups that react with active hydrogens, is fixed to the surface of a substrate by covalent bonds such that the film corresponds with the divisions made prior to film formation. Thus, even to the micron pattern level, a functional organic thin film with high dimensional precision can be formed. In addition, a functional organic thin film formed in this manner is excellent in terms of peel resistance and thus exhibits its prescribed functions over extended periods.

It is to be noted that the phrase "specified portion of the surface of the substrate" denotes an arbitrarily selected portion of the surface of the substrate and is the portion of the surface of the substrate on which a functional organic thin film is to be formed. The phrase "density of exposed active hydrogens" denotes the number of exposed active hydrogens per unit area. The phrase "functional organic thin film" denotes a film made up of organic molecules having particular functions. Examples of particular functions include functions of having a conductivity, magnetism, dielectricity, or permittivity that change, a function of controlling the orientation of liquid crystal molecules, an anti-contamination property such as water repellency or oil repellency, and the like. The phrase "functional group" denotes groups that supply a film with a function, for example, a light-responsive group such as a photoisomerizable group, an electric field-responsive group such as a polar group, a polymerizable group that bonds by conjugated bonds, and the like.

In this method, it is preferable that the substrate be such that active hydrogens are not exposed on a surface. If this kind of substrate is used, the portion other than the specified portion becomes a region in which active hydrogens are not exposed, and as a result, highly precise formation of a functional organic thin film is ensured. It is to be noted that the phrase "the substrate be such that active hydrogens are not exposed on a surface" includes, in addition to cases where the substrate is such that active hydrogens are not at all exposed, cases where the substrate is such that active hydrogens are substantially not exposed as in cases where there are not enough exposed active hydrogens to allow the film to be sufficiently fixed to the substrate by covalent bonds.

It is preferable that the specified portion have an area of 1000 $\mu m^2$ or less. In forming such a film to the micron pattern level by carrying out film forming using only a mask as has been done in the past, there is a risk that defects in the mask will adversely affect the precision of the film. If a preliminary treatment is carried out as in the present invention, precision is not affected by defects in the mask, and thus the improvements achieved by this invention are great.

It is preferable that the functional bonding chain comprise at least one functional group selected from the group consisting of a light-responsive group, an electric field-responsive group, and a polymerizable group that bonds by conjugated bonds. In addition, it is preferable that the functional organic thin film be a monomolecular film or a monomolecular built-up film, the monomolecular film and the monomolecular built-up film being fixed to the substrate. With a film such as this, because the molecules are oriented to some degree, a functional organic thin film that exhibits uniform functions results.

It is preferable that the substrate be a water-repellent single layer substrate or a layered substrate wherein a water-repellent coating film is formed on a surface of a substrate material. It is preferable that the water-repellent single layer substrate comprise a synthetic resin that is water repellent. It is preferable that the synthetic resin be an acrylic resin, a polycarbonate resin, or a polyethersulfone resin. It is preferable that the water-repellent coating film comprise an acrylic resin, a polycarbonate resin, or a polyethersulfone resin.

The step of preliminarily treating the substrate may be such that the active hydrogen exposure treatment is carried out by oxidizing the specified portion of the surface of the substrate and supplying active hydrogens to the specified portion. From the standpoint of productivity and the like, it is preferable that the oxidizing of the specified portion be carried out in an atmosphere containing oxygen atoms and hydrogen atoms by at least one of excimer UV light irradiation, ultraviolet irradiation, plasma treatment, and corona treatment. Alternatively, the substrate may comprise a layered substrate wherein a water-repellent organic film is formed on a surface of a substrate material having active hydrogens exposed thereon, and the step of preliminarily treating the substrate may be such that the active hydrogen exposure treatment is carried out by oxidizing the specified portion of the surface of the substrate to remove the water-repellent organic film from the specified portion, whereby active hydrogens are exposed. In this case also, from the standpoint of productivity and the like, it is preferable that the oxidizing of the specified portion be carried out under an atmosphere containing oxygen by at least one of excimer UV light irradiation, ultraviolet irradiation, plasma treatment, and corona treatment.

It is preferable that a mask be formed on the portion other than the specified portion of the surface of the substrate before the active hydrogen exposure treatment is performed on the substrate. The step of forming the functional organic thin film may then be carried out after the mask has been removed or before the mask has been removed.

From the standpoint of production efficiency, it is preferable that the functional group that reacts with active hydrogens be selected from the group consisting of a halosilyl group, an isocyanate group, and an alkoxysilyl group, and the step of forming a functional organic thin film be such that the contacting of the region having a higher density of exposed active hydrogens with the organic molecules is carried out using a chemisorption solution wherein the organic molecules and a nonaqueous organic solvent are mixed together. For obtaining a clean film, it is preferable that there be a step of washing the surface the substrate with a nonaqueous organic solvent after the steps of preliminarily treating the substrate and forming the functional organic thin film.

According to another aspect of the invention, there is provided a second method of producing a functional organic thin film fixed to a specified portion of a surface of a substrate by covalent bonds, comprising the steps of preliminarily treating the substrate by performing an active hydrogen removing treatment on a portion other than the specified portion of the surface of the substrate to make the specified portion into a region having a higher density of exposed active hydrogens than the portion other than the specified portion and forming the functional organic thin film fixed to the specified portion of the surface of the substrate by covalent bonds by contacting the region having a higher density of exposed active hydrogens with organic molecules each having a functional group that reacts with active hydrogens and a functional bonding chain to react the organic molecules and active hydrogens in the region.

This construction makes it possible to make the specified portion into a region having a high density of exposed active hydrogens and to thus form a functional organic thin film having high dimensional precision by performing an active hydrogen removing treatment on a portion other than the specified portion.

In this method, it is preferable that the substrate be such that active hydrogens are exposed on the surface. Even with such a substrate, the method described above makes it possible to use exposed active hydrogens originally present on the substrate and to form a high-precision functional organic thin film. It is to be noted that the phrase "the substrate be such that active hydrogens are exposed on the surface" denotes that the substrate be such that enough active hydrogens are exposed to sufficiently fix the film to the substrate by covalent bonds.

It is preferable that the specified portion have an area of 1000 $\mu m^2$ or less. It is preferable that the functional bonding chain comprise at least one functional group selected from the group consisting of a light-responsive group, an electric field-responsive group, and a polymerizable group that bonds by conjugated bonds. It is preferable that the functional organic thin film be a monomolecular film or a monomolecular built-up film, the monomolecular film and the monomolecular built-up film being fixed to the substrate.

It is preferable that the substrate be a hydrophilic single layer substrate or a layered substrate wherein a hydrophilic coating film is formed on a surface of a substrate material. It is preferable that the hydrophilic single layer substrate comprise a metal having an oxidized surface, silicon, silicon nitride, silica, or glass. It is preferable that the hydrophilic coating film comprise a metal oxide, silicon, silicon nitride, silica, or glass.

The step of preliminarily treating the substrate may be such that the active hydrogen removing treatment is a chemical treatment performed to remove active hydrogens from the portion of the surface of the substrate other than the specified portion. In order that the treated portion be difficult to detach so that later steps are easily carried out, it is preferable that the chemical treatment be such that the portion other than the specified portion of the surface of the substrate is contacted with organic molecules each having a functional group that reacts with active hydrogens to induce a reaction between the organic molecules and the active hydrogens of the portion other than the specified portion of the substrate. Alternatively, the step of preliminarily treating the substrate may be such that the active hydrogen removing treatment is a physical treatment performed to remove active hydrogens from the portions of the surface of the substrate other than the specified portion. It is preferable that the physical treatment be such that covalent bonds between the substrate and the active hydrogens are broken by irradiating the portion other than the specified portion of the surface of the substrate with light in a vacuum.

It is preferable that a mask be formed on the specified portion of the surface of the substrate before the active hydrogen removing treatment is performed and is removed before the step of forming the functional organic thin film. It is preferable that the functional group that reacts with active hydrogens be selected from the group consisting of a halosilyl group, an isocyanate group, and an alkoxysilyl group, and the step of forming the functional organic thin film be such that the contacting of the region having a higher density of exposed active hydrogens with the organic molecules is carried out using a chemisorption solution wherein the organic molecules and a nonaqueous organic solvent are mixed together. It is preferable that there be a step of washing the surface of the substrate with a nonaqueous organic solvent after the steps of preliminarily treating the substrate and forming the functional organic thin film.

According to another aspect of the invention, there is provided a first method of producing a two-terminal organic electronic device formed on a substrate, the device comprising a first electrode, a second electrode spaced from the first electrode, and a conductive organic thin film electrically connecting the first electrode and the second electrode, the conductive organic thin film comprising an organic molecular group comprising organic molecules each having a light-responsive group and the conductive organic thin film having a conductive network in which the organic molecules making up the organic molecular group are bonded to one another by conjugated bonds, the method comprising the steps of preliminarily treating the substrate by performing an active hydrogen exposure treatment on a specified portion of a surface of the substrate to make the specified portion into a region having a higher density of exposed active hydrogens than a portion other than the specified portion, forming a film by contacting the region having a higher density of exposed active hydrogens with organic molecules each having a functional group that reacts with active hydrogens, a light-responsive group, and a polymerizable group that bonds by conjugated bonds and inducing the organic molecules and active hydrogens in the region to react such that an organic molecular group comprising the organic molecules is fixed to the specified portion of the surface of the substrate by covalent bonds, forming the conductive network by bonding the organic molecules making up the organic molecular group to one another by conjugated bonds, and forming the first electrode and the second electrode on the substrate.

The method described above corresponds to the first method of producing a functional organic thin film. Because the surface of the substrate is divided into two regions that serve as guidelines for the density of exposed active hydrogens on a surface of a substrate before film formation, this construction makes it possible to precisely form a conductive organic thin film that is fixed to the substrate by covalent bonds as a result of the reaction with active hydrogens. In addition, because a two-terminal organic electronic device obtained in this way contains photoisomerizable groups in the conductive organic thin film, sensitivity to light increases and a higher response speed results, making it is possible to change the conductivity of the conductive organic thin film at a high speed. Thus, the technology to form a highly integrated two-terminal organic electronic device capable of high-speed response is provided.

It is thought that the change in the conductivity of the conductive organic thin film occurs because the effect of the response of the light-responsive groups to light irradiation is spread by the structure of the conductive network.

While it is assumed that a two-terminal organic electronic device obtained in the manner described above mostly will be used as a switching device, the uses are not limited to this. Because the above device is such that the conductivity of the conductive network changes with irradiation by light of differing wavelengths and is maintained at a certain conductivity even after irradiation is terminated, it has memory function. Therefore, it can be used as a memory device, a variable resistor, a light sensor, or the like.

In the method described above, it is preferable that the substrate be such that active hydrogens are not exposed on the surface. The active hydrogen exposure treatment may be such that the specified portion of the surface of the substrate is oxidized and supplied with active hydrogens. Alternatively, the substrate may be a layered substrate wherein a water-repellent organic film is formed on a surface of a substrate material having active hydrogens exposed thereon, and the active hydrogen exposure treatment such that the specified portion of the surface of the layered substrate is oxidized to remove the water-repellent organic film, whereby active hydrogens are exposed.

It is preferable that the conductive organic thin film be a monomolecular film or a monomolecular built-up film, the monomolecular film and the monomolecular built-up film being fixed to the substrate. In such a film, because the molecules are oriented to some degree and the polymerizable group of each molecule is located at approximately the same position with respect to the surface of the substrate such that the polymerizable groups are lined in a row, the polymerizable groups form conjugated bonds with one another that are approximately parallel to the surface of the substrate when polymerization reactions occur between adjacent polymerizable groups. As a result, a conductive network having a high conductivity is formed.

It is preferable that chemisorption or the Langmuir-Blodgett technique be utilized in the step of forming a film. By using these methods, a monomolecular film or a monomolecular built-up film of an arbitrary thickness is simply produced.

It is suitable to use a silane-based chemisorbable substance in the step of forming a film in which chemisorption is utilized. By using this substance, a device is efficiently produced in a short time.

It is preferable that the light-responsive group be a photoisomerizable group. For example, in cases in which the photoisomerizable group is an azo group, the azo group changes from a first isomer having a trans configuration with irradiation by visible rays and to a second isomer having a cis transfiguration with irradiation by ultraviolet rays. Thus, a film whose conductivity easily changes is formed.

It is preferable that the polymerizable group be selected from the group consisting of a catalytically polymerizable group, an electrolytically polymerizable group, and a polymerizable group that is polymerized through energy beam irradiation. With these functional groups, polymerization by catalytic polymerization, electrolytic polymerization, or polymerization caused by energy beam radiation can be employed to simply form a conductive organic thin film. It is suitable that the catalytically polymerizable group be selected from the group consisting of a pyrrolyl group, a thienyl group, an acetylene group, and a diacetylene group. It is suitable that the electrolytically polymerizable group be a pyrrolyl group or a thienyl group. It is suitable that the polymerizable group that is polymerized through energy beam irradiation be an acetylene group or a diacetylene group.

It is preferable that the polymerizable group be an electrolytically polymerizable group, the step of forming a first electrode and a second electrode be carried out before the step of forming a conductive network, and the step of forming a conductive network be such that each electrolytically polymerizable group are subjected to an electrolytic-polymerization reaction to form the conductive network. With a construction such as this, the first electrode and the second electrode can be used to form the conductive network so that in applying a voltage between both electrodes to bring about polymerization, the conductive network arises automatically.

The method may be such that the polymerizable group is an electrolytically polymerizable group that is a pyrrolyl group or a thienyl group and the method further comprises, after the step of forming the first electrode and the second electrode, a step of forming a coating film on the organic thin film and an additional conductive network in the coating film by immersing the substrate having the organic thin film formed thereon in an organic solvent in which organic molecules each having a light-responsive group and a functional group that is a pyrrolyl group or a thienyl group are dissolved and applying voltages between the first electrode and the second electrode and between the first electrode or the second electrode and an external electrode, respectively, the external electrode being contacted with the organic solvent and disposed above the organic thin film. Because a multilevel conductive network is formed, this construction makes it possible to provide a two-terminal organic electronic device that allows for an even larger current.

Alternatively, the method of producing a two-terminal organic electronic device may be such that the polymerizable group is an electrolytically polymerizable group that is a pyrrolyl group or a thienyl group, the step of forming the first electrode and the second electrode is carried out before the step of forming the conductive network, and the step of forming the conductive network includes forming a coating film on the organic thin film while forming the conductive network of the organic thin film and an additional conductive network in the coating film by immersing the substrate having the organic thin film formed thereon in an organic solvent in which organic molecules each having a light-responsive group and a functional group that is a pyrrolyl group or a thienyl group are dissolved and applying voltages between the first electrode and the second electrode and between the first electrode or the second electrode and an external electrode, respectively, the external electrode being contacted with the organic solvent and disposed above the organic thin film. In cases in which the conductive organic thin film is a monomolecular built-up film, this construction makes it possible to produce, in a short time, a two-terminal organic electronic device that allows for an even larger current because the polymerization reactions are brought about in a shorter length of time in the forming of the conductive network.

There is also provided a first method of producing a three-terminal organic electronic device formed on a substrate, the device comprising a first electrode, a second electrode spaced from the first electrode, a conductive organic thin film electrically connecting the first electrode and the second electrode, and a third electrode sandwiched between the substrate and the conductive organic thin film and insulated therefrom wherein the third electrode controls an electric field across the conductive organic thin film by application of a voltage between itself and the first electrode or itself and the second electrode, and the conductive organic thin film comprises an organic molecular group comprising organic molecules each having a polar group and has a conductive network in which the organic molecules making up the organic molecular group are bonded to one another by conjugated bonds, the method comprising the steps of forming the third electrode on a surface of the substrate, preliminarily treating the substrate by performing an active hydrogen exposure treatment on a specified portion of the surface of the substrate to make the specified portion into a region having a higher density of exposed active hydrogens than a portion other than the specified portion, forming a film by contacting the region having a higher density of exposed active hydrogens with organic molecules each having a functional group that reacts with active hydrogens, a polar group, and a polymerizable group that bonds by conjugated bonds and inducing the organic molecules and active hydrogens in the region to react such that an organic molecular group comprising the organic molecules are fixed to the specified portion of the surface of the substrate by covalent bonds, forming the conductive network by bonding the organic molecules making up the organic molecular group to one another by conjugated bonds, and forming the first electrode and the second electrode on the substrate.

The method described above corresponds to the first method of forming a functional organic thin film. In this method, a high precision conductive organic thin film is formed even if electrodes are formed on the surface of the substrate. Because a three-terminal organic electronic device obtained in this way contains polar groups in the conductive organic thin film, sensitivity to light increases and a higher response speed results, making it is possible to change the conductivity of the conductive organic thin film at a high speed. Thus, the technology to form a highly integrated three-terminal organic electronic device capable of high-speed response is provided.

It is thought that the change in the conductivity of the conductive organic thin film occurs because the effect of the response of the polar groups to an electric field is spread by the structure of the conductive network. While it is assumed that a three-terminal organic electronic device obtained in the manner described above mostly will be used as a switching device, the uses are not limited to this.

In the method described above, it is preferable that the substrate be such that active hydrogens are not exposed on the surface. The active hydrogen exposure treatment may be such that the specified portion of the surface of the substrate is oxidized and supplied with active hydrogens. Alternatively, the substrate may be a layered substrate wherein a water-repellent organic film is formed on a surface of a substrate material having active hydrogens exposed thereon, and the active hydrogen exposure treatment such that the specified portion of the surface of the layered substrate is oxidized to remove the water-repellent organic film, whereby active hydrogens are exposed.

It is preferable that the conductive organic thin film be a monomolecular film or a monomolecular built-up film, the monomolecular film and the monomolecular built-up film being fixed to the substrate. In such a film, because the molecules are oriented to some degree and the polymerizable group of each molecule is located at approximately the same position with respect to the surface of the substrate such that the polymerizable groups are lined in a row, the polymerizable groups form conjugated bonds with one another that are approximately parallel to the surface of the substrate when polymerization reactions occur between adjacent polymerizable groups. As a result, a conductive network having a high conductivity is formed.

It is preferable that chemisorption or the Langmuir-Blodgett technique be utilized in the step of forming a film. By using these methods, a monomolecular film or a monomolecular built-up film of an arbitrary thickness is simply produced.

It is suitable to use a silane-based chemisorbable substance in a step of forming a film in which chemisorption is utilized. By using this substance, a device is efficiently produced in a short time.

It is preferable that the polar group be a polarizable group that is polarized when an electric field is applied. For example, when the polarizable group is a carbonyl group or an oxycarbonyl group, sensitivity to an applied electric field is very high such that polarization increases with application of an electric field. Thus, a switching device having a very high-speed response is obtained.

It is preferable that the polymerizable group be selected from the group consisting of a catalytically polymerizable group, an electrolytically polymerizable group, and a polymerizable group that is polymerized through energy beam irradiation. With these functional groups, polymerization by catalytic polymerization, electrolytic polymerization, or polymerization caused by energy beam radiation can be employed to simply form a conductive organic thin film. It is suitable that the catalytically polymerizable group be selected from the group consisting of a pyrrolyl group, a thienyl group, an acetylene group, and a diacetylene group. It is suitable that the electrolytically polymerizable group be a pyrrolyl group or a thienyl group. It is suitable that the polymerizable group that is polymerized through energy beam irradiation be an acetylene group or a diacetylene group.

It is preferable that the polymerizable group be an electrolytically polymerizable group, the step of forming the first electrode and the second electrode be carried out before the step of forming the conductive network, and the step of forming the conductive network be such that each electrolytically polymerizable group is subjected to an electrolytic-polymerization reaction to form the conductive network. With a construction such as this, the first electrode and the second electrode can be used to form the conductive network so that in applying a voltage between both electrodes to bring about polymerization, the conductive network arises automatically.

The method may be such that the polymerizable group is an electrolytically polymerizable group that is a pyrrolyl group or a thienyl group and the method further comprises, after the step of forming the first electrode and the second electrode, a step of forming a coating film on the organic thin film and an additional conductive network in the coating film by immersing the substrate having the organic thin film formed thereon in an organic solvent in which organic molecules each having a light-responsive group and a functional group that is a pyrrolyl group or a thienyl group are dissolved and applying voltages between the first electrode and the second electrode and between the first electrode or the second electrode and an external electrode, respectively, the external electrode being contacted with the organic solvent and disposed above the organic thin film. Because a multilevel conductive network is formed, this construction makes it possible to provide a two-terminal organic electronic device that allows for an even larger current.

Alternatively, the method may be such that the polymerizable group is an electrolytically polymerizable group that is a pyrrolyl group or a thienyl group, the step of forming the first electrode and the second electrode is carried out before the step of forming the conductive network, and the step of forming the conductive network includes forming a coating film on the organic thin film while forming the conductive network of the organic thin film and an additional conductive network in the coating film by immersing the substrate having the organic thin film formed thereon in an organic solvent in which organic molecules each having a light-responsive group and a functional group that is a pyrrolyl group or a thienyl group are dissolved and applying voltages between the first electrode and the second electrode and between the first electrode or the second electrode and an external electrode, respectively, the external electrode being contacted with the organic solvent and disposed above the organic thin film. This construction makes it possible to produce, in a short time, a two-terminal organic electronic device that allows for an even larger current because the polymerization reactions are brought about in a shorter length of time in the forming of the conductive network.

There is also provided a second method of producing a two-terminal organic electronic device formed on a substrate, the device comprising a first electrode, a second electrode spaced from the first electrode, and a conductive organic thin film electrically connecting the first electrode and the second electrode, the conductive organic thin film comprising an organic molecular group comprising organic molecules each having a light-responsive group and the conductive organic thin film having a conductive network in which the organic molecules making up the organic molecular group are bonded to one another by conjugated bonds, the method of producing a two-terminal organic electronic device comprising the steps of preliminarily treating the substrate by performing an active hydrogen removing treatment on a portion other than a specified portion of a surface of the substrate to make the specified portion into a region having a higher density of exposed active hydrogens than the portion other than the specified portion, forming a film by contacting the region having a higher density of exposed active hydrogens with organic molecules each having a functional group that reacts with active hydrogens, a photoisomerizable group, and a polymerizable group that bonds by conjugated bonds and inducing the organic molecules and active hydrogens in the region to react such that an organic molecular group comprising organic molecules is fixed to the specified portion of the surface of the substrate by covalent bonds, forming the conductive network by bonding the organic molecules making up the organic molecular group to one another by conjugated bonds, and forming the first electrode and the second electrode on the substrate.

The method described above corresponds to the second method of producing a functional organic thin film. Because the surface of the substrate is divided into two regions that serve as guidelines for the density of exposed active hydrogens on a surface of a substrate before film formation, this construction makes it possible to precisely form a conductive organic thin film that is fixed to the substrate by covalent bonds as a result of the reaction with active hydrogens. Thus, the technology to form a highly integrated two-terminal organic electronic device capable of high-speed response is provided.

While it is assumed that a three-terminal organic electronic device obtained in the manner described above mostly will be used as a switching device, it may also be used as a memory device, a variable resistor, a light sensor, or the like.

It is preferable that the substrate be such that active hydrogens are exposed on the surface. The active hydrogen removing treatment may be a chemical treatment performed to remove active hydrogens from the portion other than the specified portion of the surface of the substrate. Alternatively, the active hydrogen removing treatment may be a physical treatment performed to remove active hydrogens from the portion other than the specified portion of the surface of the substrate.

It is preferable that the conductive organic thin film be a monomolecular film or a monomolecular built-up film, the monomolecular film and the monomolecular built-up film being fixed to the substrate. In such a film, because the molecules are oriented to some degree and the polymerizable group of each molecule is located at approximately the same position with respect to the surface of the substrate such that the polymerizable groups are lied in a row, the polymerizable groups form conjugated bonds with one another that are approximately parallel to the surface of the substrate when polymerization reactions occur between adjacent polymerizable groups. As a result, a conductive network having a high conductivity is formed.

It is preferable that chemisorption or the Langmuir-Blodgett technique be utilized in the step of forming a film. By using these methods, a monomolecular film or a monomolecular built-up film of an arbitrary thickness is simply produced.

It is suitable to use a silane-based chemisorbable substance in a step of forming a film in which chemisorption is utilized. By using this substance, a device is efficiently produced in a short time.

It is preferable that the light-responsive group be a photoisomerizable group. For example, in cases in which the photoisomerizable group is an azo group, the azo group changes from a first isomer having a trans configuration with irradiation by visible rays and to a second isomer having a cis transfiguration with irradiation by ultraviolet rays. Thus, a film whose conductivity easily changes is formed.

It is preferable that the polymerizable group be selected from the group consisting of a catalytically polymerizable group, an electrolytically polymerizable group, and a polymerizable group that is polymerized through energy beam irradiation. With these functional groups, polymerization by catalytic polymerization, electrolytic polymerization, or polymerization caused by energy beam radiation can be employed to simply form a conductive organic thin film. It is suitable that the catalytically polymerizable group be selected from the group consisting of a pyrrolyl group, a thienyl group, an acetylene group, and a diacetylene group. It is suitable that the electrolytically polymerizable group be a pyrrolyl group or a thienyl group. It is suitable that the polymerizable group that is polymerized through energy beam irradiation be an acetylene group or a diacetylene group.

It is preferable that the polymerizable group be an electrolytically polymerizable group, the step of forming a first electrode and a second electrode be carried out before the step of forming a conductive network, and the step of forming a conductive network be such that each electrolytically polymerizable group is subjected to an electrolytic-polymerization reaction to form the conductive network. With a construction such as this, the first electrode and the second electrode can be used to form the conductive network so that in applying a voltage between both electrodes to bring about polymerization, the conductive network arises automatically.

The method may be such that the polymerizable group is an electrolytically polymerizable group that is a pyrrolyl group or a thienyl group and the method further comprises, after the step of forming the first electrode and the second electrode, a step of forming a coating film on the organic thin film and an additional conductive network in the coating film by immersing the substrate having the organic thin film formed thereon in an organic solvent in which organic molecules each having a light-responsive group and a functional group that is a pyrrolyl group or a thienyl group are dissolved and applying voltages between the first electrode and the second electrode and between the first electrode or the second electrode and an external electrode, respectively, the external electrode being contacted with the organic solvent and disposed above the organic thin film. Because a multilevel conductive network is formed, this construction makes it possible to provide a two-terminal organic electronic device that allows for an even larger current.

Alternatively, the method of producing a two-terminal organic electronic device may be such that the polymerizable group is an electrolytically polymerizable group that is a pyrrolyl group or a thienyl group, the step of forming the first electrode and the second electrode is carried out before the step of forming the conductive network, and the step of forming the conductive network includes forming a coating film on the organic thin film while forming the conductive network of the organic thin film and an additional conductive network in the coating film by immersing the substrate having the organic thin film formed thereon in an organic solvent in which organic molecules each having a light-responsive group and a functional group that is a pyrrolyl group or a thienyl group are dissolved and applying voltages between the first electrode and the second electrode and between the first electrode or the second electrode and an external electrode, respectively, the external electrode being contacted with the organic solvent and disposed above the organic thin film. In cases in which the conductive organic thin film is a monomolecular built-up film, this construction makes it possible to produce, in a short time, a two-terminal organic electronic device that allows for an even larger current because the polymerization reactions are brought about in a shorter length of time in the forming of the conductive network.

There is also provided a second method of producing a three-terminal organic electronic device formed on a substrate, the device comprising a first electrode, a second electrode spaced from the first electrode, a conductive organic thin film electrically connecting the first electrode and the second electrode, and a third electrode sandwiched between the substrate and the conductive organic thin film and insulated therefrom wherein the third electrode controls an electric field across the conductive organic thin film by application of a voltage between itself and the first electrode or itself and the second electrode, and the conductive organic thin film comprises an organic molecular group comprising organic molecules each having a polar group and has a conductive network in which the organic molecules making up the organic molecular group are bonded to one another by conjugated bonds, the method comprising the steps of forming the third electrode on a surface of the substrate, preliminarily treating the substrate by performing an active hydrogen removing treatment on a portion other than a specified portion of the surface of the substrate to make the specified portion into a region having a higher density of exposed active hydrogens than the portion other than the specified portion, forming a film by contacting the region having a higher density of exposed active hydrogens with organic molecules each having a functional group that reacts with active hydrogens, a polar group, and a polymerizable group that bonds by conjugated bonds and inducing the organic molecules and active hydrogens in the region to react such that an organic molecular group comprising the organic molecules is fixed to the specified portion of the surface of the substrate by covalent bonds, forming the conductive network by bonding the organic molecules making up the organic molecular group to one another by conjugated bonds, and forming the first electrode and the second electrode on the substrate.

The method described above corresponds to the second method of producing a functional organic thin film. In this method, a high precision conductive organic thin film is formed even if electrodes are formed on the surface of the substrate. Thus, the technology to form a highly integrated three-terminal organic electronic device capable of high-speed response is provided.

While it is assumed that a three-terminal organic electronic device obtained in the manner described above mostly will be used as a switching device, it is not limited to this use.

It is preferable that the substrate be such that active hydrogens are exposed on the surface. The active hydrogen removing treatment may be a chemical treatment performed to remove active hydrogens from the portion other than the specified portion of the surface of the substrate. Alternatively, the active hydrogen removing treatment may be a physical treatment performed to remove active hydrogens from the portion other than the specified portion of the surface of the substrate.

It is preferable that the conductive organic thin film be a monomolecular film or a monomolecular built-up film, the monomolecular film and the monomolecular built-up film being fixed to the substrate. In such a film, because the molecules are oriented to some degree and the polymerizable group of each molecule is located at approximately the same position with respect to the surface of the substrate such that the polymerizable groups are lined in a row, the polymerizable groups form conjugated bonds with one another that are approximately parallel to the surface of the substrate when polymerization reactions occur between adjacent polymerizable groups. As a result, a conductive network having a high conductivity is formed.

It is preferable that chemisorption or the Langmuir-Blodgett technique be utilized in the step of forming a film By using these methods, a monomolecular film or a monomolecular built-up film of an arbitrary thickness is simply produced.

It is suitable to use a silane-based chemisorbable substance in a step of forming a film in which chemisorption is utilized. By using this substance, a device is efficiently produced in a short time.

It is preferable that the polar group be a polarizable group that is polarized when an electric field is applied. For example, when the polarizable group is a carbonyl group or an oxycarbonyl group, sensitivity to an applied electric field is very high such that polarization increases with application of an electric field. Thus, a switching device having a very high-speed response is obtained.

It is preferable that the polymerizable group be selected from the group consisting of a catalytically polymerizable group, an electrolytically polymerizable group, and a polymerizable group that is polymerized through energy beam irradiation. With these functional groups, polymerization by catalytic polymerization, electrolytic polymerization, or polymerization caused by energy beam radiation can be employed to simply form a conductive organic thin film. It is suitable that the catalytically polymerizable group be selected from the group consisting of a pyrrolyl group, a thienyl group, an acetylene group, and a diacetylene group. It is suitable that the electrolytically polymerizable group be a pyrrolyl group or a thienyl group. It is suitable that the polymerizable group that is polymerized through energy beam irradiation be an acetylene group or a diacetylene group.

It is preferable that the polymerizable group be an electrolytically polymerizable group, the step of forming the first electrode and the second electrode be carried out before the step of forming the conductive network, and the step of forming the conductive network be such that by applying a voltage between the first electrode and the second electrode, each electrolytically polymerizable group are subjected to an electrolytic-polymerization reaction to form the conductive network. With a construction such as this, the first electrode and the second electrode can be used to form the conductive network so that in applying a voltage between both electrodes to bring about polymerization, the conductive network arises automatically.

The method of producing a three-terminal organic electronic device may be such that the polymerizable group is an electrolytically polymerizable group that is a pyrrolyl group or a thienyl group and the method further comprises, after the step of forming the first electrode and the second electrode, a step of forming a coating film on the organic thin film and an additional conductive network in the coating film by immersing the substrate having the organic thin film formed thereon in an organic solvent in which organic molecules each having a light-responsive group and a functional group that is a pyrrolyl group or a thienyl group are dissolved and applying voltages between the first electrode and the second electrode and between the first electrode or the second electrode and an external electrode, respectively, the external electrode being contacted with the organic solvent and disposed above the organic thin film. Because a multilevel conductive network is formed, this construction makes it possible to provide a two-terminal organic electronic device that allows for an even larger current.

Alternatively, the method may be such that the polymerizable group is an electrolytically polymerizable group that is a pyrrolyl group or a thienyl group, the step of forming the first electrode and the second electrode is carried out before the step of forming the conductive network, and the step of forming the conductive network includes forming a coating film on the organic thin film while forming the conductive network of the organic thin film and an additional conductive network in the coating film by immersing the substrate having the organic thin film formed thereon in an organic solvent in which organic molecules each having a light-responsive group and a functional group that is a pyrrolyl group or a thienyl group are dissolved and applying voltages between the first electrode and the second electrode and between the first electrode or the second electrode and an external electrode, respectively, the external electrode being contacted with the organic solvent and disposed above the organic thin film. This construction makes it possible to produce, in a short time, a two-terminal organic electronic device that allows for an even larger current because the polymerization reactions are brought about in a shorter length of time in the forming of the conductive network.

According to another aspect of the invention, there is provided a first method of producing a liquid crystal display device wherein the step of forming an array substrate comprises the substeps of forming third electrodes in a matrix on a surface of the first substrate, preliminarily treating the first substrate by performing an active hydrogen exposure treatment on specified portions of the surface of the first substrate to make the specified portions into regions having higher densities of exposed active hydrogens than portions other than the specified portions, forming a film by contacting the regions having higher densities of exposed active hydrogens with organic molecules each having a functional group that reacts with active hydrogens, a polar group, and a polymerizable group that bonds by conjugated bonds and inducing the organic molecules and active hydrogens in the regions to react such that an organic molecular group comprising the organic molecules is fixed to the specified portions of the surface of the first substrate by covalent bonds, forming a conductive network by bonding the organic molecules making up the organic molecular group to one another by conjugated bonds, forming first electrodes and second electrodes on the first substrate, and forming the first orientation film on the first substrate having the first electrodes, the second electrodes, and the third electrodes formed thereon. This construction makes it possible to produce a liquid crystal display device that uses organic thin film transistors (TFT's) instead of inorganic TFT's. In the production of organic TFT's, because there is no step of treating the substrate at a high temperature, it is possible to use a plastic substrate that is inferior to a glass substrate in terms of heat resistance Thus, because the range of substrates that may be selected increases, it becomes possible to provide a liquid crystal display device that is excellent in terms of flexibility and that has a greater variety of applications. In addition, because the production of minute-sized TFT's is possible, a high-performance liquid crystal display device can be provided.

As is described above, the liquid crystal display device generally comprises an array substrate wherein a plurality of switching devices are formed on a first substrate so as to be arranged and disposed in a matrix and a first orientation film is formed thereon, a color filter substrate wherein color elements are formed on a second substrate so as to be arranged and disposed in a matrix, and a liquid crystal filling the space between the array substrate and the color filter substrate, the array substrate and the color filter substrate being arranged such that they face each other at a specified gap with the first orientation film and the second orientation film on the inside. The device is produced by a step of forming an array substrate wherein a plurality of three-terminal organic electronic devices, serving as switching devices, are formed on the first substrate so as to be arranged and disposed in a matrix and the first orientation film is formed thereon, a step of forming a color filter substrate wherein color elements are formed on a second substrate so as to be arranged and disposed in a matrix and a second orientation film is formed thereon, and a step of arranging the array substrate and the color filter substrate such that they face each other at a specified gap, the first orientation film and the second orientation film being on the inside, filling the space between the array substrate and the color filter substrate with a liquid crystal, and sealing the liquid crystal.

The substrate may be an insulating substrate on a surface of which active hydrogens are not exposed.

There is also provided a first method of producing an EL display device wherein the step of forming an array substrate step comprises the substeps of forming third electrodes in a matrix on a surface of the substrate, preliminarily treating the substrate by performing an active hydrogen exposure treatment on specified portions of the surface of the substrate to make the specified portions into regions having higher densities of exposed active hydrogens than portions other than the specified portions, forming a film by contacting the regions having higher densities of exposed active hydrogens with organic molecules each having a functional group that reacts with active hydrogens, a polar group, and a polymerizable group that bonds by conjugated bonds and inducing the organic molecules and active hydrogens in the regions to react such that an organic molecular group comprising the organic molecules is fixed to the specified portions of the surface of the substrate by covalent bonds, and forming a conductive network by bonding the organic molecules making up the organic molecular group to one another by conjugated bonds, and forming first electrodes and second electrodes on the substrate. This construction makes it possible to produce an electroluminescent display device that uses organic thin film transistors (TFT's) instead of inorganic TFT's. In the production of organic TFT's, because there is no step of treating the substrate at a high temperature, it is possible to use a plastic substrate that is inferior to a glass substrate in terms of heat resistance. Thus, because the range of substrates that may be selected increases, it becomes possible to provide an EL display device that is excellent in terms of flexibility and that has a greater variety of applications. In addition, because the production of minute-sized TFT's is possible, a high-performance EL display device can be provided.

As is described above, the EL display device generally comprises an array substrate wherein a plurality of switching devices are arranged and disposed on a substrate in a matrix, a common electrode opposed to the array substrate, and a light-emitting layer comprising florescent material that emits light when a voltage is applied. The device is produced by a step of forming an array substrate wherein a plurality of three-terminal organic electronic devices, serving as switching devices, are formed on a substrate so as to be arranged in a matrix, a step of forming a light-emitting layer wherein a light-emitting layer comprising a fluorescent material that emits light when a voltage is applied is formed on the array substrate, and a step of forming a common electrode wherein a common electrode film is formed on the light-emitting layer.

The method of producing an EL display device described above may be such that the fluorescent material comprises three types of fluorescent materials, those which emit red, blue, and green light, respectively, and are formed at specified positions in the step of forming a light-emitting layer to achieve color display. Thus, an EL color display device is provided.

There is also provided a second method of producing a liquid crystal display device wherein the step of forming an array substrate comprises the substeps of forming third electrodes in a matrix on a surface of the first substrate, preliminarily treating the first substrate by performing an active hydrogen removing treatment on portions other than specified portions of the surface of the substrate to make the specified portions into regions having higher densities of exposed active hydrogens than the portions other than the specified portions, forming a film by contacting the regions having higher densities of exposed active hydrogens with organic molecules each having a functional group that reacts with active hydrogens, a polar group, and a polymerizable group that bonds by conjugated bonds and inducing organic molecules and active hydrogens in the region to react such that the organic molecular group comprising the organic molecules is fixed to the specified portions of the surface of the substrate by covalent bonds, forming a conductive network by bonding the organic molecules making up the organic molecular group to one another by conjugated bonds, forming first electrodes and second electrodes on the first substrate, and forming the first orientation film on the first substrate having the first electrodes, the second electrodes, and the third electrodes formed thereon. This construction makes it possible to produce a liquid crystal display device that uses organic thin film transistors (TFT's) instead of inorganic TFT's. In addition, similarly to above, it is possible to use a plastic substrate that is inferior to a glass substrate in terms of heat resistance, and thus a liquid crystal display device that has a greater variety of applications can be provided. Furthermore, because the production of minute-sized TFT's is possible, high-performance a liquid crystal display device can be provided.

In the method described above, the first substrate may be an insulating substrate having a surface with active hydrogens exposed thereon.

There is also provided a second method of producing an EL display device wherein the step of forming an array substrate comprises the substeps of forming third electrodes in a matrix on a surface of the substrate, preliminarily treating the substrate by performing an active hydrogen removing treatment on portions other than specified portions of the surface of the substrate to make the specified portions into regions having higher densities of exposed active hydrogens than the portions other than the specified portions, forming a film by contacting the regions having higher densities of exposed active hydrogens with organic molecules each having a functional group that reacts with active hydrogens, a polar group, and a polymerizable group that bonds by conjugated bonds and inducing the organic molecules and active hydrogens in the region to react such that the organic molecular group comprising the organic molecules is fixed to the specified portions of the surface of the substrate by covalent bonds, forming a conductive network by bonding the organic molecules making up the organic molecular group to one another by conjugated bonds, and forming first electrodes and second electrodes on the substrate. This construction makes it possible to produce an EL display device that uses organic thin film transistors (TFT's) instead of inorganic TFT's. In addition, similarly to above, it is possible to use a plastic substrate that is inferior to a glass substrate in terms of heat resistance, and thus an EL display device that has a greater variety of applications can be provided. Furthermore, because the production of minute-sized TFT's is possible, a high-performance EL display device can be provided.

In the method described above, the substrate may be an insulating substrate having a surface with active hydrogens exposed thereon.

The method of producing an EL display device described above may be such the fluorescent material comprises three types of fluorescent materials, those which emit red, blue, and green light, respectively, and are formed at specified positions in the step of forming a light-emitting layer to achieve color display. Thus, an EL color display device is provided.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

The embodiments of the present invention are described below with reference to the FIGURES.

Embodiment 1

Figure 1:
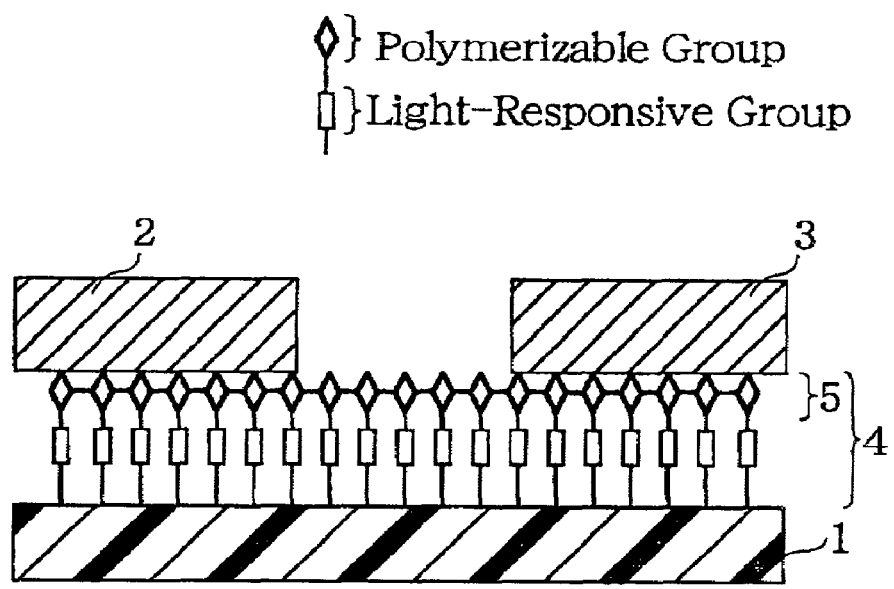
FIG. 1 is a schematic cross sectional view of a two-terminal organic electronic device in accordance with Embodiment 1.

The present embodiment relates to an example of a two-terminal organic electronic device of the present invention. It is described with reference to FIG. 1.

This two-terminal organic electronic device is composed of, formed on a substrate 1, a first electrode 2, a second electrode 3, and a conductive organic thin film 4 contacting and being electrically connected to a portion of the undersurfaces of both electrodes. The conductive organic thin film 4 has a conductive network 5 in which organic molecules each having a light-responsive group and a polymerizable group are linked together.

Other than the requirement of having a light-responsive group and a polymerizable group, the organic molecules used in forming the conductive organic thin film 4 do not have any particular limitations, but among the many possibilities, it is suitable to use an organic molecule represented by the general formula (1) below (a silane-based chemisorbable substance):

$$A\text{-}(CH_2)_m\text{-}B\text{-}(CH_2)_n\text{-}SiD_pE_{3-p} \qquad (1)$$

wherein A is a polymerizable group which bonds by conjugated bonds, B is a light-responsive group, D is a functional group which reacts with active hydrogens, E is a functional group which does not react with active hydrogens, m and n are positive integers, m+n being from 2 to 25, and p is an integer of 1, 2 or 3.

From the standpoint of the conductivity of the conductive network, it is suitable that, in the general formula (1), A be a functional group which forms conjugated bonds through polymerization reactions (a functional group which bonds by conjugated bonds to form a conductive network) such as an acetylene group, a diacetylene group, a thienyl group, or a pyrrolyl group. It is suitable that B be a cis-trans photoisomerizable group such as an azo group. It is suitable that D, from the standpoint of reactivity, be a halogen atom, an isocyanate group, an alkoxy group, or the like. For E, an alkyl group such as a methyl group or an ethyl group, a hydrogen atom, or the like can be used. Finally, it is particularly suitable that m and n be such that m+n is from 10 to 20.

Among organic molecules that can be represented by the general formula (1), it is suitable to use the organic molecules represented by the general formulas (2) to (5) below:

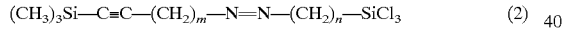
$$(CH_3)_3Si\text{---}C\equiv C\text{---}(CH_2)_m\text{---}N\!\!=\!\!N\text{---}(CH_2)_n\text{---}SiCl_3 \qquad (2)$$

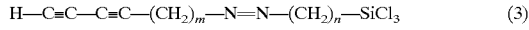
$$H\text{---}C\equiv C\text{---}C\equiv C\text{---}(CH_2)_m\text{---}N\!\!=\!\!N\text{---}(CH_2)_n\text{---}SiCl_3 \qquad (3)$$

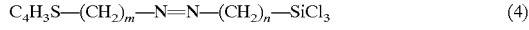
$$C_4H_3S\text{---}(CH_2)_m\text{---}N\!\!=\!\!N\text{---}(CH_2)_n\text{---}SiCl_3 \qquad (4)$$

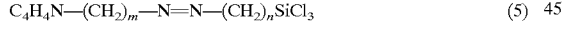
$$C_4H_4N\text{---}(CH_2)_m\text{---}N\!\!=\!\!N\text{---}(CH_2)_nSiCl_3 \qquad (5)$$

wherein m and n are positive integers, m+n being from 2 to 25.

The conductive network is a region that assumes the role of providing conductivity to the conductive organic thin film and is formed by conjugate bonding of the polymerizable group of each organic molecule through polymerization reactions. It is suitable, from the standpoint of conductivity, ease of production, and the like, that the conductive network be a polyacetylene-based, polydiacetylene-based, polypyrrole-based, polythiophene-based, or polyacene-based conjugated system.

The two-terminal organic electronic device of the present embodiment can be produced in the following manner. First, an insulating substrate or an insulating film-covered substrate that is an insulating film formed on a surface of an arbitrary substrate is prepared, and an organic thin film comprising the above-described organic molecules is formed using a photoresist or the like (step of forming an organic thin film). For the method of forming the organic thin film, chemisorption, the Langmuir-Blodgett technique (LB), or the like can be used. Subsequently, the polymerizable groups in the organic thin film are subjected to polymerization reactions to from a conductive network (step of forming a conductive network). Polymerization reactions differ depending on the type of reaction, but for the organic thin film, polymerization reactions are brought about by heat treatment, energy beam irradiation, or the like. For the energy beam, ultraviolet rays, far-ultraviolet rays, X-rays, electron rays, or the like may be used. Next, a first electrode and a second electrode spaced from each other are formed on the organic thin film having a conductive network (conductive organic thin film) by photolithography and etching so that the electrodes are in contact with the overlapping conductive network (step of forming a first electrode and a second electrode). Thus, a two-terminal organic electronic device can be obtained.

According to the construction of the present embodiment, when a conductive network does not exist at the surface of the monomolecular film distanced from the substrate, electric conduction between the conductive network and the electrodes worsens, so it is preferable that organic molecules each having a polymerizable group in its molecular terminal be used. With these kinds of organic molecules, because the area of contact between the conductive network and the electrodes increases, a decrease in contact resistance is made possible and good conductivity, even with a monomolecular film, is secured.

It is to be noted that while above the step of forming a first electrode and a second electrode was carried out after the step of forming a conductive network, the steps are not limited to this order, but it is possible to carry out the step of forming a first electrode and a second electrode first.

In addition, if an even higher conductivity is required, it is possible to form a coating film having a conductive network between the first electrode and the second electrode. Specific methods include the methods described below.

(1) First, after making a substrate on which a monomolecular film having a conductive network and electrodes have been formed by means of the previously described step of forming an organic thin film, step of forming a conductive network, and step of forming a first electrode and a second electrode, the substrate is immersed in an organic solvent having organic molecules containing electrolytically polymerizable groups and light-responsive groups dissolved therein. Subsequently, a first voltage is applied between the first electrode and the second electrode, and a second voltage is applied between the first electrode or the second electrode and an external electrode contacted with the organic solvent and disposed above the monomolecular film. As a result, a coating film having a conductive network is formed between the first electrode and the second electrode. Thus, a two-terminal organic electronic device can be obtained wherein, on a monomolecular film containing a conductive network having a first structure, a coating film containing a conductive network having a second structure is formed.

(2) First, after making a substrate on which a monomolecular film (without a conductive network) and electrodes have been formed by means of the previously described step of forming an organic thin film and step of forming a first electrode and second electrode, the substrate is immersed in an organic solvent having organic molecules containing electrolytically polymerizable groups and light-responsive groups dissolved therein. Subsequently, a first voltage is applied between the first electrode and the second electrode, and a second voltage is applied between the first electrode or the second electrode and an external electrode contacted with the organic solvent and disposed above the monomolecular film. As a result, a coating film is formed on the monomolecular film, and a conductive network is formed in both the monomolecular film and the coating film. Thus, a two-terminal organic electronic device can be obtained wherein, on a monomolecular film containing a conductive network having a first structure, a coating film containing a conductive network having a second structure is formed.

It is to be noted that in (1) and (2), a method of immersion in an organic solvent having organic molecules dissolved therein was described, but this is not the only possible method. An application method also may be employed. In other words, it is possible, after applying an organic solvent containing organic molecules to the surface of an organic thin film, to apply a voltage between a first electrode and a second electrode to form a conductive network.

Embodiment 2

Figure 2:
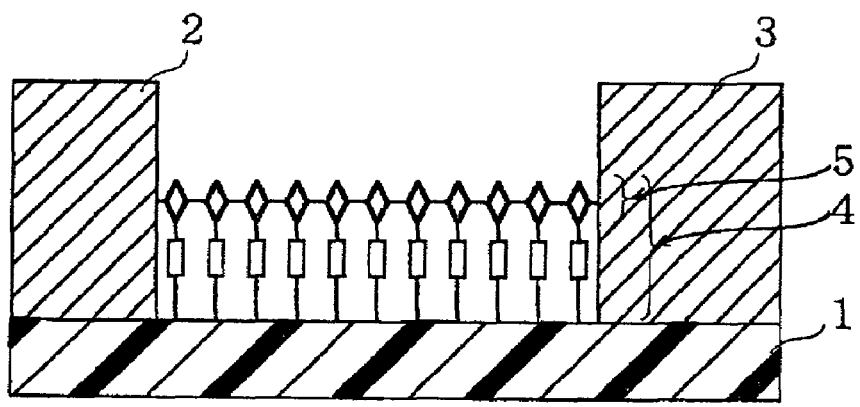
FIG. 2 is a schematic cross sectional view of a two-terminal organic electronic device in accordance with Embodiment 2.

The present embodiment relates to another example of a two-terminal organic electronic device of the present invention. It is described with reference to FIG. 2.

This two-terminal organic electronic device is composed of, formed on a substrate 1, a first electrode 2, a second electrode 3, and a conductive organic thin film 4 contacting and being electrically connected to side surfaces of both electrodes. The conductive organic thin film 4 has a conductive network 5 in which organic molecules each having a light-responsive group and a polymerizable group are linked together.

The two-terminal organic electronic device of the present embodiment can be produced in the following manner. First, an insulating substrate or an insulating film-covered substrate that is an insulating film formed on a surface of an arbitrary substrate is prepared, and an organic thin film comprising the above-described organic molecules is formed using a photoresist or the like (step of forming an organic thin film). Subsequently, the polymerizable groups in the organic thin film are subjected to polymerization reactions to form a conductive network (step of forming a conductive network). Next, a first electrode and a second electrode spaced from each other are formed by photolithography and etching so that the electrodes are in contact with the organic thin film having a conductive network (conductive organic thin film) (step of forming a first electrode and a second electrode) Thus, a two-terminal organic electronic device can be obtained.

According to the construction of the present embodiment, it is possible to use organic molecules each containing a polymerizable group at an arbitrary location in the molecule. In addition, by using organic molecules each containing a plurality of polymerizable groups, a plurality of conductive networks can be formed. Supposing the conductive organic thin film is a monomolecular built-up film, a film having a plurality of conductive networks results.

It is to be noted that while above the step of forming a first electrode and a second electrode was carried out after the step of forming a conductive network, the steps are not limited to this order, but it is possible to carry out the step of forming a first electrode and a second electrode first. It is also possible to carry out the step of forming a first electrode and a second electrode before the step of forming an organic thin film.

In addition, if an even higher conductivity is required, a coating film having a conductive network may be formed between the first electrode and the second electrode in the same manner as Embodiment 1.

Embodiment 3

Figure 3:
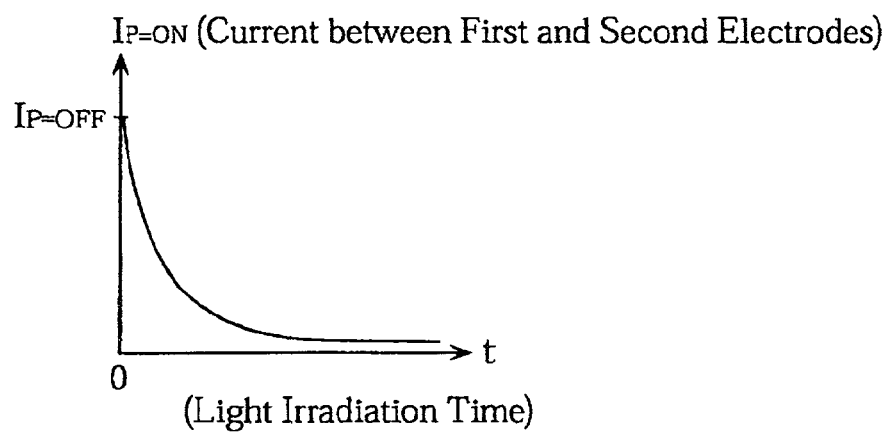
FIG. 3 illustrates a method of operating a two-terminal organic electronic device in accordance with Embodiment 3; (a) schematically shows the change in the conductivity of a conductive organic thin film in response to light irradiation, and (b) schematically shows switching operations accompanying photoisomerization.
Figure 3:
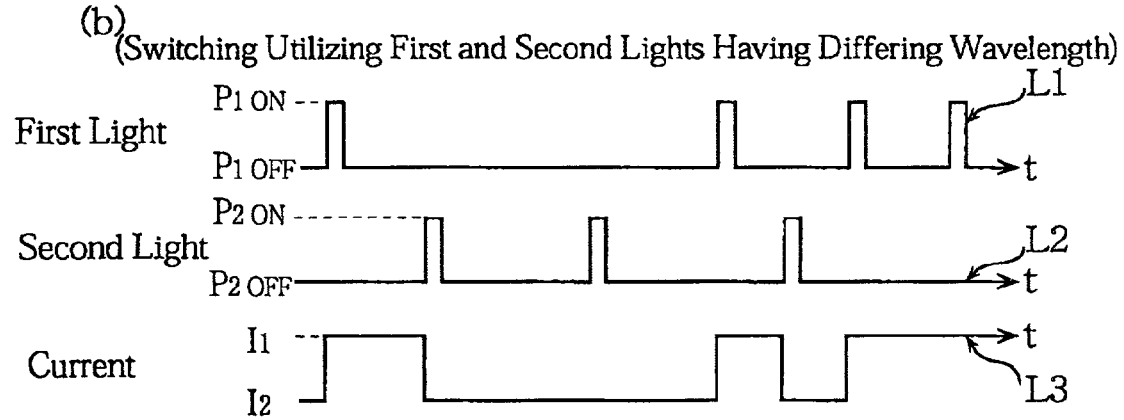

The present embodiment relates to a method of operating a two-terminal organic electronic device. Change in conductivity over time caused by light irradiation and the switching operations of a two-terminal organic electronic device are described with reference to FIG. 3.

FIG. 3(a) is schematic graph qualitatively showing change in conductivity as a function of irradiation time when the conductive organic thin film is irradiated with light of a constant intensity.

Considering that the amount of irradiated light is proportional to the product of the intensity of the irradiated light and irradiation time, the results are the same whether the amount of light with which the conductive organic thin film is irradiated, the irradiation time under the condition of constant light intensity, or the light intensity under the condition of constant irradiation time is plotted on the horizontal axis. In the following, the case in which the intensity of light is constant is described. Change in conductivity is determined by the change in current with a constant voltage being applied between the first and the second electrode.

The conductivity of the conductive network changes with irradiation, and then becomes a constant value. In contrast to FIG. 3(a), the conductive network may be such that when sufficient light is applied for a sufficient amount of time in order to change conductivity, the current value reaches 0 A. In addition, while a case in which the current value decreases due to light irradiation is shown in FIG. 3(a), it is possible that the conductive network be such that the current value increases. The nature of the change depends on the substances that make up the conductive organic thin film, the structure of the conductive organic thin film, the structure of the conductive network, and the like.

FIG. 3(b) shows the principle of switching operations effected by shifting between stabilized states, one having a first conductivity and another a second conductivity, respectively. The shifting accompanies isomerization caused by a first or a second light irradiation, where the light-responsive group is a photoisomerizable group. Line L1 and line L2 show whether a first and second light is being applied ($P_{1\ ON}$, $P_{2\ ON}$) or not applied ($P_{1\ OFF}$, $P_{2\ OFF}$), respectively. Line L3 shows the response to the light irradiation, the current value after a first light was applied being $I_1$ and the current value after a second light was applied being $I_2$.

FIG. 3(b) shows the switching of current flowing between the first and the second electrode when voltage is being applied between the first and the second electrode. From L3, it is understood that the switching of current is triggered by the first and the second lights and is an operation like that of reset-set (R-S) flip-flop.

More specifically, in FIG. 3(b), the case in which only one of two differing isomers is included is taken to be the stabilized state having the first conductivity while the case in which the other of the two differing isomers is taken to be the stabilized state having the second conductivity. In other words, the two states in which complete isomerization has taken place are the stabilized states having the first or the second conductivity, respectively. When this is the case, even if the first light is applied to the first stabilized state, there is no change in conductivity. The same is the case when the second light is applied to the second stabilized state.

In the above description, the switching operations were used as a switching device for switching current between a first and a second electrode. However, because the conductivity of a conductive organic thin film is changed by light irradiation, it may be used as the variable resistor of a light controller.

In addition, in the case of a conductive organic thin film comprising an organic molecular group comprising organic molecules each having a photoisomerizable group that serves as the light-responsive group, a first or a second light is applied while a constant current is flowing or a constant voltage is being applied between the first and second electrodes, and the change in voltage or the change in current between the first and second electrodes is read. This makes it possible to use the device as a light meter or light detector supposing both the change in voltage and the change in current are read along with the irradiation time. However, with these applications, it is necessary that the conductivity of the conductive organic thin film be initialized after the film is irradiated with another light, either the first or the second light being used as a light that initializes a state.

Because the state of the two isomers shifts with isomerization and because the state of the isomers is maintained even when a light is no longer applied, it is also possible to use the device as a memory device.

Embodiment 4

Figure 4:
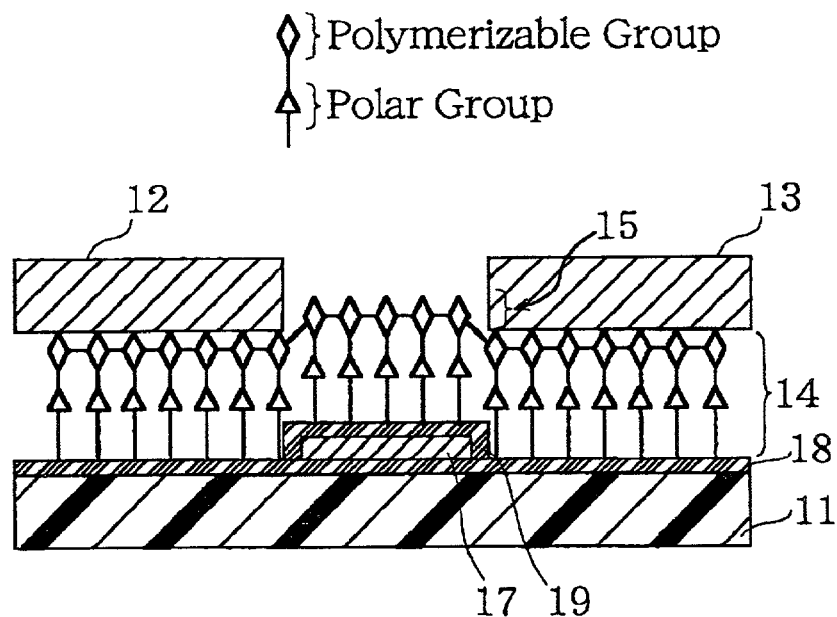
FIG. 4 is a cross sectional view of a three-terminal organic electronic device in accordance with Embodiment 4.

The present embodiment relates to an example of a three-terminal organic electronic device of the present invention. It is described with reference to FIG. 4.

This three-terminal organic electronic device is composed of, formed on a substrate, a first electrode 12, a second electrode 13, a third electrode 17, and a conductive organic thin film 14 electrically connected to a portion of the undersurfaces of the first and the second electrodes and insulated from the third electrode. The conductive organic thin film 14 has a conductive network 15 in which organic molecules each having a polar group and a polymerizable group are linked together. It is to be noted that in the figure, reference number 18 designates a first insulating film and reference number 19 designates a second insulating film.

Other than the requirement of having a polar group and a polymerizable group, the organic molecules used in forming the conductive organic thin film 14 do not have any particular limitations, but among the many possibilities, it is suitable to use the organic molecule represented by the general formula (6) below (a silane-based chemisorbable substance):

$$A\text{-}(CH_2)_m\text{-}B'\text{-}(CH_2)_n\text{-}SiD_pE_{3-p} \qquad (6)$$

wherein A is a polymerizable group which bonds by conjugated bonds, B' is a polar group, D is a functional group which reacts with active hydrogens, E is a functional group which does not react with active hydrogens, m and n are positive integers, m+n being from 2 to 25, and p is an integer of 1, 2, or 3.

In the general formula (6), it is suitable that B' be a polarizable group that is polarized when an electric field is applied such as an oxycarbonyl group, a carbonyl group, or the like. For A, D, E, m, and n, the same can be used as were used in the above-described two-terminal electronic devices.

Among organic molecules that can be represented by the general formula (6), it is suitable to use the organic molecules represented by the general formulas (7) to (10) below:

$$(CH_3)_3Si\text{—}C\equiv C\text{—}(CH_2)_m\text{—}OCO\text{—}(CH_2)_n\text{—}SiCl_3 \qquad (7)$$

$$H\text{—}C\equiv C\text{—}C\equiv C\text{—}(CH_2)_m\text{—}OCO\text{—}(CH_2)_n\text{—}SiCl_3 \qquad (8)$$

$$C_4H_3S\text{—}(CH_2)_m\text{—}OCO\text{—}(CH_2)_n\text{—}SiCl_3 \qquad (9)$$

$$C_4H_4N\text{—}(CH_2)_m\text{—}OCO\text{—}(CH_2)_n\text{—}SiCl_3 \qquad (10)$$

wherein m and n are positive integers, m+n being from 2 to 25.

For the conductive network, a polyacetylene-based, polydiacetylene-based, polypyrrole-based, polythiophene-based, or polyacene-based conjugated system is suitable as was the case in the above-described two-terminal organic electronic devices.

The three-terminal organic electronic device of the present embodiment can be produced in the following manner. First, an insulating substrate or an insulating film-covered substrate that is an insulating film formed on a surface of an arbitrary substrate is prepared, and on top of this, a third electrode is formed by photolithography and etching (step of forming a third electrode). Subsequently, using a photoresist or the like, an organic thin film comprising the above-described organic molecular group is formed directly or with an insulating film disposed therebetween on the third electrode such that the third electrode is covered (step of forming an organic thin film) For the method of forming the organic thin film, chemisorption, the Langmuir-Blodgett technique (LB), or the like can be used. Next, the polymerizable groups in the organic thin film are subjected to polymerization reactions to form a conductive network (step of forming a conductive network). The polymerization reactions in the organic thin film are brought about by heat treatment, energy beam radiation, or the like. Finally, a first electrode and a second electrode spaced from each other and also from a third electrode are formed on the organic thin film having a conductive network (conductive organic thin film) by photolithography and etching so that the electrodes are in contact with the overlapping conductive network (step of forming a first electrode and a second electrode). Thus, a three-terminal organic electronic device can be obtained.

According to the construction of the present embodiment, when a conductive network does not exist on the surface of a monomolecular film distanced from the substrate, electric conduction between the conductive network and the electrodes worsens, so it is preferable that organic molecules each having a polymerizable group in its molecular terminal be used. With these kinds of organic molecules, because the area of contact between the conductive network and the electrodes increases, a decrease in contact resistance is made possible and good conductivity, even with a monomolecular film, is secured.

It is to be noted that while above the step of forming a first electrode and a second electrode was carried out after the step of forming a conductive network, the steps are not limited to this order, but it is possible to carry out the step of forming a first electrode and a second electrode first.

In addition, if an even higher conductivity is required, it is possible to form a coating film having a conductive network between the first electrode and the second electrode as was described in Embodiment 1.

Embodiment 5

Figure 5:
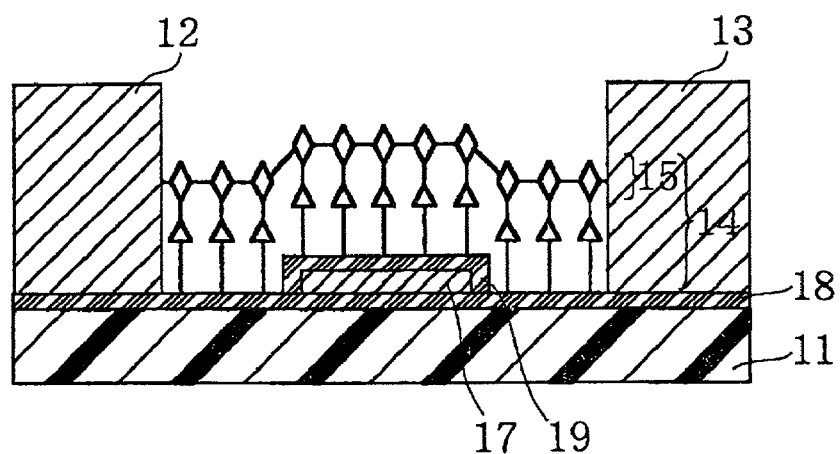
FIG. 5 is a cross sectional view of a three-terminal organic electronic device in accordance with Embodiment 5.

The present embodiment relates to another example of a three-terminal organic electronic device of the present invention. It is described with reference to FIG. 5.

This three-terminal organic electronic device is composed of, formed on a substrate 11, a first electrode 12, a second electrode 13, a third electrode 17, and a conductive organic thin film 14 electrically connected to the side surfaces of the first and second electrodes and insulated from the third electrode 17. The conductive organic thin film 14 has a conductive network 15 in which organic molecules each having a polar group and a polymerizable group are linked together.

The three-terminal organic electronic device of the present embodiment can be produced in the following manner. First, an insulating substrate or an insulating film-covered substrate that is an insulating film formed on the surface of an arbitrary substrate is prepared, and on top of this, a third electrode is formed by photolithography and etching (step of forming a third electrode). Subsequently, using a photoresist, an organic thin film comprising the above-described organic molecular group is formed directly or with an insulating film disposed therebetween on the third electrode so that the third electrode is covered (step of forming an organic thin film). Next, the polymerizable groups in the organic thin film are subjected to polymerization reactions to form a conductive network (the step of forming a conductive network). Finally, a first electrode and a second electrode spaced from each other and also from a third electrode are formed by photolithography and etching so that the electrodes are in contact with the conductive network (step of forming a first electrode and a second electrode). Thus, a three-terminal organic electronic device can be obtained.

According to the construction of the present embodiment, it is possible to use organic molecules each containing a polymerizable group at an arbitrary location in the molecule In addition, by using organic molecules each containing a plurality of polymerizable groups, a plurality of conductive networks can be formed. Supposing the organic thin film is a monomolecular built-up film, a film having a plurality of conductive networks results.

It is to be noted that while above the step of forming a first electrode and a second electrode was carried out after the step of forming a conductive network, the steps are not limited to this order, but it is possible to carry out the step of forming a first electrode and a second electrode first. It is also possible to carry out the step of forming a first electrode and a second electrode before the step of forming an organic thin film.

In addition, if an even higher conductivity is required, a coating film having a conductive network may be formed between the first electrode and the second electrode in the same manner as Embodiment 1.

Embodiment 6

The present embodiment relates to a method of operating a three-terminal organic electronic device. Change in conductivity over time caused by application of an electric field and the switching operations of a three-terminal organic electronic device are described with reference to FIG. 6.

FIG. 6(a) is a schematic graph qualitatively showing change in conductivity when a voltage is applied to the third electrode 17.

Considering that the voltage applied to the third electrode 17 is proportional to the electric field across the conductive organic thin film, the results are the same whether the electric field applied or the voltage applied to the third electrode 17 are plotted on the horizontal axis. In the following description, the applied voltage is used. It is to be noted that the change in conductivity of the conductive network is determined by the change in current with a constant voltage being applied between the first electrode 12 and the second electrode 13.

It is understood that a change in conductivity of the conductive network is effected by applying a voltage to the third electrode 17 and that the conductivity converges to a constant value as the applied voltage increases. In other words, conductivity can be controlled within the range from the conductivity when no voltage is being applied to the conductivity at convergence by the application of voltage to the third electrode.

Figure 6:
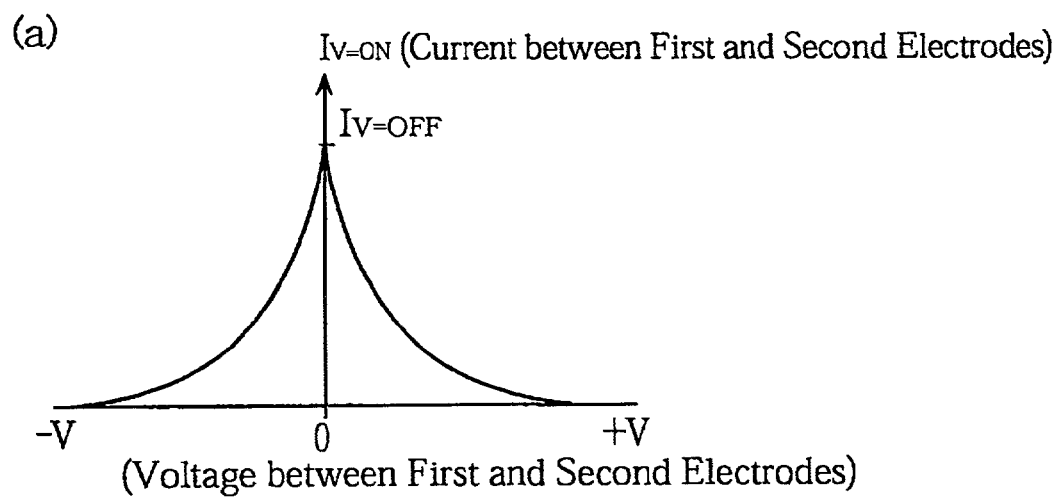
FIG. 6 illustrates a method of operating a three-terminal organic electronic device in accordance with Embodiment 6; (a) schematically shows the dependency of the conductivity of a conductive network on the voltage applied to a third electrode, and (b) schematically shows switching operations brought about by applying or not applying voltage to the third electrode.
Figure 6:
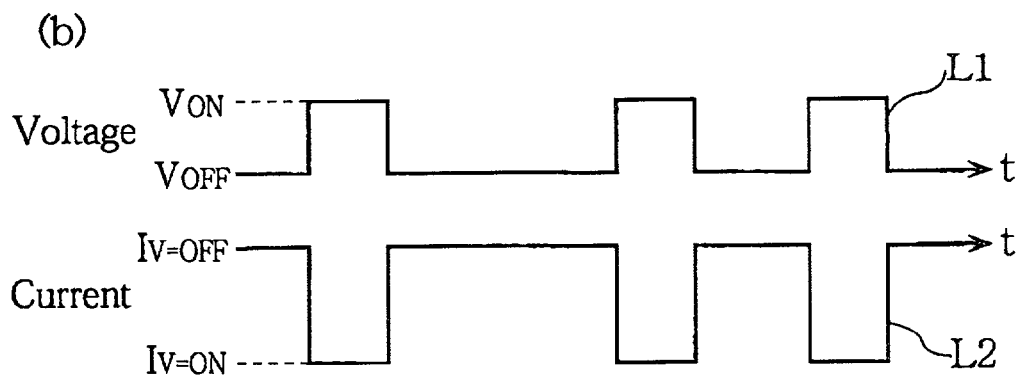

In FIG. 6, the case in which the current is 0 A when voltage is applied is shown, but neither the ON current, the current when voltage is being applied, nor the OFF current, the current when voltage is not being applied, are limited to 0 V. While a case in which the current value decreases due to voltage application is shown, it is possible that the conductive network be such that the current value increases. The nature of the change depends on the construction off the conductive organic thin film, the structure of the conductive network, and the like.

The switching of conductivity in the conductive network is made possible by shifting between a stabilized state having a first conductivity when voltage is not being applied and a stabilized state having a second conductivity when a specified voltage is being applied.

FIG. 6(b) shows the principle of switching operations of a three-terminal organic electronic device wherein the switching is brought about by an ON current ($I_{V=ON}$) when a specified voltage is applied ($V_{ON}$) and an OFF current ($I_{V=OFF}$) when voltage is not applied ($V_{OFF}$), voltage being applied between a first electrode 12 and a second electrode 13.

Therefore, from FIG. 6(b), it is understood that the switching of current is made possible by the ON and OFF specified voltages applied to the third electrode 17.

Although the case of switching by ON and OFF voltages has been shown, switching between a current value when a first voltage is applied to the third electrode 17 and a current value when a second voltage is applied to the third electrode 17 is also possible.

In the above, the switching of current between a first and a second electrode was used for a switching device, but it may also be used for a variable resister of an electric field controller.

The three-terminal organic electronic device described above makes high-speed response possible and thus, if used as a switching device, it can be used in an active matrix liquid crystal display device or an active matrix EL display device. As the basic principles, production methods, and the like of these kinds of display device are commonly known, a detailed explanation is omitted here.

Next, methods of producing a functional organic thin film according to the present invention are described. These methods can be applied to the methods of producing the above-described two-terminal organic electronic devices and three-terminal organic electronic devices.

Embodiment 7

In a first method of producing a functional organic thin film of the present invention, an active hydrogen exposure treatment is performed on a specified portion of a substrate surface to form a region having a high density of exposed active hydrogens (step of preliminarily treating a substrate). This region is then contacted with organic molecules each having a functional group that reacts with active hydrogens and a functional group to form a functional organic thin film wherein the organic molecules are fixed to the specified portion of the substrate surface by covalent bonds (step of forming a functional organic thin film).

The substrate may be such that active hydrogens are not exposed. Examples include a water-repellent single layer substrate, a layered substrate wherein a water-repellent coating film is formed on a surface of an arbitrary substrate material or on a substrate material described later on which active hydrogens are exposed, and the like. Examples for the substrate material of the water-repellent single layer substrate include water-repellent synthetic resins such as acrylic resin, polycarbonate resin, and polyethersulfone resin. Examples for the water-repellent coating film include metal films made of aluminum or the like, synthetic resin films made of acrylic resin, polycarbonate resin, polyethersulfone resin, or the like, and water-repellent organic films. The density of exposed active hydrogen in these synthetic resin substrate materials and synthetic resin films is approximately zero. It is to be noted that the shape of the substrate is not particularly limited, but a substrate having a plate shape (single layer substrate or layered substrate) is normally used.

The step of preliminarily treating a substrate comprises carrying out an active hydrogen exposure treatment on a specified portion of the substrate surface (region intended for film formation). It can be said that the active hydrogen exposure treatment is a treatment for making the substrate surface such that active hydrogens are exposed. Specific methods include (1) a method by oxidizing the specified portion of the substrate surface and supplying active hydrogens, and (2) a method by preparing a layered substrate wherein a hydrophilic organic film is formed on a surface of a substrate material having active hydrogens exposed and removing the organic film from the specified portion of the substrate surface to expose the active hydrogens.

(1) Method by oxidizing a specified portion of the substrate surface and supplying active hydrogens.

Oxidizing methods such as excimer UV light irradiation, ultraviolet irradiation, plasma treatment, and corona treatment may be performed on a specified portion of the substrate in an atmosphere containing oxygen atoms and hydrogen atoms. This method is described in detail using oxidizing by excimer UV light irradiation as an example. First, the oxygen is broken down by excimer UV light irradiation, and ozone is compounded. The ozone then reacts with a substance supplying the hydrogen atoms, compounding an active species having active hydrogen. Meanwhile, at the specified portion of the substrate, the irradiation of UV light causes covalent bonds to break and cleave, and the active species acts on the cleaved portion. Thus, active hydrogens are supplied to the specified portion of the substrate surface, forming a region having a high density of exposed active hydrogens.

The specified portion, as is shown above, is an arbitrarily selected portion of the substrate surface. There may be, however, one of these portions or a plurality of these portions. In the case of a plurality of these portions, the portions may have the same shape or differing shapes. When the portion (one of the portions in the case of a plurality of portions) is at the micron pattern level (specifically, 1000 $\mu m^2$ or less), it tends to be the case that a higher precision functional organic thin film can be formed when the step of preliminarily treating a substrate is carried out than when not carried out. It is to noted that in consideration of limitations in the treatment process, the lower limit for the area of the portion is 0.01 $\mu m^2$.

For the method of irradiating only the specified portion of the substrate surface with excimer UV light, it is possible to cover a portion other than the specified portion with a mask material such as a resist and exposing only the specified portion, to apply an excimer UV light, to spot irradiate only the specified portion with the excimer UV light, or the like. In the method in which a mask material is used, the mask material may be removed after the region having a high density of exposed active hydrogens is formed and before film formation is carried out. Alternatively, a substrate having a mask material may be used in the step of forming a functional organic thin film, and the mask material removed after film formation is completed. If the mask material is removed before film formation, a cleaner film is obtained because dirt from the mask material does not adhere to the functional organic thin film. If the mask material is removed after film formation, portions of the substrate surface on which the film has not been formed become clean. The timing of the removal of the mask material may be chosen according to intended applications and the like for the substrate after film formation.

Examples of the substance supplying the hydrogen atoms include water, ammonia, and the like. When water is used, the active hydrogens are those of —OH groups. When ammonia is used, the active hydrogens are those of —NH groups.

(2) Method by removing an organic film from a specified portion of a layered substrate surface to expose active hydrogens.

In this method, excimer UV light irradiation, ultraviolet irradiation, plasma treatment, corona treatment, or the like may be carried out on a specified portion of a layered substrate surface under an atmosphere containing oxygen, the layered substrate being such that a water-repellent organic film is formed on a surface of a substrate material on which active hydrogens are exposed. This method is described in detail using oxidizing by ultraviolet irradiation as an example. In this method, first, the oxygen is broken down by the ultraviolet irradiation, and ozone is compounded. Ultraviolet irradiation is then used again, this time on the ozone, and the ozone breaks down to compound active oxygen. Because active oxygen is highly oxidizing oxygen atoms, the organic film reacts with this active oxygen, becomes organic oxide, carbon monoxide, water, and the like, and volatilizes such that it is removed. As a result, only the specified portion of the surface of the layered substrate becomes a region having exposed active hydrogens. It is to be noted that the organic film contains an organic compound such as oil or human sebum.

For the method of irradiating only the specified portion of the substrate surface with ultraviolet rays, it is possible to cover a portion other than the specified portion with a mask material such as a resist and exposing only the specified portion, to apply an excimer UV light, to spot irradiate only the specified portion with the excimer UV light, or the like. In the method in which a mask material is used, the mask material may be removed after the region having a high density of exposed active hydrogens is formed and before film formation is carried out. Alternatively, a substrate having a mask material may be used in the step of forming a functional organic thin film, and the mask material removed after film formation is completed.

The step of forming a functional organic thin film is such that the region having a high density of exposed hydrogens that was formed in the manner described above is contacted with organic molecules each having a functional group that reacts with active hydrogens and a functional group to form a functional organic thin film wherein the organic molecules are fixed to the specified portion of the substrate surface by covalent bonds. For example, the step of forming a functional organic thin film may be brought about by preparing a chemisorption solution comprising the above-mentioned organic molecules and a nonaqueous organic solvent that does not damage the substrate and to contact the region with this chemisorption solution. As for the method of contacting the region with the chemisorption solution, it is possible to immerse the substrate or the substrate covered with a mask material in the chemisorption solution, to apply the chemisorption solution to the substrate or the substrate covered with the mask material, or the like.

The functional group in each organic molecule that reacts with active hydrogens may be a halogen, an alkoxy group, an isocyanate group, or the like. The functional group in each organic molecules may be a photoisomerizable group such as an azo group, a polar group such as a carbonyl group or an oxycarbonyl group, a polymerizable group that bonds by conjugated bonds such as an acetylene group, a diacetylene group, a thienyl group, or a pyrrolyl group, or the like.

In the present step, as was described above, a chemisorption solution containing the previously described organic molecules is prepared, and the substrate is, for example immersed in the adsorption solution or the adsorption solution is applied to the substrate to put the substrate surface in contact with the organic molecules. As a result, a dehydrochlorination reaction takes place between the functional groups in the organic molecules that react with active hydrogens and the active hydrogens exposed on the substrate surface, and the molecular groups in the organic molecules are fixed to the substrate surface by covalent bonds.

In the present invention, it is possible to carrying out a cleaning step for removing substances that are not bonded to the substrate. Specifically, a method such as one in which unbonded substances are washed away by a nonaqueous solvent used for cleaning may be carried out. If this method is employed, a drying step for removing the nonaqueous solvent is carried out after the cleaning step.

A functional organic thin film formed in this manner is formed after a specified portion is made into a region having a high density of exposed active hydrogens, and thus is a film having high dimensional precision. In addition, because organic molecules making up the functional organic thin film are fixed to a surface by covalent bonds, the film is excellent in terms of peel resistance and adhesion.

Embodiment 8

A second method of producing a functional organic thin film of the present invention differs from the method of Embodiment 7 in that in the step of preliminarily treating a substrate, an active hydrogen removing treatment is performed on a portion other than a specified portion of a substrate surface.

The substrate may be such that active hydrogens are exposed on its surface. Examples for the substrate include a hydrophilic single layer substrate, a layered substrate wherein a hydrophilic coating film is formed on a surface of an arbitrary substrate material or a substrate material on which active hydrogens are not exposed, and the like. Examples for the substrate material of the hydrophilic single layer substrate include metals having oxidized surfaces, silicon, silicon nitride, silica, glass, and the like. Examples for the hydrophilic coating film include metal films having oxidized surfaces, silicon films, silicon nitride films, silica films, glass films, and the like. These examples have densities of exposed active hydrogens that are $5/nm^2$ or greater, values that can be considered high. It is to be noted that the shape of the substrate is not particularly limited though a substrate (single layer substrate or layered substrate) having a plate shape is usually used.

The step of preliminarily treating a substrate of the present embodiment is one in which an active hydrogen removing treatment is performed on a portion other than a specified portion of a substrate (region that is not intended for film formation). It can be said that the active hydrogen removing treatment is a treatment for changing the substrate from one on which active hydrogens are exposed to one on which active hydrogens are not exposed. Specific methods include (1) a method by performing a chemical treatment on the portions of the material other than the specified portion such that the active hydrogens are removed, and (2) a method by performing a physical treatment on the portions of the material other than the specified portion such that the active hydrogens are removed.

(1) A method by performing a chemical treatment on a portion other than a specified portion of a substrate surface.

In this method, a portion other than a specified portion of a substrate surface are contacted with organic molecules each having a functional group that reacts with active hydrogens such that these functional groups and active hydrogens in the portion other than the specified portion react and the active hydrogens are removed. According to this method, because the removal of active hydrogens is effected by a dehydrochlorination reaction between the functional groups that react with active hydrogens and the active hydrogens, it is possible to remove active hydrogens from the portion other than the specified portion of the substrate surface. Thus, the specified portion becomes a region having a high density of exposed active hydrogens.

As for the method of contacting the portion other than the specified portion with the previously described organic molecules, it is possible to cover the specified portion with a mask material such as resist and with the portion other than the specified portion exposed, to contact the portion other than the specified portion with the organic molecules.

Examples for the organic molecules having functional groups that react with active hydrogens include the organic molecule represented by the general formula (11) below:

$$Z\text{—}SiX_pY_{3-p} \qquad (11)$$

wherein X is a functional group that reacts with active hydrogen, Y is a functional group that does not react with active hydrogen, Z is an inert functional group, and p is 1, 2, or 3.

Examples for X include a halogen, an alkoxyl group, an isocyanate group, and the like. Examples for Y include an alkyl group such as a methyl group or an ethyl group and the like. Examples for Z include an alkyl group such as a methyl group or an ethyl group, an alkyl fluoride group in which some or all of the hydrogen atoms making up the alkyl group are replaced by fluorine atoms, and the like. It is to be noted that Z functional groups are spaced from the substrate.

Among the previously described organic molecules, because they do not obstruct the functionality of the functional organic thin film and have excellent peel resistance, the organic molecules represented by the general formulas (12) to (17) below are suitable:

$$CH_3-(CH_2)_m-SiCl_3 \quad (12)$$

$$CF_3-(CF_2)_m-(CH_2)_n-SiCl_3 \quad (13)$$

$$CH_3-(CH_2)_m-SiHCl_2 \quad (14)$$

$$CF_3-(CF_2)_m-(CH_2)_n-SiHCl_2 \quad (15)$$

$$CH_3-(CH_2)_m-Si(-OCH_3)_3 \quad (16)$$

$$CH_3-(CH_2)_m-Si(-NCO)_3 \quad (17)$$

wherein m and n are 0 or a positive integer.

(2) Method by performing a physical treatment on a portion other than a specified portion of a substrate surface.

This method is one in which the removal of active hydrogens exposed on a substrate surface is effected by the breaking of covalent bonds. Specifically, a specified portion of the substrate surface is covered with a mask material such as a resist, and the exposed substrate surface is irradiated with ultraviolet light or the like in a vacuum. Thus, covalent bonds that bond the active hydrogens to the substrate are broken such that the active hydrogens are removed. By then removing the mask material, the specified portion of the substrate surface becomes a region having a high density of exposed active hydrogens.

The above-described methods of producing a functional organic thin film can be applied to various uses for films, supposing the film is fixed to a substrate by covalent bonds, such as contamination-prevention films, liquid crystal orientation films, conductive films, and insulating films. Thus, it is possible to apply these production methods to the film formation of a conductive organic thin film in the production of the two-terminal organic electronic devices and the three-terminal organic electronic devices described earlier Specifically, the step of preliminarily treating a substrate, comprising carrying out the active hydrogen exposure treatment or the active hydrogen removing treatment, is carried out before the step of forming a functional organic thin film.

In addition, it is, of course, possible to apply these production methods to the production of active matrix liquid crystal display devices or active matrix EL display devices that use three-terminal organic electronic devices obtained in this way as switching devices.

EXAMPLES

In the following, the present invention is described in further detail by reference to representative examples.

Example 1

First, organic molecules each having an acetylene group (—C≡C—) which through polymerization forms conjugated bonds with other acetylene groups to form a conductive network, an azo group (—N=N—) serving as an photoisomerizable group, and a chlorosilyl group (—SiCl) serving as a functional group which reacts with active hydrogens on a substrate surface were diluted with a dehydrated dimethylsilicone-based organic solvent to 1 mass % to prepare a chemisorption solution. Each of the organic molecules is represented by the general formula (18) below:

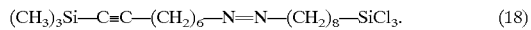

Figure 7:
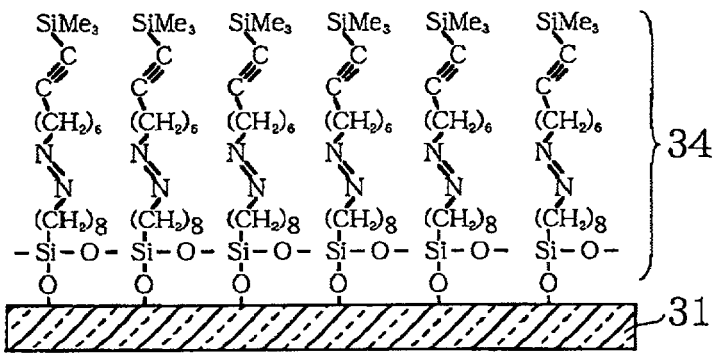
FIG. 7 illustrates a method of producing a two-terminal organic electronic device in accordance with Example 1 by a schematic cross sectional view showing, enlarged to the molecular level, the state after which a monomolecular film has been formed.

Next, a mask pattern was formed on a surface of an insulating substrate (glass substrate) using a photoresist such that a portion for forming a monomolecular film was left exposed, and the substrate was immersed in the chemisorption solution to bring about selective chemisorption in the mask pattern openings. Then, unreacted organic molecules remaining on the surface were removed by washing with chloroform and the photoresist mask pattern was removed. Thus, as is shown in FIG. 7, a monomolecular film 34 comprising the previously described organic molecules was formed on the glass substrate 31. It is to be noted that at the time of chemisorption many hydroxyl groups containing active hydrogens were present on the glass substrate surface in the mask pattern openings. Thus the chlorosilyl groups (—SiCl) in the organic molecules underwent a dehydrochlorination reaction to form a monomolecular film made up of organic molecules covalently bonded to the substrate surface as shown in the general formula (19) below:

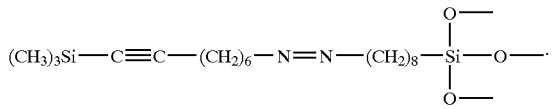

Figure 8:
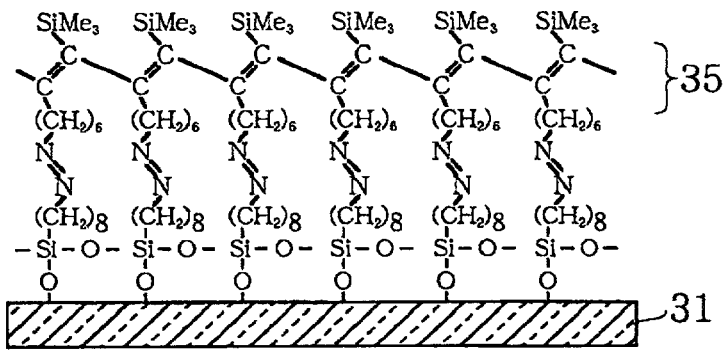
FIG. 8 illustrates a method of producing a two-terminal organic electronic device in accordance with Example 1 by a schematic cross sectional view showing, enlarged to the molecular level, the state after which a conductive network has been formed by polymerization.

Subsequently, the acetylene groups in the monomolecular film were polymerized using a Ziegler-Natta catalyst in a toluene solvent, and as shown in FIG. 8, a polyacetylene-based conductive network 35 was formed.

Finally, a nickel thin film was formed on the whole surface by vapor deposition and photolithography and etching were carried out to form a first electrode and a second electrode, the gap separating the electrodes being 10 μm and the length of each electrode being 30 μm. Thus, a two-terminal organic electronic device provided with a monomolecular film (conductive organic thin film) having a conductive network electrically connected to both the first electrode and the second electrode was produced (see FIG. 1).

Figure 9:
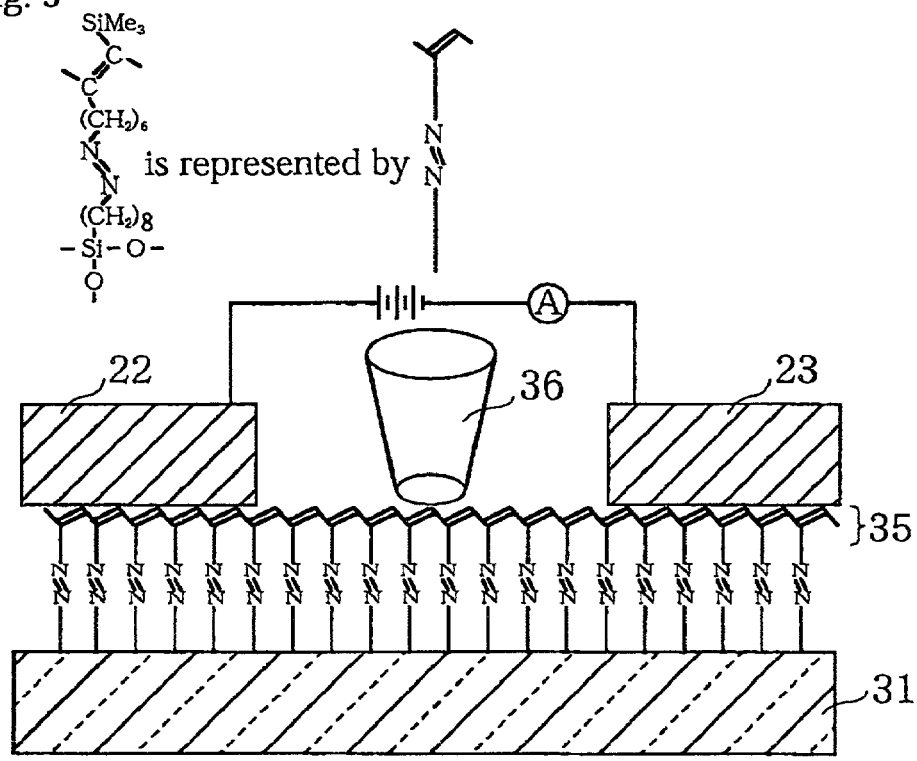
FIG. 9 is a schematic cross sectional view of a two-terminal organic electronic device in accordance to Example 1 illustrating switching brought about by light.

As shown in FIG. 9, the electrodes were connected by a polyacetylene-based conductive network 35, and thus, when a voltage of several volts was applied between a first electrode 22 and a second electrode 23, several nanoamperes of current (approximately 2 nA per 1 V) flowed between the electrodes. More specifically, before the device was tested, visible rays were applied to the conductive organic thin film, and thus, the azo groups were in the trans configuration. Ultraviolet rays were subsequently applied to the conductive organic thin film, and consequently, the azo groups changed from trans configuration to cis configuration and the current value became approximately 0 A. Finally, when visible rays were applied again, the azo groups changed from cis configuration back to trans configuration, and the original conductivity was recovered.

This kind of deterioration in conductivity caused by the irradiation of ultraviolet rays is thought to occur because the polyacetylene-based conjugated bonds are distorted by the photoisomerization of the azo groups (change from trans configuration to cis configuration) resulting in deterioration in the conductivity of the conductive network 35.

Thus, in the two-terminal organic electronic device of Example 1, by applying two types of light having differing wavelengths, the conductivity of the conductive network 35 was controlled and the switching of current flowing between the first electrode 22 and the second electrode 23 was achieved.

Supplementary Remarks

When a polyacetylene-based conjugated system is used as the conductive network, the degree of polymerization is low and resistance increases. In other words, the ON current is low, but in this case, a dopant having functional groups with charge mobility (for example, a halogen gas or a Lewis acid as the acceptor molecules and an alkali metal or a ammonium salt as the donor molecules) is dispersed in the conductive network. As a result of the doping, the ON current increases. For example, in the case of a monomolecular film doped with iodine, when a voltage of 1 V was applied between the first electrode and the second electrode, a current of 0.2 mA flowed between the electrodes.

In this case, it is possible to form a monomolecular film on the conductive substrate surface with an insulating thin film disposed therebetween when the substrate is a metal or the like conductive substrate. With a structure such as this one, the substrate itself is not charged, and thus stable operation of the organic electronic device is improved.

When a greater ON current is required, it is possible to shorten the distance between the first electrode and the second electrode or to increase the widths of the electrodes. When an even greater ON current is required, it is possible to build up the monomolecular film or to form a coating film having a conductive network between the first electrode and the second electrode.

In Example 1, a catalytic-polymerization method was employed, but an electrolytic-polymerization method or a polymerization method wherein an energy beam such as a light, an electron beam, X-rays, or the like is applied may be used to similarly form a conductive network.

For the conductive network, in addition to a polyacetylene-based conjugated system, a polydiacetylene-based, a polyacene-based, a polypyrrole-based, or a polythiophene-based conjugated system may be used. Thus, in the carrying out of the catalytic polymerization, the polymerizable group, in addition to the acetylene group used in the example, may be a pyrrolyl group, thienyl group, diacetylene group, or the like.

In the fabrication of a monomolecular film or a monomolecular built-up film, in addition to chemisorption, the Langmuir-Blodgett technique may be applied.

If the step of forming a first and a second electrode is carried out before the step of forming a conductive network in which molecules making up the organic thin film are polymerized, the first and the second electrodes may be used for electrolytic polymerization in the fabrication of the conductive network. In other words, a voltage may be applied between the first and second electrode of the organic thin film comprising an organic molecular group comprising organic molecules each having a pyrrolyl group or a thienyl group as the electrolytically polymerizable group to selectively electrolytically polymerize the organic thin film between the first and the second electrodes.

After forming the monomolecular film comprising an organic molecular group comprising organic molecules each having a pyrrolyl group or a thienyl group, the first electrode, and the second electrode on the substrate, a coating film may be formed on the surface of the monomolecular film at the same time conductive networks are formed in both the monomolecular film and the coating film. This may be achieved by immersing the substrate with the film and electrodes formed thereon in an organic solvent in which a substance having pyrrolyl groups or thienyl groups has been dissolved, applying a first voltage between the first electrode and the second electrode, and applying a second voltage between the first electrode or the second electrode and an external electrode contacted with the organic solvent disposed above the monomolecular film. In this case, the organic electronic device is provided with a conductive organic thin film comprising a monomolecular film portion and a polymer film type coating film portion each having a conductive network.

Alternatively, after forming on a the substrate, the monomolecular film comprising an organic molecular group comprising organic molecules each having a pyrrolyl group or a thienyl group, the first electrode, and the second electrode and forming a conductive network having a first structure in the monomolecular film, a coating film may be formed on the surface of the monomolecular film having a polypyrrole-based or polythiophene-based conductive network at the same time a conductive network having a polypyrrole-based or polythiophene-based second structure is formed in the coating film. This may be achieved by immersing the substrate in an organic solvent with a substance having pyrrolyl groups or thienyl groups dissolved therein, applying a first voltage between the first electrode and the second electrode, and applying a second voltage between the first electrode or the second electrode and an external electrode contacted with the organic solvent disposed above the monomolecular film. In this case, the organic electronic device is provided with a conductive organic thin film comprising a monomolecular film portion and a polymer film-like coating film portion each having conductive networks.

A monomolecular film or a monomolecular built-up film, the films comprising an organic molecular group comprising organic molecules each having an acetylene group or a diacetylene group, the acetylene or diacetylene group being a functional group which serves as the polymerizable group that polymerizes when irradiated with an energy beam, may be irradiated with ultraviolet rays, far-ultraviolet rays, electron rays, X-rays or the like to polymerize molecules in the molecular film or the molecular built-up film and form a conductive network.

It is to be noted that while in Example 1 the organic molecule represented by the general formula (18) was used, organic molecules represented by the general formulas (2) to (5) may also be suitably used.

Example 2

First, organic molecules each having a pyrrolyl group ($C_4H_4N$—) which forms a conductive network with other pyrrolyl groups by electrolytic polymerization, an oxycarbonyl group (—OCO—) serving as a polarizable group, and a chlorosilyl group (SiCl) serving as a functional group which reacts with active hydrogens on the surface of a substrate were diluted with a dehydrated dimethylsilicone-based organic solvent to 1 mass % to prepare a chemisorption solution. Each of the organic molecules is represented by the general formula (20) below:

$$C_4H_4N-(CH_2)_8-OCO-(CH_2)_6-SiCl_3. \quad (20)$$

Figure 10:
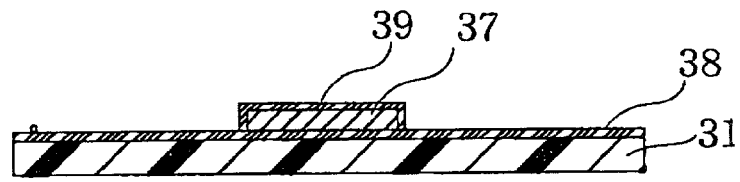
FIG. 10 illustrates a method of producing a three-terminal organic electronic device in accordance with Example 2 by a schematic cross sectional view showing the state after which a third electrode has been formed on a substrate and electrolytic oxidization has been brought about.

Next, as is shown in FIG. 10, an aluminum (Al) film was vapor deposited on the surface of an insulating film-covered substrate (an insulating polyimide substrate may be used) that is a first insulating film (silica film or the like) 38 is formed on the surface of a conductive metal substrate 31. Photolithography and etching were carried out to form a third electrode 37 having a length of 15 μm and a width of 40 μm. Then, the third electrode 37 was electrolytically oxidized to form an insulating alumina ($AL_2O_3$) film 39.

Figure 11:
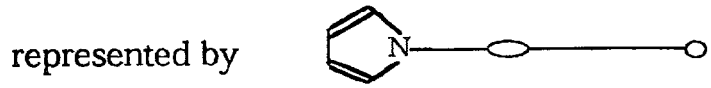
FIG. 11 illustrates a method of producing a three-terminal organic electronic device in accordance to Example 2 by a schematic cross sectional showing, enlarged to the molecular level, the state after which a monomolecular film has been formed.
Figure 11:
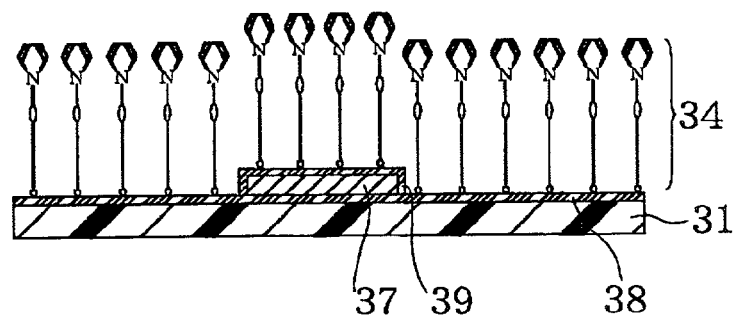

Next, a mask pattern was formed on the surface of the substrate having the third electrode formed thereon using a photoresist such that a portion for forming a monomolecular film was left exposed, and the substrate was immersed in the chemisorption solution to bring about selective chemisorption in the mask pattern openings. Then, unreacted organic molecules remaining on the surface were removed by washing with chloroform and the photoresist mask pattern was removed. Thus, as is shown in FIG. 11, a monomolecular film 34 comprising the previously described organic molecules was formed on the substrate having the third electrode 37 formed thereon. It is to be noted that at the time of chemisorption many hydroxyl groups containing active hydrogens were present on the silica film 38 or the Al$_2$O$_3$ film 39. Thus the chlorosilyl groups (—SiCl) in the organic molecules underwent a dehydrochlorination reaction to form a monomolecular film made up of organic molecules covalently bonded to the surface of the silica film or the like as is shown in the general formula (21) below:

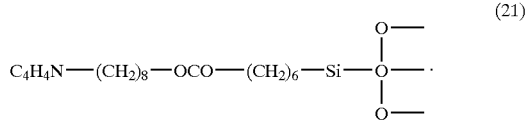

(21)

Next, a nickel thin film was formed on the whole surface by vapor deposition, and photolithography and etching were carried out to form a first electrode and a second electrode with the third electrode sandwiched therebetween, the gap separating the first and second electrodes being 10 $\mu$m and the length of each electrode being 30 $\mu$m. Then, the substrate with the electrodes formed thereon was immersed in an acetonitrile solution and an electric field of approximately 5 V/cm was applied between the first electrode and the second electrode to form a conductive network by electrolytic polymerization so that the first electrode and the second electrode were connected. During this process, because conjugated bonds form along the direction of the electric field in a self-organized manner, the first electrode and the second electrode become electrically connected by the conductive network 35 as long as the polymerization is completed.

Next, the surface of the conductive organic thin film was doped with BF$^-$ ions, and the third electrode was accessed from the substrate side. Thus, a three-terminal organic electronic device provided with a first electrode, a second electrode, a conductive organic thin film electrically connecting these two electrodes, and a third electrode was produced.

Figure 12:
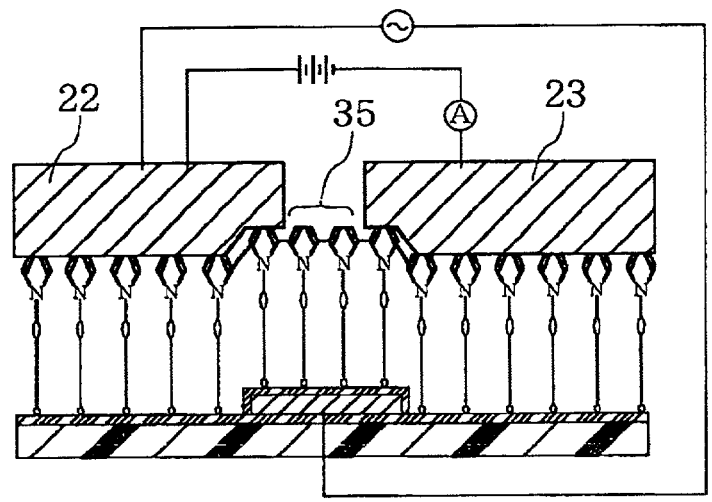
FIG. 12 is a schematic cross sectional view illustrating switching, by use of an electric field, of a three-terminal organic electronic device in accordance with Example 2.
Figure 13:
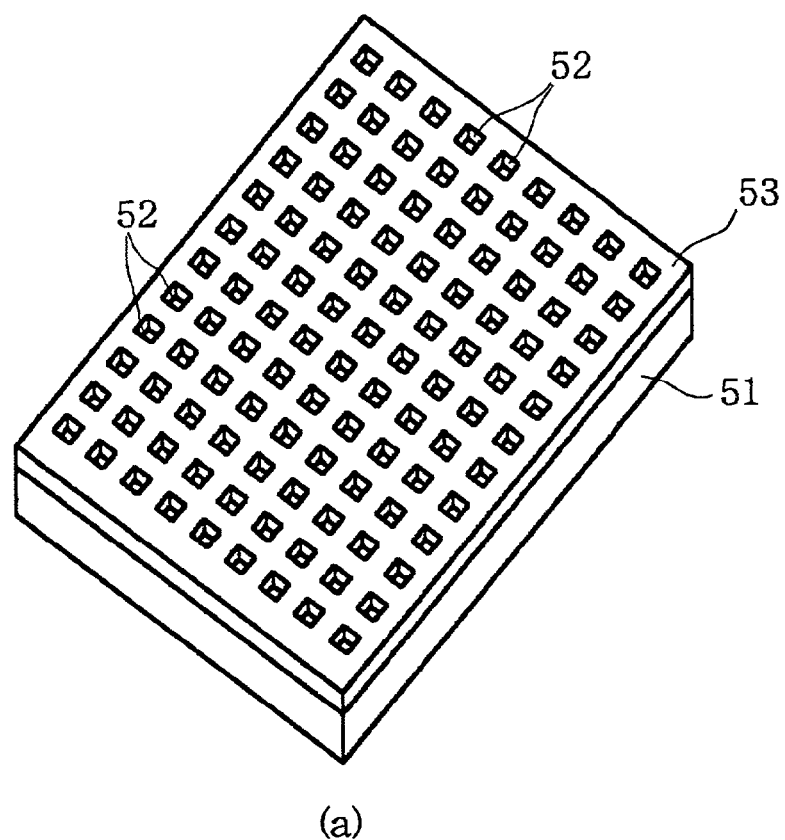
FIG. 13 schematically illustrates a method of producing (step of preliminarily treating a substrate) a two-terminal organic electronic device in accordance with Example 5; (a) is a perspective view showing the state after which the resist pattern has been formed, and (b) is an enlarged partial cross sectional view of (a)
Figure 13:
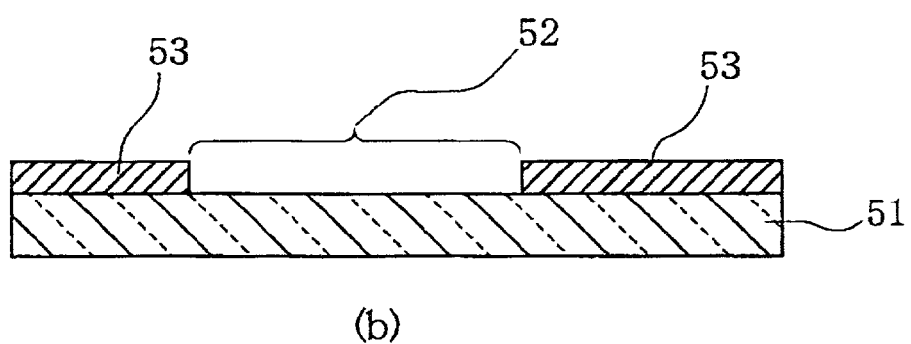

In this three-terminal organic electronic device, because a first electrode 22 and a second electrode 23 are connected by a polypyrrole-based conductive network 35 as shown in FIG. 12, approximately 0.5 A of current flowed between the electrodes when 1 V of voltage was applied between the first electrode 22 and the second electrode 23.

While 1 V of voltage was applied between the first electrode 22 and the second electrode 23, a voltage of 5 V was applied between the first electrode 22 and the third electrode 37 and the current value between the first electrode 22 and the second electrode 23 became approximately 0 A. When the voltage of 5 V between the first electrode 22 and the third electrode 37 was decreased to 0 V, the original conductivity was recovered.

This kind of deterioration in conductivity is thought to occur because the polarization of the oxycarbonyl groups (—OCO—), which serve as polar groups, increases when 5 V of voltage are applied between the third electrode 37 and the first electrode 22, and consequently, the polypyrrole-based conjugated system is distorted, resulting in deterioration in the conductivity of the conductive network 35.

Thus, by the applying of a voltage between the first electrode 22 and the third electrode 37, the conductivity of the conductive network is controlled and the switching of current passing through the first electrode 22 and the second electrode 23 is achieved.

In the above, by using a polarizable oxycarbonyl group for the polar group, switching can be carried out at a very high speed.

Supplementary Remarks

In addition to molecules having an oxycarbonyl functional group, molecules having a functional group such as a carbonyl group may be used.

For the conductive network, a polyacetylene-based, polydiacetylene-based, polyacene-based, polypyrrole-based, or a polythiophene-based conjugated system may be used to achieve a high conductivity.

For the polymerizable group that forms conjugated bonds with other polymerizable groups to form the conductive network, in addition to a pyrrolyl group, which is an electrolytically polymerizable group, a thienyl group (C$_4$H$_3$S—) may be used. If the method of polymerization were changed, substances having acetylene groups or diacetylene groups may be used.

In the fabrication of the monomolecular film or the monomolecular built-up film, in addition to chemisorption, the Langmuir-Blodgett technique may be used.

If the step of forming a first electrode and a second electrode is carried out before the step of forming an organic thin film, the first electrode and the second electrode may be used for electrolytic polymerization in the fabrication of the conductive network. In other words, a voltage may be applied between the first electrode and the second electrode of the organic thin film comprising an organic molecular group comprising organic molecules each having a pyrrolyl group or a thienyl group serving as the electrolytically polymerizable group to selectively, electrolytically polymerize the organic thin film between the first electrode and the second electrode.

After forming on the substrate, the third electrode, the monomolecular film comprising an organic molecular group comprising organic molecules each having a pyrrolyl group or a thienyl group, the first electrode, and the second electrode, a coating film may be formed on the surface of the monomolecular film at the same time a polypyrrole-based or polythiophene-based conductive network is formed in both the monomolecular film and the coating film. This may be achieved by immersing the substrate with the electrodes and film formed thereon in an organic solvent in which a substance containing pyrrolyl groups or thienyl groups has been dissolved, applying a first voltage between the first electrode and the second electrode, and applying a second voltage between the first electrode or the second electrode and an external electrode contacted with the organic solvent and disposed above the monomolecular film. In this case, the organic electronic device is provided with a conductive organic thin film comprising a monomolecular film portion and a polymer film-like coating film portion each having a conductive network.

Alternatively, after forming on the substrate, the third electrode, the monomolecular film comprising an organic molecular group comprising organic molecules each having a pyrrolyl group or a thienyl group, the first electrode, and the second electrode on the substrate and forming a conductive network having a polypyrrole-based or polythiophene-based first structure in the monomolecular film, a coating film may be formed on the surface of the monomolecular film having a conductive network at the same time a conductive network having a polypyrrole-based or polythiophene-based second structure is formed in the coating film. This may be achieved by immersing the substrate with the film and the electrodes formed thereon in an organic solvent in which a substance having pyrrolyl groups or thienyl groups has been dissolved therein, applying a first voltage between the first electrode and the second electrode, and applying a second voltage between a first electrode or a second voltage and an external electrode contacted with the organic solvent and disposed above the monomolecular film. In this case, the organic electronic device is provided with a conductive organic thin film comprising a monomolecular film portion and a polymer film coating film portion each having conductive networks.

In addition to electrolytic polymerization for the formation of the conductive network, the molecules of a monomolecular film or a monomolecular built-up film each having a pyrrolyl group, a thienyl group, an acetylene group, a diacetylene group, or the like, which is a catalytically polymerizable group serving as the polymerizable group, may be catalytically polymerized to form a conductive network.

The monomolecular film or the monomolecular built-up film, the films comprising an organic molecular group comprising organic molecules each having a group polymerizable by beam irradiation such as an acetylene group, a diacetylene group, or the like serving as the polymerizable group, may be been irradiated with an energy beam such as ultraviolet rays, far-ultraviolet rays, electron rays, X-rays or the like to polymerize the organic molecules and form a conductive network.

It is to be noted that while in Example 2 the organic molecule represented by the general formula (20) was used, organic molecules represented by the general formulas (7) to (10) can also be suitably used.

The organic electronic devices described in Examples 1 and 2 may be used in various types of electronic apparatuses. Below, cases in which a three-terminal organic electronic device (one like that of Example 2) is used as the switching device in a display device are described according to the following Examples.

Example 3

First, a plurality of three-terminal organic electronic devices each produced according to the method described in Example 2 and serving as operating switches for liquid crystal were aligned and disposed on an acrylic substrate surface to fabricate a TFT array substrate. An orientation film was fabricated on the surface of the TFT array substrate.

Next, a seal adhesive was formed in a pattern by screen printing except on the portion for the filling port. The seal adhesive was then precured and a color filter substrate was arranged to face the orientation film surface. The color filter substrate and the TFT array substrate were then fixed together, pressure was applied, and the adhesive was cured. Thus, a liquid crystal cell was fabricated.

Finally, the liquid crystal cell was vacuum filled with a specified liquid crystal, and thus a liquid crystal display device was produced.

In this method, because heating of the substrate was not necessary in the production of the TFT array, a sufficiently high-definition TFT liquid crystal display device could be produced even though a substrate having a low glass transition (Tg) point such as an acrylic substrate was used.

Example 4

First, a plurality of three-terminal organic electronic devices each produced according to the method described in Example 2 and serving as operating switches were aligned and disposed on an acrylic substrate surface to fabricate a TFT array substrate. Pixel electrodes connected to the three-terminal organic electric devices were then formed according to a known method, a light-emitting layer comprising a fluorescent material that emits light with the application of an electric field was formed on the TFT array substrate, and a transparent electrode was formed on the light-emitting layer such that it opposed the TFT array substrate. Thus, an EL color display device was produced.

When the light-emitting layer was formed, three kinds of devices for emitting red, blue, and green light were formed at specified locations to produce an EL color display device.

Example 5

Example 5 is explained with reference to FIGS. 13 to 19. FIGS. 13 to 18 schematically illustrate each step of a method of producing a two-terminal organic electronic device that uses a substrate on a surface of which active hydrogens are not exposed. FIG. 19 is a schematic cross sectional view illustrating a device that is in the process of switching.

First, as is shown in FIGS. 13(a) and (b), an acrylic resin transparent substrate (having a density of exposed active hydrogens of approximately zero) 51 was prepared, the acrylic resin transparent substrate being a surface insulating substrate not having active hydrogens exposed on a surface. A resist pattern 53 was then formed by applying a photoresist to the surface of the substrate 51 and exposing the photoresist such that apertures 52 (aperture area: 600 $\mu$m$^2$ per aperture) were arranged so as to be spaced from one another in the vertical and horizontal directions.

Figure 14:
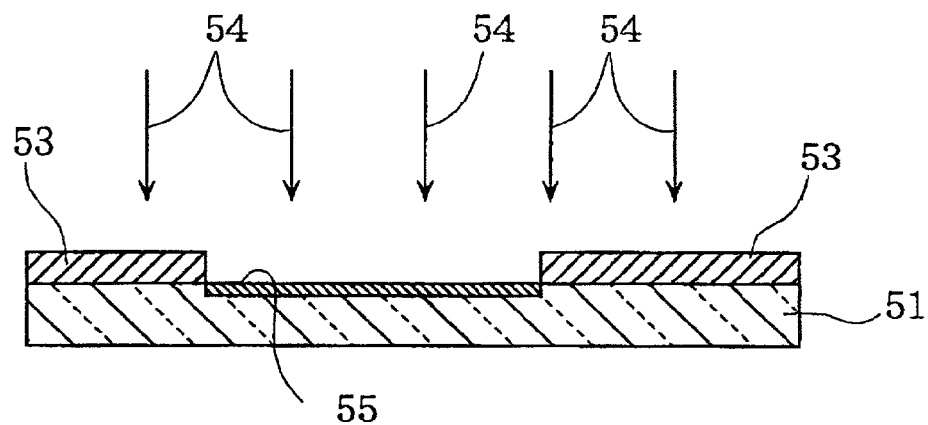
FIG. 14 is a schematic cross sectional view illustrating a method of producing (step of preliminarily treating a substrate) a two-terminal organic electronic device in accordance with Example 5 and showing the state after which an active hydrogen exposure treatment has been carried out.
Figure 15:
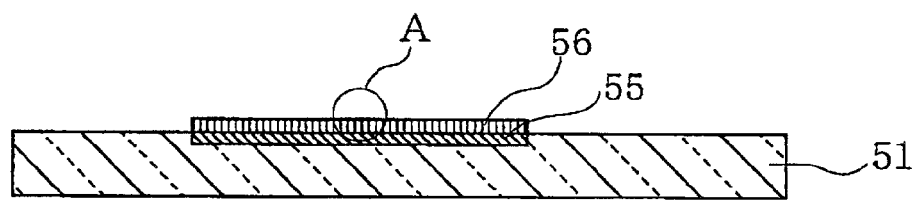
FIG. 15 is a schematic cross sectional view illustrating a method of producing (step of preliminarily treating a substrate) a two-terminal organic electronic device in accordance with Example 5.

Next, as is shown in FIG. 14, excimer UV light irradiation (KrF excimer laser) 54 was carried out on the substrate 51 under a humidity of 50%, the formation of the resist pattern 53 on the substrate 51 having been completed. As a result, the oxygen in the air became ozone, and the surface of the substrate that was exposed through the apertures 52 was very lightly oxidized. At the same time, this surface also reacted with water in the air to form a region 55 in which numerous hydroxyl groups (—OH) were exposed on the surface. The resist pattern 53 was then removed.

Meanwhile, organic molecules each having an acetylene group (—C≡C—) which, through polymerization forms conjugated bonds with other acetylene groups to form a conductive network, an azo group (—N=N—) serving as a photoisomerizable group, and a chlorosilyl group (—SiCl) serving as a functional group which reacts with active hydrogens on a substrate surface were diluted with a dehydrated dimethylsilicone-based organic solvent to 1 mass % to prepare a chemisorption solution. Each of the organic molecules is represented by the general formula (22) below:

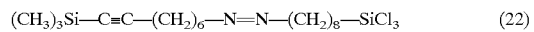

(CH$_3$)$_3$Si—C≡C—(CH$_2$)$_6$—N=N—(CH$_2$)$_8$—SiCl$_3$ (22)

Figure 16:
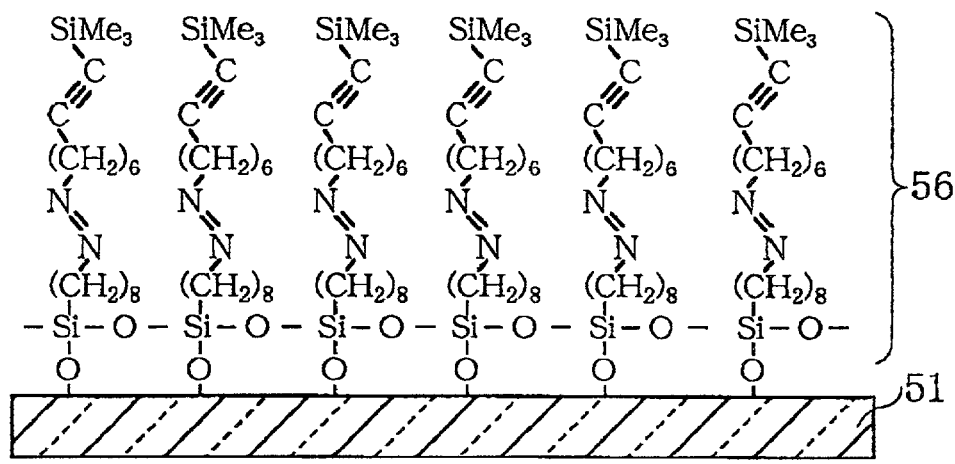
FIG. 16 is a schematic cross sectional view of portion A of FIG. 15 enlarged to the molecular level.

Next, the substrate 51 having the region 55 formed thereon was immersed in the chemisorption solution prepared as described above, a dehydrochlorination reaction was induced with the hydroxyl groups (active hydrogen) in the region 55, and the substrate was washed with ethanol. Thus, a monomolecular film 56 was formed on the surface of the substrate 51 (See FIG. 15). This monomolecular film 56, as is shown in FIG. 16, is fixed to the surface of the substrate 51 by covalent bonds.

Figure 17:
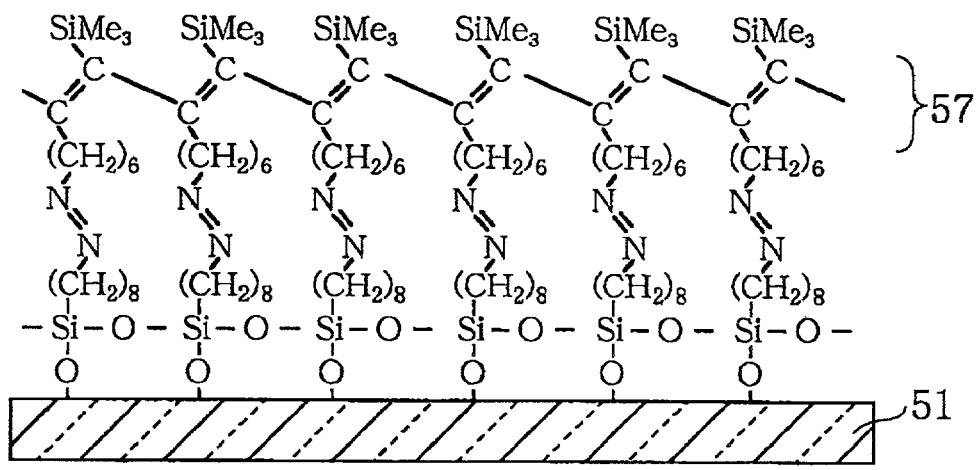
FIG. 17 is a cross sectional view schematically showing the state after which a conductive network has been formed.

The acetylene groups in the monomolecular film 56 were then polymerized using a Ziegler-Natta catalyst in a freon solvent to form a polyacetylene-based conductive network 57 as is shown in FIG. 17.

Figure 18:
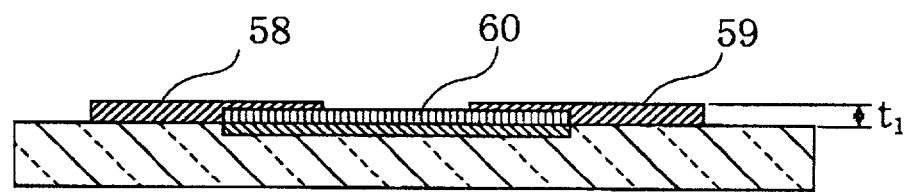
FIG. 18 is a schematic cross sectional view illustrating a method of producing (step of forming a first electrode and a second electrode) a two-terminal organic electronic device in accordance with Example 5.
Figure 19:
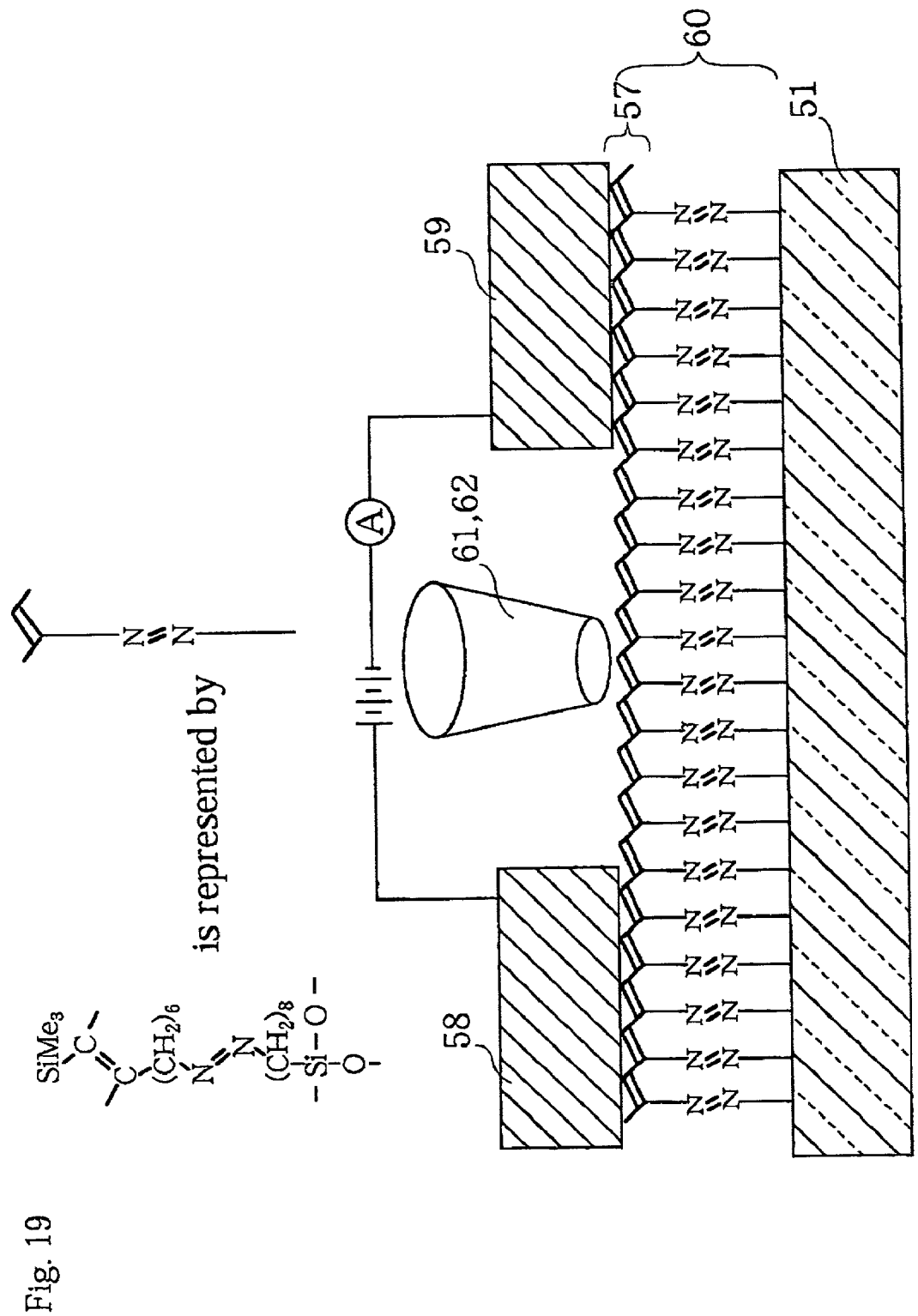
FIG. 19 is a schematic cross sectional view illustrating the switching by light of a device produced according to the method of producing a two-terminal organic electronic device in accordance to Example 5.

Finally, as is shown in FIG. 18, a nickel thin film was vapor deposited on the whole surface of the substrate 51, and a first electrode 58 and a second electrode 59, the gap between the electrodes being 10 μm and each electrode having a length of 30 μm and a thickness $t_1$ of 0.1 μm, were formed by photolithography and etching. In this way, a two-terminal organic electronic device is produced which comprises a first electrode 58, a second electrode 59, and a conductive organic thin film 60 electrically connecting both electrodes, the conductive organic thin film 60 having been formed to the micron pattern level.

When a device obtained in this way was tested by applying a voltage of several V between the first electrode 58 and the second electrode 59, as is shown in FIG. 19, several amperes of current (approximately 2 nA per 1 V) flowed between the electrodes because the electrodes are connected by a polyacetylene-based conductive network 57. More specifically, before the device was tested, visible rays 62 were applied to the conductive organic thin film 60, and thus, the azo groups were in the trans configuration. Ultraviolet rays 61 were subsequently applied to the conductive organic thin film 60, and consequently, the azo groups changed from trans configuration to cis configuration and the current value became approximately 0 A. Finally, when the visible rays 62 were applied again, the azo groups changed from cis configuration back to trans configuration, and the original conductivity was recovered.

The phenomenon described above is thought to occur for the following reasons. The decline in conductivity is thought to be due to distortion in the molecular alignment of the conductive organic thin film and the decline in the conjugation of the polyacetylene-based conjugated bonds caused by the photoisomerization of the azo groups (change from trans configuration to cis configuration). The recovery of the conductivity is thought to be due to the return of the azo groups to trans configuration, recovery from the distortion of molecular alignment in the conductive organic thin film, and restoration of the original conjugation.

Thus, with the two-terminal organic electronic device of Example 5, by applying two types of light having differing wavelengths, the conjugation of the conjugated bonds in the film was controlled, and the switching of current flowing between the electrodes was achieved. In addition, the conductive organic thin film was formed with high precision.

Supplementary Remarks

In Example 5, organic molecules as represented by the general formula (22) were used, but it is also suitable to use organic molecules represented by the general formulas (2) to (5).

In the formation of the conductive network, a catalytic-polymerization method was employed, but the present device is not limited to this method. It has been confirmed that the conductive network can also be formed by electrolytic-polymerization methods and polymerization methods in which an energy beam of ultraviolet rays, far-ultraviolet rays, electron rays, X-rays, or the like is applied.

For the conductive network, in addition to the polyacetylene-based conjugated system, it has been confirmed that polydiacetylene-based, polyacene-based, polypyrrole-based, or polythiophene-based conjugated systems may be used. In the case of a catalytic-polymerization method, in addition to the acetylene group as the polymerizable group, it has been confirmed that a pyrrolyl group, a thienyl group, or a diacetylene group is suitable. In the case of an electrolytic-polymerization method, it has been confirmed that a pyrrolyl group or a thienyl group is suitable. In the case of a polymerization method brought about by energy beam irradiation, it has been confirmed that an acetylene group or a diacetylene group is suitable.

In Example 5, a polyacetylene-based conjugated system was used for the conductive network. However, because electric resistance tends to increase when the degree of polymerization of the acetylene groups is low, it is possible to use a dopant having functional groups with charge mobility (for example, a halogen gas or a Lewis acid as the acceptor molecules and an alkali metal or a ammonium salt as the donor molecules) in order to increase the ON current. In the case in which the conductive organic thin film is doped with iodine, it has been confirmed that 0.2 mA of current flow when 1V of voltage is applied.

When a greater ON current is required in the device construction of Example 5, it is preferable to shorten the distance between the electrodes or to increase the widths of the electrodes. When an even greater ON current is required, it is preferable to build up the monomolecular film so that the conductive organic thin film is in the form of a monomolecular built-up film.

In the fabrication of either a monomolecular film or a monomolecular built-up film, it has been confirmed that, in addition to a chemisorption method, the Langmuir-Blodgett method may be employed.

In cases in which the first electrode and the second electrode are formed before the conductive network, it is possible to use both electrodes for an electrolytic polymerization method in the formation of the conductive network. When the organic molecules used for the formation of the conductive organic thin film have a pyrrolyl group or a thienyl group for the electrolytically polymerizable group, it has been confirmed that the electrolytically polymerizable group polymerizes with other electrolytically polymerizable groups to form the conductive network when a voltage is applied between the electrodes, the voltage being applied after a monomolecular film or a monomolecular built-up film comprising these molecules is formed and the first electrode and second electrode are formed.

It is possible to use the first electrode, the second electrode, and an external electrode to form the conductive organic thin film in the form of a monomolecular built-up film. In this case, a monomolecular film having pyrrolyl groups or thienyl groups, the first electrode, and the second electrode are formed on the substrate, and the substrate having the monomolecular film and the electrodes formed thereon is immersed in an organic solvent in which organic molecules having pyrrolyl groups or thienyl groups and photoisomerizable groups are dissolved. A first voltage is then applied between the first electrode and the second electrode, and a second voltage between the first electrode or the second electrode and an external electrode contacted with the organic solvent and disposed above the monomolecular film. By this method, it has been confirmed that a coating film is formed on the monomolecular film, and a conductive network is formed in both the monomolecular film and the coating film. Thus, this device has a conductive network having a multilevel construction.

It is also possible to form the first electrode, the second electrode, and a monomolecular film comprising an organic molecular group comprising organic molecules each having a pyrrolyl group or a thienyl group on the substrate and to induce the pyrrolyl groups or the thienyl groups in the monomolecular film to undergo a polymerization reaction to form a conductive organic thin film in the form of a monomolecular layer. The substrate having the conductive organic thin film and the electrodes formed thereon is then immersed in an organic solvent in which organic molecules having pyrrolyl groups or thienyl groups and photoisomerizable groups are dissolved. A first voltage is applied between the first electrode and the second electrode, and a second voltage between the first electrode or the second electrode and an external electrode contacted with the organic solvent and disposed above the conductive organic thin film in the form of a monomolecular layer. By this method, it has been confirmed that a coating film is formed on the conductive organic thin film in the form of a monomolecular layer and a conductive network is formed in the coating film. Thus, this device has a conductive network having a multilevel construction.

Example 6

Example 6 is explained with reference to FIGS. 20 to 24. FIGS. 20 to 23 schematically illustrate each step of a method of producing a three-terminal organic electronic device that uses a substrate on a surface of which active hydrogens are not exposed. FIG. 24 schematically illustrates switching of this device by use of an electric field.

Figure 20:
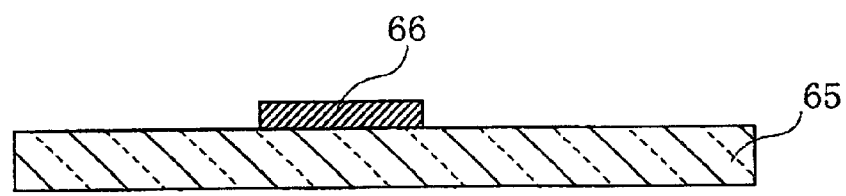
FIG. 20 is a schematic cross sectional view illustrating a method of producing a three-terminal organic electronic device (step of forming a third electrode) in accordance with Example 6.

First, as is shown if FIG. 20, an acrylic resin transparent substrate (having a density of exposed active hydrogens of approximately zero) 65 was prepared, the acrylic resin transparent substrate being a surface insulating substrate not having active hydrogens exposed on a surface. Aluminum (Al) was then vapor deposited on this substrate surface, and using photolithography, a third electrode 66 made of Al and having a length of 15 μm, a width of 40 μm, and a thickness of 0.05 μm was formed by etching.

Figure 21:
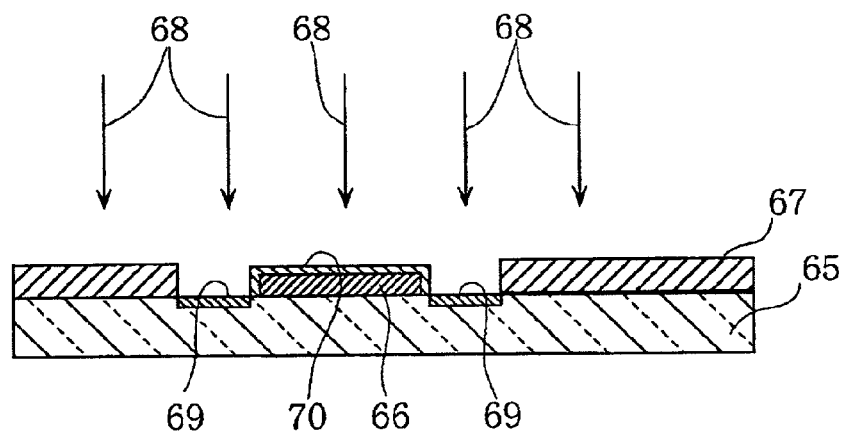
FIG. 21 is a schematic cross sectional view illustrating a method of producing a three-terminal organic electronic device (step of preliminarily treating a substrate) in accordance with Example 6.
Figure 22:
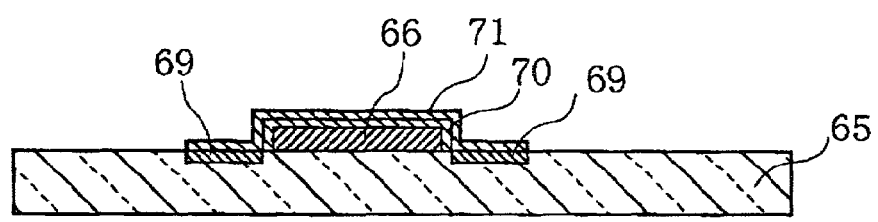
FIG. 22 is a schematic cross sectional view illustrating a method of producing a three-terminal organic electronic device (step of forming a film) in accordance with Example 6.

Next, as is shown in FIG. 21 and in the same manner as Example 5, a resist pattern 67 was formed and excimer UV irradiation (KrF excimer laser) 68 was carried out on the substrate 65 on which the formation of the resist pattern 67 had been completed As a result, the oxygen in the air became ozone, and an oxide coating film 69 and an alumina film 70 were formed on the surface of the substrate that was exposed through the apertures of the pattern 67 and the surface of the third electrode, respectively. At the same time, the oxide coating film 69 and the alumina film 70 also reacted with water in the air to form a region in which numerous hydroxyl groups (—OH) were exposed on the surface. The resist pattern 67 was then removed.

Meanwhile, organic molecules each having a pyrrolyl group (C$_4$H$_4$N—) which, through polymerization forms conjugated bonds with other pyrrolyl groups to form a conductive network, an oxycarbonyl group (—OCO—) serving as a polar group, and a chlorosilyl group (—SiCl) serving as a functional group which reacts with active hydrogens on a substrate surface were diluted with a dehydrated dimethylsilicone-based organic solvent to 1 mass % to prepared a chemisorption solution. Each of the organic molecules is represented by the general formula (23) below:

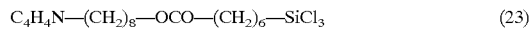

C$_4$H$_4$N—(CH$_2$)$_8$—OCO—(CH$_2$)$_6$—SiCl$_3$ (23)

Next, the substrate 65 having the oxide coating film 69 and the alumina film 70 formed thereon was immersed in the chemisorption solution prepared as described above, a dehydrochlorination reaction was induced with the hydroxyl groups (active hydrogen) in the films 69 and 70, and the substrate was washed with ethanol. Thus, a monomolecular film 71 was formed such that it was fixed to the surface of the substrate by covalent bonds (See FIG. 22).

Figure 23:
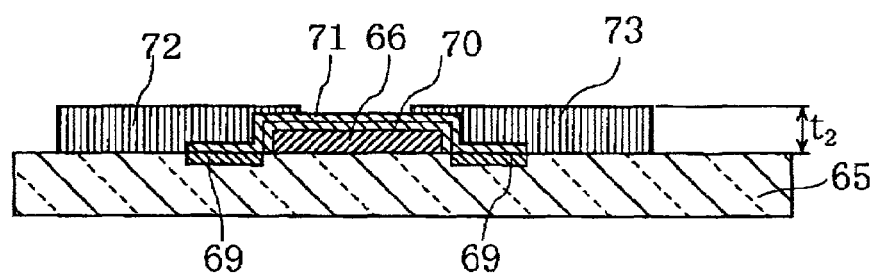
FIG. 23 is a schematic cross sectional view illustrating a method of producing a three-terminal organic electronic device (step of forming a first electrode and a second electrode) in accordance with Example 6.
Figure 24:
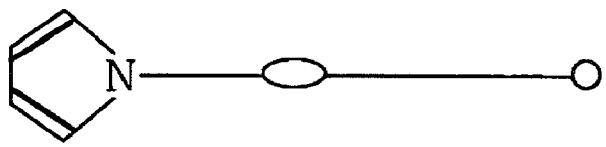
FIG. 24 is a schematic cross sectional view illustrating the switching by an electric field of a device produced according to a method of producing a three-terminal organic electronic device in accordance with Example 6.
Figure 24:
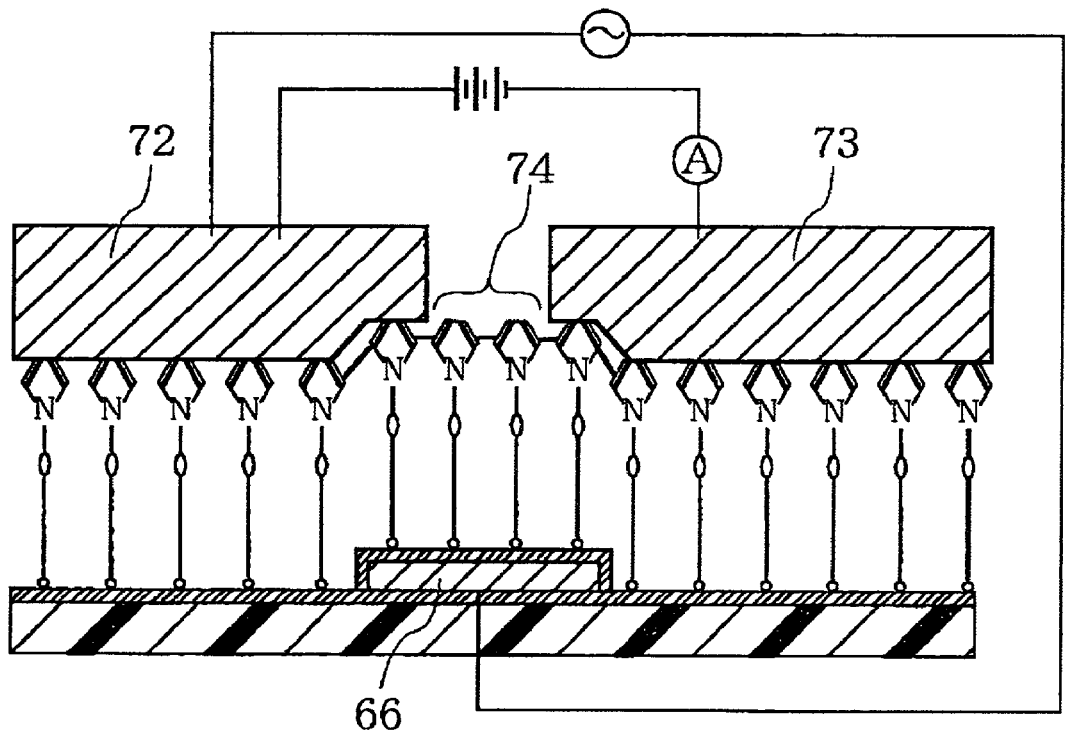

Next, as is shown in FIG. 23, a nickel thin film was vapor deposited on the whole surface of the substrate 65, and a first electrode 72 and a second electrode 73, the gap between the electrodes being 10 μm and each electrode having a length of 30 μm and a thickness $t_1$ of 0.1 μm, were formed by photolithography and etching. An electric field of approximately 5 V/cm was then applied between the first electrode and the second electrode in acetonitrile, and a conductive network electrically connecting the first electrode and the second electrode was formed by electrolytic polymerization. During this process, because conjugated bonds form along the direction of the electric field in a self-organized manner, the first electrode and the second electrode are electrically connected by a conductive network as long as the polymerization is completed.

Finally, the surface of the conductive organic thin film was doped with BF$^-$ ions, and the third electrode was accessed from the substrate side. Thus, a three-terminal organic electronic device provided with a first electrode, a second electrode, a conductive organic thin film having been formed to the micron pattern level and electrically connecting these two electrodes, and a third electrode was produced.

When a device obtained in this way was tested by applying 1 V of voltage between the first electrode 72 and the second electrode 73, as is shown in FIG. 24, approximately 0.5 mA of current flowed between the electrodes because the electrodes are connected by a polypyrrole-based conductive network 74 and the conductive organic thin film is doped with BF$^-$ ions. When a voltage of 5 V was subsequently applied between the first electrode 72 and the third electrode 66, the current between the first electrode 72 and the second electrode 73 became approximately zero amperes. When, the applied voltage of 5 V was changed back to 0 V, the original conductivity was recovered.

The phenomenon described above is thought to occur for the following reasons. The decline in conductivity is thought to be due to distortion in the molecular alignment of the conductive organic thin film and the decline in the conjugation of the polypyrrole-based conjugated bonds caused by the progressing of polarization of the oxycarbonyl groups (—OCO—) that are polar groups when a voltage is applied between the third electrode and the first electrode. The recovery of conductivity is thought to be due to the return to a normal stated of polarization, recovery from the distortion of molecular alignment in the conductive organic thin film and restoration of the original conjugation.

Thus, in the three-terminal organic electronic device of Example 6, by applying voltage between the third electrode and the first electrode, the conjugation of the conjugated bonds in the film was controlled, and the switching of current flowing between the electrodes was achieved. In addition, the conductive organic thin film was formed with high precision.

Supplementary Remarks

In Example 6, organic molecules as represented by the general formula (23) were used, but it is also suitable to use organic molecules represented by the general formulas (7) to (10).

In the formation of a conductive network, an electrolytic-polymerization method was employed, but the present device is not limited to this method. It has been confirmed that the conductive network can also be formed by catalytic-polymerization methods and polymerization methods in which an energy beam of light, electron rays, X-rays, or the like is applied.

For the conductive network, in addition to the polypyrrole-based conjugated system, it has been confirmed that polyacetylene-based, polydiacetylene-based, polyacene-based, or polythiophene-based conjugated systems may be used, and supposing these conjugated systems are used, the conductivity increases. In the case of an electrolytic-polymerization method, in addition to a pyrrolyl group as the polymerizable group, it has been confirmed that a thienyl group is suitable. In the case of a catalytic-polymerization method, in addition to a pyrrolyl group or a thienyl group, it has been confirmed that an acetylene group or diacetylene group is suitable. In the case of a polymerization method brought about by energy beam irradiation, it has been confirmed that an acetylene group or a diacetylene group is suitable.

In Example 6, the substance used for the doping was $BF^-$ ions, but it is possible to use other substances for the dopant. In addition, in cases in which it is not a problem that the ON current be small, there are no disadvantages in not using a dopant. It has been confirmed that in cases in which the conductive organic thin film was not doped with $BF^-$ ions, about 50 nA of current flowed between the electrodes when the applied voltage was 1 V.

When a greater ON current is required in the device construction of Example 6, it is suitable to shorten the distance between the electrodes, to increase the widths of the electrodes, or to build up the monomolecular film so that the conductive organic thin film is in the form of a monomolecular built-up film.

In the fabrication of either a monomolecular film or a monomolecular build-up film, it has been confirmed that, in addition to a chemisorption method, the Langmuir-Blodgett method may be employed.

It is possible to use the first electrode, the second electrode, and an external electrode to form a conductive organic thin film in the form of a monomolecular built-up film. In this case, the third electrode, a monomolecular film having pyrrolyl groups or thienyl groups, the first electrode and the second electrode are formed on the substrate, and the substrate having the electrodes and the film formed thereon is immersed in an organic solvent in which organic molecules having pyrrolyl groups or thienyl groups and polar groups are dissolved. A first voltage is then applied between the first electrode and the second electrode, and a second voltage between the first electrode or the second electrode and an external electrode contacted with the organic solvent and disposed above the monomolecular film. By this method, it has been confirmed that a coating film is formed on the monomolecular film, and a conductive network is formed in both the monomolecular film and the coating film. Thus, this device has a conductive network having a multilevel construction.

It is also possible to form the third electrode, a monomolecular film comprising an organic molecular group comprising organic molecules each having a pyrrolyl group or a thienyl group, the first electrode, and the second electrode on the substrate, and to induce the pyrrolyl groups or thienyl groups in the monomolecular film to undergo a polymerization reaction to form a conductive organic thin film in the form of a monomolecular layer. The substrate having the conductive organic thin film and the electrodes formed thereon is then immersed in an organic solvent in which organic molecules having pyrrolyl groups or thienyl groups and polar groups are dissolved. A first voltage is applied between the first electrode and the second electrode, and a second voltage between the first electrode or the second voltage and an external electrode contacted with the organic solvent and disposed above the conductive organic thin film in the form of a monomolecular layer. By this method, it has been confirmed that a coating film is formed on the conductive organic thin film in the form of a monomolecular layer and a conductive network is formed in the coating film. Thus, this device has a conductive network having a multilevel construction.

Additional Supplementary Remarks for Examples 5 and 6

In Examples 5 and 6 an acrylic resin transparent substrate was used for the surface insulating substrate not having active hydrogens exposed on a surface, but the substrate is not limited to this. For example, a single layer substrate comprising a synthetic resin such polycarbonate resin, polyethersulfone resin, or the like, a layered substrate that is a synthetic resin coating film formed on a surface of a metal substrate, or the like may be used. It has been confirmed that when a layered film that is an insulating film not having active hydrogens exposed on a surface formed on a surface of a conductive substrate such as a metal substrate, the substrate itself is not charged, and thus, stable operation of the device is improved.

In addition, in Examples 5 and 6, excimer UV light irradiation was employed for the active hydrogen exposure treatment, but the treatment is not limited to this. It has been confirmed that it is possible to use ultraviolet irradiation, plasma treatment, or corona treatment. In other words, it has been confirmed that the active hydrogen exposure treatment can be carried out with conventional excimer UV irradiation, UV ozone treatment, plasma oxidation, and corona treatment apparatuses.

In both Examples 5 and 6, the monomolecular film was formed after the resist pattern was removed, but it has been confirmed that film forming may be carried out before the resist pattern is removed.

In the step of forming a film described above, it has been confirmed that by using a chemisorption solution wherein a silane-based chemisorbable substance is dissolved in a nonaqueous organic solvent, film forming can be carried out efficiently and also cleanly. By washing the acrylic resin transparent substrate with a non-damaging nonaqueous organic solvent, it has been confirmed that the film forming can be carried out even more cleanly.

Example 7

Figure 25:
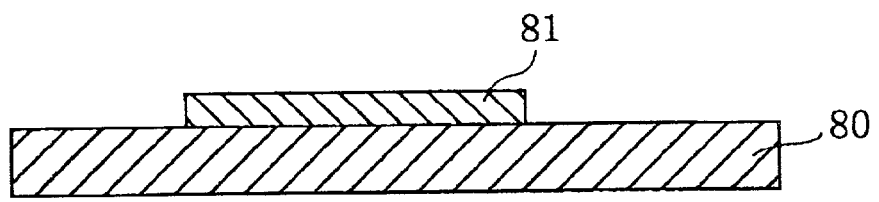
FIG. 25 is a schematic cross sectional view illustrating a method of producing (step of preliminarily treating a substrate) a two-terminal organic electronic device in accordance with Example 7; (a) shows the state after which a resist pattern has been formed, and (b) shows the state after which the resist pattern has been removed by an active hydrogen removing treatment.
Figure 25:
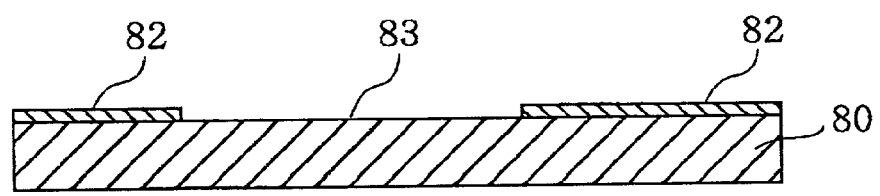
Figure 26:
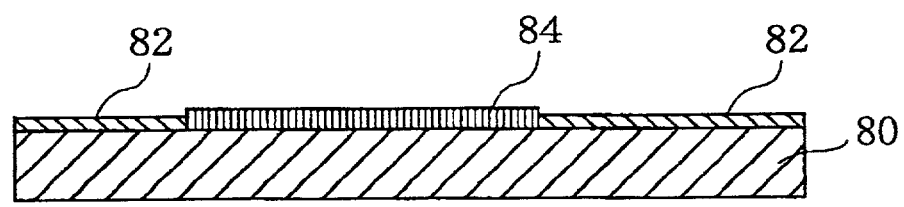
FIG. 26 is a schematic cross sectional view illustrating a method of producing (step of forming a film) a two-terminal organic electronic device in accordance with Example 7.

Example 7 is explained with reference to FIGS. 25 to 27. FIG. 25 schematically illustrates each step of a method of producing a two-terminal organic electronic device that uses a substrate on a surface of which active hydrogens are exposed.

First, as is shown in FIG. 25(a), a transparent glass substrate 80 was prepared, the transparent glass substrate 80 being a surface insulating substrate on a surface of which active hydrogens are exposed. A photoresist was then applied to the surface of the substrate 80 and the photoresist was exposed to form a resist pattern 81 wherein resist portions are arranged so as to be spaced from one another in the vertical and horizontal directions.

Next, as is shown in FIG. 25(b), the substrate 80 on which pattern 81 had been formed was immersed in a chemisorption solution to remove exposed active hydrogens from the surface of the substrate, the chemisorption solution being such that methyltrichlorosilane ($CH_3SiCl_3$), a chemisorbable substance for active hydrogen removal, was dissolved in a dehydrated dimethylsilicone-based organic solvent. The surface was then washed with ethanol, and a monomolecular film 82 comprising methyltrichlorosilane was formed. By subsequently removing the resist pattern 81, a substrate was fabricated wherein specified portions of the surface of the substrate made up a region 83 in which numerous hydroxyl groups were exposed. The density of exposed active hydrogens on the surface of the monomolecular film 82 was substantially zero.

Figure 27:
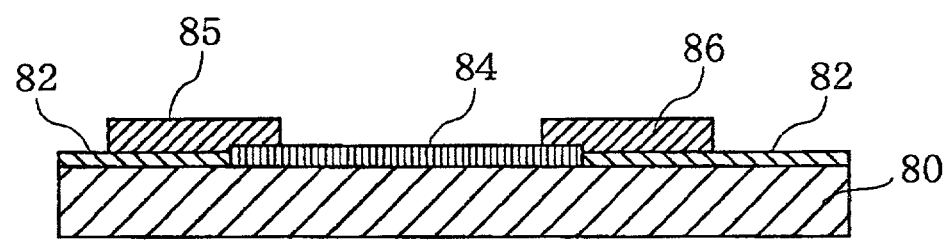
FIG. 27 is a schematic cross sectional view illustrating a method of producing (step of forming a first electrode and a second electrode) a two-terminal organic electronic device in accordance with Example 7.

Using the substrate fabricated in the manner described above, in the same manner as Example 5, a monomolecular film 84 comprising organic molecules as represented by the general formula (22) was formed (see FIG. 26), and a first electrode 85 and a second electrode 86 were formed (see FIG. 27). The polymerizable groups in the monomolecular film 84 were then polymerized to form a conductive organic thin film having a conductive network so that the electrodes were electrically connected. Thus, a two-terminal organic electronic device was produced.

When a device obtained in this way was tested by applying a voltage of several V between the first electrode and the second electrode in the same manner as Example 1, several nanoamperes of current (approximately 2 nA per 1 V) flowed between the electrodes (see FIG. 19). More specifically, before the device was tested, visible rays 62 were applied to the conductive organic thin film, and thus, the azo groups were in the trans configuration. Ultraviolet rays 61 were subsequently applied to the conductive organic thin film, and consequently, the azo groups changed from trans configuration to cis configuration and the current value became approximately 0 A. Finally, when the visible rays 62 were applied again, the azo groups changed from cis configuration back to trans configuration, and the original conductivity was recovered.

Thus, with the two-terminal organic electronic device of Example 7, by applying two types of light having differing wavelengths, the conjugation of the conjugated bonds in the film was controlled, and the switching of current flowing between the electrodes was achieved. In addition, the conductive organic thin film was formed with high precision.

Example 8

Example 4 is described with reference to FIGS. 28 to 31. FIGS. 28 to 31 schematically illustrate each step of a method of producing a three-terminal organic electronic device that uses a substrate on a surface of which active hydrogens are exposed.

Figure 28:
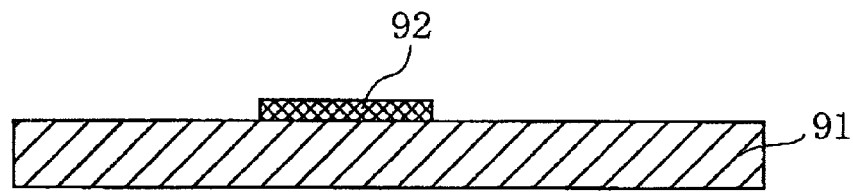
FIG. 28 is a schematic cross sectional view illustrating a method of producing (a step of forming a third electrode) a three-terminal organic electronic device in accordance with Example 8.
Figure 29:
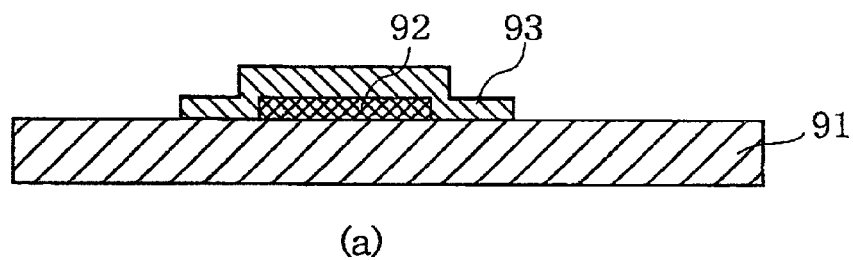
FIG. 29 is a schematic cross sectional view illustrating a method of producing (step of preliminarily treating a substrate) a three-terminal organic electronic device in accordance with Example 8; (a) shows the state after which a resist pattern has been formed, and (b) shows the state after which the resist pattern has been removed by an active hydrogen removing treatment.
Figure 29:
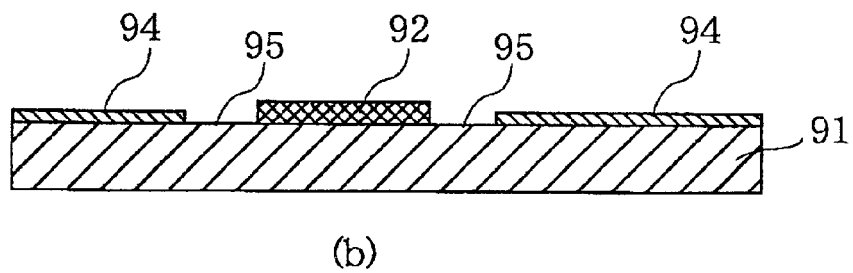
Figure 30:
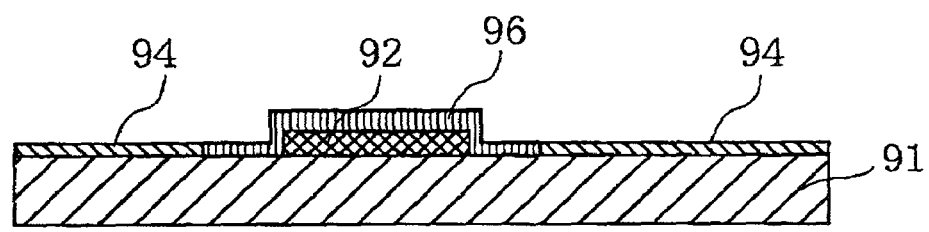
FIG. 30 is a schematic cross sectional view illustrating a method of producing (step of forming a film) a three-terminal organic electronic device in accordance with Example 8.

First, as is shown in FIG. 28, a transparent glass substrate 91 was prepared, the transparent glass substrate 91 being a surface insulating substrate on a surface of which active hydrogens are exposed. Aluminum (Al) was then vapor deposited on this substrate surface, and using photolithography, a third electrode 92 made of Al and having a length of 15 $\mu$m, a width of 40 $\mu$m, and a thickness of 0.05 $\mu$m was formed by etching. The third electrode 92 was then put aside in air for some time such that a surface of the third electrode 92 was naturally oxidized.

Next, as is shown in FIG. 29(a), a resist was applied to the surface of the substrate 91 so that all of the third electrode 92 was covered, and the resist was exposed to form a resist pattern 93 wherein resist portions are arranged so as to be spaced from one another in the vertical and horizontal directions.

Next, as is shown in FIG. 29(b), the substrate 91 on which the pattern 93 had been formed was immersed in a chemisorption solution to remove exposed active hydrogens from the surface of the substrate, the chemisorption solution being such that methyltrichlorosilane ($CH_3SiCl_3$), a chemisorbable substance for active hydrogen removal, was dissolved in a dehydrated dimethylsilicone-based organic solvent. The surface was then washed with ethanol, and a monomolecular film 94 comprising methyltrichlorosilane was formed. By subsequently removing the resist pattern 93, a substrate was fabricated wherein specified portions of the surface of the substrate made up a region 95 in which numerous hydroxyl groups were exposed. It is to be noted that a natural oxide film was formed on the surface of the third electrode 92 and the active hydrogens were in an exposed state. In addition, the density of exposed active hydrogens on the surface of the monomolecular film 94 was substantially zero.

Figure 31:
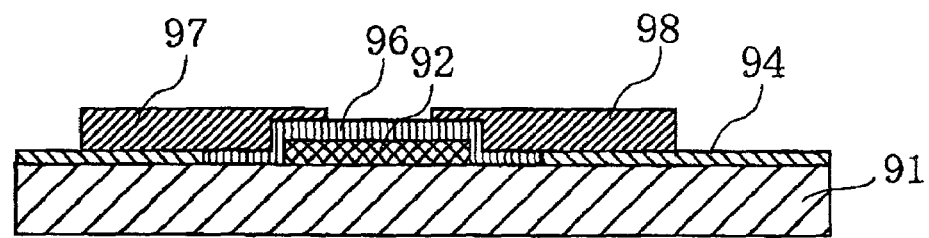
FIG. 31 is a schematic cross sectional view illustrating a method of producing (step of forming a first electrode and a second electrode) a three-terminal organic electronic device in accordance with Example 8.

Using this substrate, in the same manner as Example 6, a monomolecular film 96 comprising organic molecules as represented by the general formula (23) was formed (see FIG. 30), and a first electrode 97 and a second electrode 98 were formed (see FIG. 31). The polymerizable groups in the monomolecular film 96 were then polymerized to form a conductive organic thin film having a conductive network and this surface was doped with $BF^-$ so that the electrodes were electrically connected. Thus, a three-terminal organic electronic device was produced.

When a device obtained in this way was tested by applying a voltage of 1 V between the first electrode and the second electrode in the same manner as Example 6, a current of approximately 0.5 mA flowed between the electrodes because the electrodes were connected by a polypyrrole-based conductive network and the conductive organic thin film was doped with $BF^-$ ions (see FIG. 24). When a voltage of 5 V was subsequently applied between the first electrode and the third electrode, the current between the first electrode and the second electrode became approximately zero amperes. When, the applied voltage of 5 V was changed back to 0 V, the original conductivity was recovered. Thus, with the three-terminal organic electronic device of Example 8, by applying a voltage to the third electrode, the conjugation of the conjugated bonds in the film was controlled, and the switching of current flowing between the first electrode and the second electrode was achieved. In addition, the conductive organic thin film was formed with high precision.

Supplementary Remarks for Examples 7 and 8

In Examples 7 and 8, a transparent glass substrate was used for the surface insulating substrate on a surface of which active hydrogens were exposed, but the substrate is not limited to this. It is possible to use a single layer substrate that is insulating and has an oxidized surface, a layered substrate that is an insulating film having an oxidized surface formed on a surface of an arbitrary substrate, or the like. When using a layered substrate that is an insulating film having active hydrogens on a surface thereof formed on a conductive substrate such as a metal substrate, because the substrate itself is not charged, stable operation of the device is improved.

In Examples 7 and 8, a method using methyltrichlorosilane was employed as the active hydrogen removing treatment, but even if other chemisorbable substances (for example, the organic molecules represented by the general formulas (12) to (17)) are used, the active hydrogens can be removed.

Because the devices of Examples 7 and 8 are essentially the same as those of Examples 5 and 6, respectively, except for the use of a different substrate, almost the same can be said about other matters such as the use of a dopant. Thus, explanation has been omitted.

The organic electronic devices described in Examples 5 to 8 may be used in various types of electronic apparatuses. Below, cases in which three-terminal organic electronic devices (those of Example 6 and 8) are used as the switching devices in display devices are described according to the following Examples.

Example 9

First, a plurality of organic electronic devices each produced according to the method described in Example 6 and serving as the operating switches for liquid crystal were aligned and disposed on an acrylic substrate surface and an orientation film was formed thereon to fabricate a TFT array substrate. Meanwhile, by a known method, a plurality of color elements were aligned and disposed on a substrate surface in a matrix and an orientation film was fabricated thereon to form a color filter substrate. Next, screen printing was used to form seal adhesive in a pattern on the orientation film surface of the TFT array substrate, leaving aside the portion for the liquid crystal filling port. The seal adhesive was then precured, the TFT array substrate was arranged to face the orientation film surface of the color filter substrate, the substrates were fixed together, pressure was applied, and the adhesive was cured. Thus, a liquid crystal cell was fabricated. Finally, the liquid crystal cell was vacuum filled with a specified liquid crystal, and thus a liquid crystal display device was produced.

In the production of the TFT array substrate of the liquid crystal display device obtained in the manner described above, heating of the substrate was not necessary, and therefore, a sufficiently high-definition TFT liquid crystal display device could be produced even though a substrate having a low glass transition (Tg) such as an acrylic substrate was used.

It is to be noted that a liquid crystal display device like that of Example 9 could be produced when using the three-terminal organic electronic devices produced by the same method as Example 8.

Example 10

First, a plurality of three-terminal organic electronic devices each produced according to the method described in Example 6 and serving as operating switches were aligned and disposed on an acrylic substrate surface to fabricate a TFT array substrate. Pixel electrodes connected to the three-terminal organic electric devices were then formed according to a known method, a light-emitting layer comprising a fluorescent material that emits light with the application of an electric field was formed on the TFT array substrate, and a transparent electrode was formed on the light-emitting layer such that it opposed the TFT array substrate. Thus, an EL color display device was produced.

When the light-emitting layer was formed, three kinds of devices for emitting red, blue, and green light were formed at specified locations to produce an EL color display device.

It is to be noted that an EL display device like that of Example 10 could be produced when using the three-terminal organic electronic devices produced by the same method as Example 8.

By employing the organic electronic devices of the present invention, response is improved because of the inclusion of light-responsive groups or polar groups in the conductive organic thin film. Using these kinds of three-terminal organic electronic devices, an organic TFT is provided that brings about switching at a very high speed in comparison with conventional TFT's. Liquid crystal display devices and EL display devices using these devices as display device operation switches are also provided. Furthermore, because in the formation of the array substrate by arranging and disposing these kinds of three-terminal organic electronic devices on a substrate surface, a step of treating a substrate at a high temperature is not included, a display device is provided that uses substrates excellent in terms of flexibility such as plastic substrates.

By employing a method of producing an organic electronic thin film according to the present invention, a high-precision functional organic thin film is provided because the film is formed after specified portions of a substrate surface are made into a region having a high density of exposed active hydrogens. By applying this production method, an organic electronic device that answers recent demands for high integration is provided, as well as, liquid crystal display devices and EL display devices using this organic electronic device. Furthermore, in this kind of method of producing an organic electronic device, a step, like that used in the production of inorganic electronic devices, in which treatment is carried out at a high temperature is not necessary, and thus, a liquid crystal display device is provided that uses substrates such as resin substrates that are excellent in terms of flexibility.

What is claimed is:

1. A two-terminal organic electronic device formed on a substrate, the device comprising:
   a first electrode;
   a second electrode spaced from the first electrode; and
   a conductive organic thin film electrically connecting the first electrode and the second electrode;
   wherein the conductive organic thin film comprises an organic molecular group comprising organic molecules each having a light-responsive group and has a conductive network in which the organic molecules making up the organic molecular group are bonded to one another by conjugated bonds.

2. A two-terminal organic electronic device according to claim 1, wherein the conductive organic thin film is a monomolecular film or a monomolecular built-up film, the monomolecular film and the monomolecular built-up film being fixed to the substrate.

3. A two-terminal organic electronic device according to claim 1, wherein the conductivity of the conductive network changes according to the amount of light with which the conductive organic thin film is irradiated.

4. A two-terminal organic electronic device according to claim 3, wherein the conductivity of the conductive network is shifted to a first conductivity or a second conductivity by irradiation of the conductive organic thin film with a first light or a second light, respectively, and is maintained at the first conductivity or the second conductivity, respectively, after irradiation is terminated, the first light and the second light having different wavelengths.

5. A two-terminal organic electronic device according to claim 1, wherein the light-responsive group is a photoisomerizable group.

6. A two-terminal organic electronic device according to claim 5, wherein the photoisomerizable group is an azo group.

7. A two-terminal organic electronic device according to claim 1, wherein the conductive network comprises at least one conjugated system selected from the group consisting of a polyacetylene-based, a polydiacetylene-based, a polypyrrole-based, a polythiophene-based, and a polyacene-based conjugated system.

8. A three-terminal organic electronic device formed on a substrate, the device comprising:
   a first electrode;
   a second electrode spaced from the first electrode;
   a conductive organic thin film electrically connecting the first electrode and the second electrode; and
   a third electrode sandwiched between the substrate and the conductive organic thin film and insulated therefrom;
   wherein the third electrode controls an electric field across the conductive organic thin film by application of a voltage between itself and the first electrode or itself and the second electrode; and
   the conductive organic thin film comprises an organic molecular group comprising organic molecules each having a polar group and has a conductive network in which the organic molecules making up the organic molecular group are bonded to one another by conjugated bonds.

9. A three-terminal organic electronic device according to claim 8, wherein the conductive organic thin film is a monomolecular film or a monomolecular built-up film, the monomolecular film and the monomolecular built-up film being fixed to the substrate.

10. A three-terminal organic electronic device according to claim 8, wherein change in the conductivity of the conductive network is effected by the electric field applied across the conductive organic thin film.

11. A three-terminal organic electronic device according to claim 8, wherein the polar group is a polarizable group that is polarized when an electric field is applied.

12. A three-terminal organic electronic device according to claim 11, wherein the polarizable group is a carbonyl group or an oxycarbonyl group.

13. A three-terminal organic electronic device according to claim 8, wherein the conductive network comprises at least one conjugated system selected from the group consisting of a polyacetylene-based, a polydiacetylene-based, a polythiophene-based, a polypyrrole-based, and a polyacene-based conjugated system.

14. A liquid crystal display device comprising an array substrate having a plurality of switching devices aligned and disposed in a matrix on a first substrate and a first orientation film formed thereon, a color filter substrate having a plurality of color elements aligned and disposed in a matrix on a second substrate and a second orientation film formed thereon, and a liquid crystal sealed between the array substrate and the color filter substrate, the array substrate and the color filter substrate arranged opposing each other with the first orientation film and the second orientation film on the inside, the liquid crystal display device wherein:
   each of the switching devices is a three-terminal organic electronic device comprising a first electrode, a second electrode spaced from the first electrode, a conductive organic thin film electrically connecting the first electrode and the second electrode, and a third electrode sandwiched between the first substrate and the conductive organic thin film and insulated therefrom, wherein the third electrode controls an electric field across the conductive organic thin film by application of a voltage between itself and the first electrode or itself and the second electrode, the conductive organic thin film comprising an organic molecular group comprising organic molecules each having a polar group and the conductive organic thin film having a conductive network in which the organic molecules making up the organic molecular group are bonded to one another by conjugated bonds.

15. An electroluminescent display device comprising an array substrate having a plurality of switching devices aligned and disposed in a matrix on a substrate, a common electrode opposed to the array substrate, and a light-emitting layer comprising a fluorescent material which emits light when an electric field is applied, the light-emitting layer formed between the array substrate and the common electrode, the electroluminescent display device wherein:
   each of the switching devices is a three-terminal organic electronic device comprising a first electrode, a second electrode spaced from the first electrode, a conductive organic thin film electrically connecting the first electrode and the second electrode, and a third electrode sandwiched between the substrate and the conductive organic thin film and insulated therefrom, wherein the third electrode controls an electric field across the conductive organic thin film by application of a voltage between itself and the first electrode or itself and the second electrode, the conductive organic thin film comprising an organic molecular group comprising organic molecules each having a polar group and the conductive organic thin film having a conductive network in which the organic molecules making up the organic molecular group are bonded to one another by conjugated bonds.

16. An electroluminescent display device according to claim 15, wherein the fluorescent material comprises three types of fluorescent materials, those which emit red, blue and green light, respectively, and are aligned and disposed to achieve color display.

* * * * *